United States Patent [19]

Ikeda et al.

[11] Patent Number: 5,952,429

[45] Date of Patent: Sep. 14, 1999

[54] CARBON BLACK GRAFT POLYMER, METHOD FOR PRODUCTION THEREOF, AND USE THEREOF

[75] Inventors: Hayato Ikeda, Osaka; Nobuyuki Ando, Nara; Yoshinobu Asako, Ibaraki; Kazuhiro Anan, Osaka; Tatsuhito Matsuda, Hyogo; Hironobu Toribuchi, Osaka; Mitsuo Kushino; Keiichi Uehara, both of Hyogo; Yoshikuni Mori, Osaka, all of Japan

[73] Assignee: Nippon Shokubai Co., Ltd., Japan

[21] Appl. No.: 08/793,210

[22] PCT Filed: Jun. 14, 1996

[86] PCT No.: PCT/JP96/01645

§ 371 Date: Jun. 3, 1997

§ 102(e) Date: Jun. 3, 1997

[87] PCT Pub. No.: WO97/00295

PCT Pub. Date: Jan. 3, 1997

[30] Foreign Application Priority Data

| Jun. 14, 1995 | [JP] | Japan | 7-147940 |
| Jun. 14, 1995 | [JP] | Japan | 7-172771 |
| Jun. 15, 1995 | [JP] | Japan | 7-148762 |
| Nov. 1, 1995 | [JP] | Japan | 7-285252 |
| Feb. 8, 1996 | [JP] | Japan | 8-022902 |
| Feb. 9, 1996 | [JP] | Japan | 8-024505 |
| Feb. 9, 1996 | [JP] | Japan | 8-024506 |
| May 23, 1996 | [JP] | Japan | 8-128133 |

[51] Int. Cl.⁶ ........................ C08F 8/00
[52] U.S. Cl. ............... 525/326.1; 525/327.3; 525/327.4; 525/329.7; 428/402.24; 428/407
[58] Field of Search .......... 525/326.1, 327.3, 525/327.4, 329.7; 428/402.24, 407

[56] References Cited

U.S. PATENT DOCUMENTS 4,910,113 3/1990 Mori et al. .

FOREIGN PATENT DOCUMENTS

| 0 098 338 | 4/1988 | European Pat. Off. . |
| 59-22577 | 5/1984 | Japan . |
| 4-53905 | 8/1986 | Japan . |
| 1-49369 | 11/1989 | Japan . |
| 2-24868 | 5/1990 | Japan . |
| 2-27018 | 6/1990 | Japan . |
| 2-68149 | 7/1990 | Japan . |
| 2-239202 | 9/1990 | Japan . |
| 3-101816 | 4/1991 | Japan . |
| 4-35748 | 2/1992 | Japan . |
| 4-63870 | 2/1992 | Japan . |
| 4-83537 | 3/1992 | Japan . |
| 4-281855 | 10/1992 | Japan . |
| 4-326934 | 11/1992 | Japan . |
| 5-38424 | 2/1993 | Japan . |
| 5-194825 | 8/1993 | Japan . |
| 5-339516 | 12/1993 | Japan . |
| 6-349 | 1/1994 | Japan . |
| 6-4807 | 1/1994 | Japan . |
| 6-67421 | 3/1994 | Japan . |
| 6-86924 | 3/1994 | Japan . |
| 6-27269 | 4/1994 | Japan . |
| 6-134270 | 5/1994 | Japan . |
| 6-210146 | 8/1994 | Japan . |
| 6-212895 | 8/1994 | Japan . |
| 6-214385 | 8/1994 | Japan . |
| 7-104524 | 4/1995 | Japan . |
| 7-253688 | 10/1995 | Japan . |
| 8-13248 | 1/1996 | Japan . |
| WO 84/00372 | 2/1984 | WIPO . |
| WO 88/03545 | 5/1988 | WIPO . |

*Primary Examiner*—Bernard Lipman
*Attorney, Agent, or Firm*—Fish & Richardson P.C.

[57] ABSTRACT

A carbon black graft polymer which excels in stability of dispersion in various media, coloring property, and imperviousness to light is obtained by mixing under heating a block- or graft-copolymer having a segment (A) containing a reactive group capable of reacting with a functional group on the surface of carbon black and a segment (B) different in skeletal structure from the segment (A) with carbon black. The carbon black graft polymer, by causing the graft chain thereof to incorporate therein an ethylenically unsaturated double bond and/or a carboxyl group, is enabled to manifest photosensitivity, developability with an alkali, and insulating property and acquire usefulness for a black photocurable resin composition such as, for example, the material for the formation of a black matrix particularly in a color filter.

38 Claims, 5 Drawing Sheets

CARBON BLACK GRAFT POLYMER, METHOD FOR PRODUCTION THEREOF, AND USE THEREOF

BACKGROUND OF THE INVENTION

1. Technical Field

This invention relates to a carbon black graft polymer, a method for the production thereof, and a use thereof. More particularly, this invention relates to a carbon black graft polymer which exhibits excellent stability of dispersion to various media. This invention also relates to a carbon black graft polymer which, when added to a varying medium, can manifest fully satisfactorily such qualities as coloring property, imperviousness to light, sensitivity to light, developability with an alkali, and insulation. This invention further relates to a carbon black graft polymer which can be used advantageously in a black light-curing resin composition such as, for example, the black matrix-forming material in the color filter.

This invention further relates to a method for the treatment for surface modification of minute solid particles such as pigments represented by carbon black, magnetic powder, and ceramic powder to improve the minute solid particles in dispersibility in various media such as water, organic solvents, or organic macromolecular compounds, and particularly to a method for the treatment for surface modification which allows a wide range for the selection of the polymer component to be used in the surface modification and implements the surface modification thoroughly by the use of the polymer component in a relatively small amount.

2. Prior Art

The minute solid particles such as pigments represented by carbon black, magnetic powder, and ceramic powder are used more often as incorporated in various compositions in various applications for the purpose of imparting thereto such functions as coloration, reinforcement, and filling than they are used alone in their unmodified form.

Most of these minute solid particles, particularly such minute solid particles as have a primary particle diameter of the order short of submicrons, exhibit weak affinity for other substances such as, for example, water, organic solvents, and organic macromolecular compounds as compared with the cohesive force generated among their individual particles and, therefore, tend to succumb to secondary cohesion. When the minute solid particles are expected to acquire excellent properties in such various compositions as mentioned above, therefore, how uniformly they are dispersed in a given composition poses itself a problem. For the solution of this problem, numerous methods for attaining uniform incorporation or dispersion of minute solid particles in a solid or liquid medium by coating the surface of minute solid particles with a varying surfactant or resin thereby heightening the affinity thereof for the medium have been under study.

As concerns carbon black, for example, (1) the carbon black graft polymer which is obtained by polymerizing a polymerizable monomer in the presence of carbon black has been attracting attention because the hydrophilicity and/or oleophilicity thereof can be suitably varied by appropriately selecting the kind of the polymerizable monomer (JP-B-42-22,047, JP-B-44-3,826, JP-B-45-17,248, and U.S. Pat. No. 3,557,040).

Then, (2) the carbon black graft polymer which is obtained by the reaction of a polymer containing a reactive group such as epoxy group or aziridine group in the molecular unit thereof with carbon black has been proposed (JP-B-02-24,868 and JP-B-06-27,269).

The method (1) mentioned above, however, produces the carbon black graft polymer with a low yield ranging from several % to ten-odds %. The greater part of the polymerization product exists in the form of a vinyl type homopolymer. The efficiency with which the carbon black graft polymer provides a required surface treatment for carbon black, therefore, is extremely low. The product of this method, therefore, does not manifest such high affinity for other substances as is expected and frequently assumes such a dispersed state as is variable with the condition of incorporation or dispersion.

The carbon black graft polymer (2) mentioned above is found to manifest fairly improved dispersibility in various substances. Though the polymer used for this carbon black graft polymer has a functional group reactive with carbon black, the polymer chain thereof solely has either oleophilicity or hydrophilicity. This carbon black graft polymer, therefore, encounters difficulty in fully satisfying frequently contradictory requirements, i.e. the efficiency of grafting with carbon black and the improvement of the dispersibility in various media which the grafted polymer chain is intended to impart.

It has, therefore, entailed such problems as ① allowing no ample addition to the carbon content in the carbon black graft polymer, ② imparting to the carbon black graft polymer no fully satisfactory dispersibility in media of high polarity such as, for example, alcohols and cellosolve type solvents or in media of low polarity such as, for example, hydrocarbon type solvents and silicone type solvents, and ③ permitting no easy grafting in an organic solvent.

JP-B-06-27,269 mentioned above also discloses a method for producing carbon black graft polymer by stirring to mix carbon black and a polymer containing in the molecular unit thereof 1 to 2 epoxy groups and/or thioepoxy groups per molecule at a temperature in the range of 50–250° C. thereby inducing them to react with each other. This method is found to permit production of a carbon black graft polymer which excels in dispersibility in various substances because the reactive group present in the molecule of the polymer reacts with the surface functional group of carbon with very high efficiency. The product with improved quality which is obtained by melting and kneading minute solid particles with a reactive polymer and consequently grafting a polymer chain to the surface of the minute solid particles as mentioned above promises to acquire very high dispersibility.

When the minute solid particles and the reactive polymer are melted and kneaded by means of a kneader or a ball mill, for example, it becomes difficult to coat the entire surface of the minute solid particles uniformly with the polymer graft chain when the mixing ratio of the reactive polymer to the minute solid particles is lowered. As an inevitable consequence, therefore, it occurs not infrequently that the content of minute solid particles in the produced surface-modified minute particles is small and the essential characteristics inherent in the minute solid particles are diminished. If the reactive polymer has a low molecular weight or has a large number of reactive groups per molecule, for example, the grafting will either proceed insufficiently or entrain formation of gel. As aptly evinced by this fact, the reactive polymer which is usable has many restrictions such as, for example, the number of functional groups and the molecular weight of the polymer. In order for this method to produce a dispersion of expected quality, it necessitates an extra procedure of causing the mixture resulting from the melting and kneading treatment to be dispersed in a dispersion medium. The method, therefore, has the problem of complicating the process thereof.

It has been also known to the art to adopt a procedure of adding a suitable dispersion stabilizer to the dispersion medium and physically stirring the resultant mixture for effecting necessary dispersion for the purpose of producing a dispersion of such minute solid particles as induce secondary cohesion mentioned above. For the sake of uniformity of the dispersion, it is necessary to consider microscopic mixture based on minute turbulent motions as well as macroscopic mixture. Heretofore, as means to obtain the uniform dispersion, various wet dispersing devices and wet pulverizing devices have been proposed which give appropriate contrivances to the shape of a vessel to hold the fluid to be treated, the shape, number, relative position, and revolution number of stirring blades, the presence or absence of the installation of baffle plates or partitions, and the use, shape, and material of dispersing media such as balls or beads to be incorporated in the interior of the vessel.

Of these devices, those of the type which generally use both stirring blades and the dispersing media have heretofore found utility in numerous applications on account of their capability of forming a state of relatively satisfactory dispersion. The dispersing devices of this type have been disclosed in JP-B-59-22,577, JP-B-02-27,018, JP-A-02-68,151, JP-A-03-101,820, JP-B-07-12,441, JP-B-07-4,552, JP-A-04-32,634, JP-B-06-73,620, JP-A-05-38,425, JP-A-04-281,855, JP-A-06-351, JP-A-06-212,896, JP-A-06-210,148, and JP-A-06-134,271, for example.

The preparation of the dispersion of minute solid particles by the use of such a wet dispersion device or wet pulverization device as mentioned above, however, is implemented by stirring and mixing the minute solid particles with a liquid dispersion medium at room temperature in the device mentioned above and is consequently enabled to form a state of dispersion by dint of the external physical force arising from the stirring and mixing. This preparation, therefore, has the problem of imparting to the produced dispersion such stability as hardly deserves to be called sufficient and necessitating a long time for the treatment of dispersion.

Incidentally, the color filter which is used for a color liquid crystal display device, for example, is provided in at least two kinds of color layers with fine colored areas as picture elements. Heretofore, it has been customary to form a black matrix for the purpose of intercepting light between these picture elements and conferring improved contrast on a displayed image.

The black matrix of this nature is generally composed of minute patterns of a thin film of a metal such as Cr, Ni, or Al on a glass substrate, and fabricated by depositing the thin metal film on the substrate by the vacuum evaporation method, sputtering method, or vacuum film-forming method, for example, and then patterning the thin metal film by means of the photolithographic technique.

Since the black matrix thus produced is expensive on account of the complicacy of process of its fabrication, however, it inevitably entails the problem that the color filter itself which uses this black matrix is likewise expensive.

When the color filter provided with the black matrix using a thin film of such metal as Cr is incorporated in a transmission type display, since the surface of the thin metal film has high reflectance, the transmission type display incurs the problem that when an intense external light impinges on the filter, the reflected light is so intense as to impair the quality of the display conspicuously.

For the purpose of solving the problem encountered by the black matrix using such a thin film of metal as mentioned above, various methods have been proposed for forming a black matrix with a resinous composition containing a coloring agent.

JP-A-02-239204, for example, proposes a method for forming a black matrix with a material prepared by dispersing such a light blocking material as carbon black in a polyimide type resin. This method is capable of producing a black matrix of high reliability because the reflection of external light occurs sparingly and the polyimide type resin as the basis has high resistance to heat. This method covers a procedure which comprises coating the substrate with the polyimide type resinous composition containing the light blocking material, drying the applied layer of the composition, then further coating the dried layer with a photoresist, patterning the applied layer of the photoresist, etching the underlying layers through the patterned photoresist, and peeling the resist. Thus, this method is still deficient in terms of simplification of process and reduction in cost.

An attempt has been under way to develop a method for forming a black matrix of a stated pattern by incorporating a black pigment such as carbon black in a photo-curable resinous composition, applying the resultant mixed composition to a substrate, drying the applied layer of the composition, fixing a mask of a stated pattern to the dried layer, exposing the deposited layer to light through the pattern in the mask, and developing the exposed layer.

When the amount of the carbon black to be incorporated is increased for the purpose of imparting to the black matrix thorough imperviousness to light, it becomes extremely difficult for the mixed composition to be cured by light because the light transmittance in the ultraviolet zone in the neighborhood of 400 nm, for example, which is necessary for the curing of a photo-curable resin is greatly lowered and it further becomes difficult to form a fully satisfactory image with an economic amount of exposure because the carbon black seizes completely the radical emitted from a photo-polymerization initiator by dint of the ultraviolet light and consequently impedes photopolymerization. Further, when the amount of carbon black so added increases, the film ultimately obtained inevitably acquires electroconductivity and becomes no longer usable as a black matrix for a liquid crystal display. Moreover, since carbon black has weak affinity for other substances such as, for example, organic macromolecular compounds, water, and organic solvents as compared with the cohesive force between particles as described above, it incurs extreme difficulty in being uniformly mixed or dispersed in such a photo-curable resinous composition as mentioned above and produces a stable and uniform black layer only with difficulty.

JP-A-04-63870 proposes to use as a coloring agent for incorporation in the photo-curable resinous composition and in combination with carbon black a set of organic pigments of different colors capable of jointly forming a black color so as to repress the otherwise inevitable increase in the amount of carbon black for securing stated imperviousness to light and consequently curb the decrease in the transmittance of light in the ultraviolet zone necessary for the curing with light and enable the film to retain the insulation.

The additional use of these organic pigments, however, inevitably suffers the light transmittance in the visible zone to rise as compared with the sole use of carbon black and makes it difficult to form a black matrix in a small wall thickness with fully satisfactory imperviousness to light and meanwhile offers no solution to the problem of inferior dispersibility of carbon black and the problem of impediment to curing by light in consequence of the seizure of radical by carbon black.

JP-A-06-67421 proposes to adopt, as a black photocurable resinous composition excellent in photosensitivity and stability of dispersion and consequently appropriate for the fabrication of a black matrix excelling in imperviousness to light and resolution what is obtained by incorporating the carbon black graft polymer as mentioned in (2) above. Since the carbon black graft polymer is not allowed to have a large carbon content as described above, however, it acquires no ample imperviousness to light, allows no satisfactory dispersion of carbon black therein, and betrays deficiency in terms of sensitivity to curing by light and strength of the cured film.

Further, in the formation of a film such as a black matrix with a photo-curable resinous composition of the kind mentioned above, the practice of causing the film obtained after the curing by light and the development of pattern to be subjected to a heat treatment (after-baking) at a temperature in the approximate range of 100–300° C. for the purpose of ensuring thorough curing of the film and, at the same time, exalting the adhesiveness between the substrate and the film is prevalent. The film which has undergone the after-baking treatment is observed to have its resistivity greatly decreased probably because the dispersed state of carbon black or carbon black graft polymer in the film is varied during the course of the heat treatment. Thus, the film is no longer usable as a black matrix for a liquid crystal color filter which demands high resistance.

Also, in the formation of the film as the black matrix with a photo-curable resinous composition, it is favorable to use the resinous composition in an alkali-soluble form. In this case, the capability of the film to be developed with an alkali is degraded by the carbon black or the conventional carbon black graft polymer incorporated as a coloring agent component. The film, therefore, needs further improvement in this respect.

Incidentally, the ink jet printing method accomplishes required recording by forcing a liquid recording medium, i.e. the so-called ink, to fly in a stream of liquid droplets and allowing this stream to impinge on a recording member. The ink jet printing method is known in various types depending on the manner of producing and controlling the droplets of the liquid recording medium. For the production of the liquid droplets, for example, ① the piezoelectric pressure method which comprises forming part of the wall surface of an ink chamber with a piezo element, giving a recording signal to the piezo element region thereby exerting pressure on the ink in the ink chamber, and causing the ink to emit droplets corresponding to the signal and ② the thermal pressure method which comprises exerting thermal energy corresponding to a recording signal on the recording liquid (ink) in an ink chamber thereby causing the ink to generate bubbles and produce liquid droplets by dint of the pressure of the bubbles are typical examples of the method already reduced to practical service and, in addition thereto, ③ the method which comprises spouting ink through a nozzle with relatively high pressure thereby allowing the thread of ink in flight to be divided into particles by dint of surface tension and electrification, ④ the method which comprises spouting ink under relatively low pressure and additionally imparting supersonic vibration to the thread of ink in flight, and ⑤ the method which comprises using meniscuses to form globules of ink and the ink globules with a high electric field have been known.

The ink or liquid recording medium which is used in the ink jet printing method as described above is expected to fulfill various requirements such as having liquid properties (viscosity, surface tension, and electroconductivity) fit for spouting conditions (such as, for example, drive voltage of the piezoelectric element, drive frequency, the shape and material of the spouting orifice, and the diameter of the spouting orifice), tolerating protracted storage stably while inducing no clogging of the ink jet device, attaining quick and infallible fixation to a material for recording (paper or film), producing dots of smooth periphery without notably smearing surrounding areas, forming an ink image of clear and dense color tone, enabling the formed ink image to exhibit outstanding resistance to water and light, having no ability to corrode peripheral materials for ink (storage device, connecting tubes, and sealing material), emitting odor or producing poison only sparingly, and excelling in safety in terms of inflammation.

As the liquid recording medium to be used in the ink jet printing method, the product composed principally of a dye as a coloring agent component and a solvent therefor has been mainly used heretofore. The physical properties of the liquid recording medium, therefore, hinge greatly on the nature which is inherent in the dye to be used. When the ink jet printing is performed with a liquid recording medium containing a water-soluble dye, for example, the ink image which is produced is at a disadvantage in being compelled to sacrifice its resistance to water or light by the physical properties of the water-soluble dye. Besides, the ink itself which contains the water-soluble dye has no ample shelf life.

An attempt is being made to apply a pigment type ink using a pigment like carbon black as a coloring agent component in the place of the dye type ink for the ink jet printing method. This pigment type ink has the advantage that the produced ink image enjoys high satisfactory resistance to light or water as compared with the image formed of the dye type ink. Since the pigment is insoluble in the liquid medium of ink, however, a highly advanced technique is required for finely dispersing the pigment in the liquid medium of ink and unusual difficulty is involved in imparting exalted stability to the dispersion.

The application of the carbon black graft polymer mentioned above as a coloring agent component for the liquid recording medium to be used for the bubble jet printing method is not inconceivable. In this case, the problems mentioned above entrain such other problems as ① preventing the carbon black graft polymer from enjoying an addition to its carbon black content and the ink image from acquiring a color tone with ample clarity and high density, ② rendering it difficult for the electroconductivity to be set at a level fitting the discharge condition, and ③ preventing the dispersed state of the carbon black graft polymer from being stably retained and consequently impairing the shelf life of the liquid recording medium.

In recent years, the field of electrophotographic printing, electrostatic copying, etc. has come to devote an increasing effort to the improvement of produced images in quality. The advance of the digital technology has reached a point where the formed latent images warrant high accuracy and fineness as compared with those obtained by the conventional technology. When a powdered toner is used in developing a digital image of electrostatic charge, however, the developed image has no very high quality because the toner particles have particle diameters of the order of 10 $\mu$m. In the light of this fact, the formation of an image of enhanced accuracy and fineness due to the use of a liquid developing agent containing toner particles of a smaller particle diameter has come to attract interest recently.

The liquid developing agent for use in the development of an electrostatically charged latent image, as widely known, is produced by dispersing toner particles in an electrically insulating organic liquid such as, for example, an aromatic hydrocarbon type solvent. The toner particles are composed of a pigment, a resin, and other additives because they required to have a coloring property, an electrically charging property, a fixing property, and a dispersion-stabilizing property. In the liquid developing method, the development of an electrostatically charged latent image is attained by charging the toner particles generally to a polarity opposite the polarity of the charge of electrostatic latent image and consequently causing these toner particles to be attracted by the electric charge of the latent image through the electrically insulating liquid, migrated to the latent image electrophoretically, and deposited selectively on the latent image.

The liquid developing agent of this nature is also required to offer an improved ability to disperse a pigment such as carbon black or a resin. JP-A-07-253688, for example, discloses use of a resin component which is obtained by grafting a macromolecular compound soluble in an aromatic hydrocarbon type solvent to a macromolecular compound which is insoluble in the solvent and JP-A-07-104524 has a mention to the effect that such a carbon black graft polymer as mentioned above may be used as a coloring agent. Neither of these inventions, however, are still short of producing a liquid developing agent with a satisfactorily stabilized dispersing property.

SUMMARY OF THE INVENTION

An object of this invention, therefore, is to provide a novel carbon black graft polymer, a method for the production thereof, and use thereof.

Another object of this invention is to provide a novel carbon black graft polymer which has a high carbon black content and yet exhibits excellent dispersibility in various media and, when added to a varying photo-curable or thermosetting medium, avoids inhibiting the medium from curing and allows the medium easily to form a film of high strength even when the amount thereof to be added is large, and excels in various physical properties such as, for example, electric insulation and a method for the production thereof.

Still another object of this invention is to provide a novel carbon black graft polymer which, when added to a varying medium, is capable of manifesting highly satisfactory qualities including imperviousness to light, photosensitivity, developability with an alkali, and insulation and a method for the production thereof.

This invention has a further object of providing a novel carbon black graft polymer which is advantageously usable in a black photo-curable resinous composition such as, for example, a black matrix-forming material in a color filter and a method for the production thereof.

This invention has a further object of providing a novel carbon black graft polymer which is advantageously usable in a liquid recording medium for the ink jet printing method or in a liquid developing agent for the development of an electrostatically charged latent image and a method for the production thereof.

This invention has a further object of providing a novel carbon black graft polymer which is usable in various resinous compositions, coating compositions, ink, thermographic ink, a coating agent for ink ribbons used in thermography, a backcoating agent for magnetic recording media, coating materials, materials requiring high resistance and high imperviousness to light, a black matrix for a color filter to a liquid crystal, artificial marble, a coloring agent for a plastic or rubber forming material or fibers impervious to light, a modifying agent or a filler for plastic substances such as polyolefins and polyesters or rubber, a planar heating element, a lubricating agent, a traction drive fluid, an electroviscous fluid, a nonlinear optical material, electric resistance adjusting materials such as, for example, an antistatic material, a resisting material in a copying device, and a planar heating element utilizing the PTC characteristic, and a method for the production thereof.

This invention has a further object of providing a novel method for the surface-modifying treatment which improves the dispersibility of minute solid particles such as, for example, pigments represented by such carbon black as mentioned above, magnetic powder, and ceramic powder in such media as water, organic solvents, or organic macromolecular compounds.

This invention has another object of providing a method for the surface-modifying treatment which uses for the surface modification a polymer component having a wide range of applications and permitting satisfying surface modification at a relatively low application rate.

This invention has yet another object of providing a novel photo-curable resinous composition which is usable for the formation of a black matrix of a color filter.

To accomplish the objects mentioned above, the first aspect of this invention concerns a carbon black graft polymer, obtained by mixing under heating carbon black with a polymer which has reactive group(s) capable of reacting with functional group(s) on the surface of carbon black and further has ethylenically unsaturated double bond (s), and characterized by having the unsaturated double bond(s) in a graft chain of the carbon black graft polymer.

Since the carbon black graft polymer according to the first aspect of this invention has unsaturated double bond(s) in the graft chain thereof, when it is added to a varying photo-curable or thermosetting resinous composition, the unsaturated double bond(s) can contribute to the curing reaction of the composition. Even when it is used at a high application rate, the resinous composition is allowed to form easily a film of high strength and the produced film excels in imperviousness to light and photographic density. Since the carbon black graft polymer is chemically bound to and retained by the resin molecules forming the matrix in the cured resin layer, the dispersed state of the polymer is stabilized and such inconveniences as the decline of electric resistivity due to the agglomeration of polymer particles are not suffered to rise. As a result, the film to be consequently obtained excels in various physical properties such as the electric insulation. The carbon black graft polymer, therefore, can be appropriately added to various media represented by such photo-curable or thermosetting resinous compositions for such applications as coloring agents, fillers, and light-intercepting agents. It can be added particularly favorably to the photo-curable resinous composition which is used as the material for the formation of a black matrix in the color filter.

To accomplish the objects mentioned above, the second aspect of this invention concerns a carbon black graft polymer, obtained by mixing under heating carbon black with a polymer which has reactive group(s) capable of reacting with functional group(s) on the surface of carbon black and further has hydroxyl group(s) and then treating the resultant reaction mixture with an acid anhydride, and characterized by having a carboxyl group in a graft chain of the carbon black graft polymer.

The carbon black graft polymer according to the second aspect of this invention has carboxyl group(s) in the graft chain. When it is added to an alkali-soluble photo-curable resinous composition, for example, the resultant mixed composition manifests satisfying developability during the removal of the unhardened part of the film with an alkali solution for the development of an image.

To accomplish the objects mentioned above, the third aspect of this invention concerns a carbon black graft polymer, obtained by mixing under heating carbon black with a block- or graft-copolymer which comprises a segment (A) having reactive group(s) capable of reacting with functional group(s) on the surface of carbon black and a segment (B) different in skeletal structure from the segment (A).

The carbon black graft polymer according to the third aspect of this invention has an ability to succumb effectively to grafting and manifests outstanding dispersibility in a varying medium selected as a target because the block- or graft-copolymer constitutes a polymer moiety thereof.

Specifically, the improvement of grafting efficiency and the improvement of affinity for the medium selected as a target, i.e. the possibly contradicting two requirements, can be reconciled by adopting the block- or graft-copolymer having two functionally differentiated segments as the polymer moiety.

To accomplish the objects mentioned above, the fourth aspect of this invention concerns a carbon black graft polymer, obtained by mixing under heating carbon black with a block- or graft-copolymer which comprises a segment (A) having reactive group(s) capable of reacting with functional group(s) on the surface of carbon black and a segment (B) containing ethylenically unsaturated double bond(s) and differing in skeletal structure from the segment (A).

The carbon black graft polymer according to the fourth aspect of the invention is enabled to enjoy jointly the characteristics of the first aspect of the invention and those of the third aspect of the invention mentioned above.

To accomplish the objects mentioned above, the fifth aspect of this invention concerns a carbon black graft polymer, obtained by mixing under heating carbon black with a block- or graft-copolymer which comprises a segment (A) having reactive group(s) capable of reacting with functional group(s) on the surface of carbon black and a segment (B) differing in skeletal structure from the segment (A) and contains hydroxyl group(s) in at least the segment (B) of the two segments (A) and (B) mentioned above and then treating the resultant reaction mixture with an acid anhydride.

The carbon black graft polymer according to the fifth aspect of this invention is enabled to enjoy jointly the characteristics of the second aspect of this invention and those of the third aspect of the invention.

The species of carbon black graft polymer according to this invention have a high carbon black content and meanwhile excel in dispersibility in varying kinds of media as described above.

The carbon black graft polymer of this invention can be advantageously applied for various resinous compositions, coating compositions, ink, thermographic ink, a coating agent for ink ribbons used in thermography, a backcoating agent for magnetic recording media, coating materials, materials requiring high resistance and high imperviousness to light, a black matrix for a color filter in a liquid crystal, artificial marble, a coloring agent for a plastic or rubber forming material or fibers impervious to light, a modifying agent or a filler for plastic substances such as polyolefins and polyesters or rubber, a planar heating element, a lubricating agent, a traction drive fluid, an electroviscous fluid, a nonlinear optical material, electric resistance adjusting materials such as, for example, an antistatic material, a resisting material in a copying device, and a planar heating element utilizing the PTC characteristic.

In the production of the carbon black graft polymer mentioned above, it is fit to use one or more members selected from the group consisting of epoxy group, thioepoxy group, aziridine group, and oxazoline group as the reactive group mentioned above.

In the production of the carbon black graft polymer according to this invention as described above, it is fit to effect the mixing under heating mentioned above by adding the reactive polymer described above in combination with carbon black to the liquid dispersion medium and subjecting the resultant mixture to a dispersing treatment in a heated state.

To accomplish the objects mentioned above, this invention further concerns a method for the surface-modifying treatment of minute solid particles, characterized by adding a polymer which has a reactive group capable of reacting with the functional group on the surface of the minute solid particles in combination with the minute solid particles to a liquid dispersion medium and subjecting the resultant mixture to a dispersing treatment in a heated state.

In the method for the surface-modifying treatment of minute solid particles mentioned above, it is appropriate for the dispersion treatment mentioned above to be carried out in a wet dispersion treating apparatus which is provided with a vessel for accommodating therein a fluid to be treated, a stirrer adapted to be rotated in the vessel, a heating device for heating the fluid accommodated in the vessel, and a plurality of granular media (beads) accommodated in the vessel.

In the production of the carbon black graft polymer according to any of the third-fifth aspects of this invention mentioned above, when the mixing under heating of the block- or graft-copolymer and the carbon black are carried out in a liquid dispersion medium, it is appropriate to design the molecular formulation of the block- or graft-copolymer so that, of the segment (A) and the segment (B) which make up the block- or graft-copolymer, the segment (A) having a reactive group capable of reacting with the functional group on the surface of carbon black and the segment (B) differing in skeletal structure from the segment (A), the segment (B) is endowed with higher affinity for the liquid dispersion medium than the segment (A).

This design is based on the theory that when the segment (B) has higher affinity for the liquid dispersion medium, the segment (B) of the block- or graft-copolymer is oriented toward the liquid dispersion medium side and the segment (A) thereof is oriented toward the carbon black side during the addition of the carbon black and the block- or graft-copolymer to the liquid dispersion medium and consequently the reaction of the reactive group had by the segment (A) with the surface functional group of the carbon black is initiated efficiently.

When the liquid dispersion medium under discussion is made to have characteristic identical with or close to those of a target medium such as a resinous composition or an organic solvent in which the ultimately obtained carbon black graft polymer is to be incorporated, the carbon black graft polymer to be ultimately obtained has high dispersibility in the target medium and, at the same time, enjoys stable properties since the polymer moiety thereof has grafted effectively to the carbon black.

Therefore, this invention further concerns a method for the production of a carbon black graft polymer, characterized by mixing under heating with carbon black, in the presence of a liquid dispersion medium which has characteristic identical with or close to those of a target medium, a block- or graft-copolymer which has a segment (A) containing a reactive group capable of reacting with a functional group on the surface of the carbon black and a segment (B) exhibiting higher affinity for the liquid dispersion medium than the segment (A).

This invention further concerns a method for the production of a carbon black graft polymer, characterized by grafting to carbon black a block- or graft-copolymer which comprises a segment (A) containing a reactive group capable of reacting with a functional group on the surface of carbon black and a segment (B) exhibiting lower affinity for said carbon black than said segment (A).

In this case similarly to the former case, the polymer moiety is effectively grafted to the carbon black.

This invention further concerns a photo-curable resinous composition, particularly an alkali-soluble type photo-curable resinous composition, containing the above mentioned any carbon black graft polymer of this invention as a coloring agent component.

This invention further concerns a black matrix formed of the above mentioned photo-curable resinous composition and used for a color filter.

This invention further concerns a liquid ink jet printing medium and a liquid developing agent for electrostatic development, each containing the above mentioned any carbon black graft polymer of this invention as a coloring agent component.

This invention further embraces many other embodiments which will be described specifically herein below. It should be understood by persons of ordinary skill in the art based on the following detailed description that this invention embraces many other embodiments resulting from altering or modifying the invention without departing from the spirit or scope of this invention which is limited exclusively by the claims annexed hereto.

DETAILED DESCRIPTION OF THE INVENTION

Figure 1:
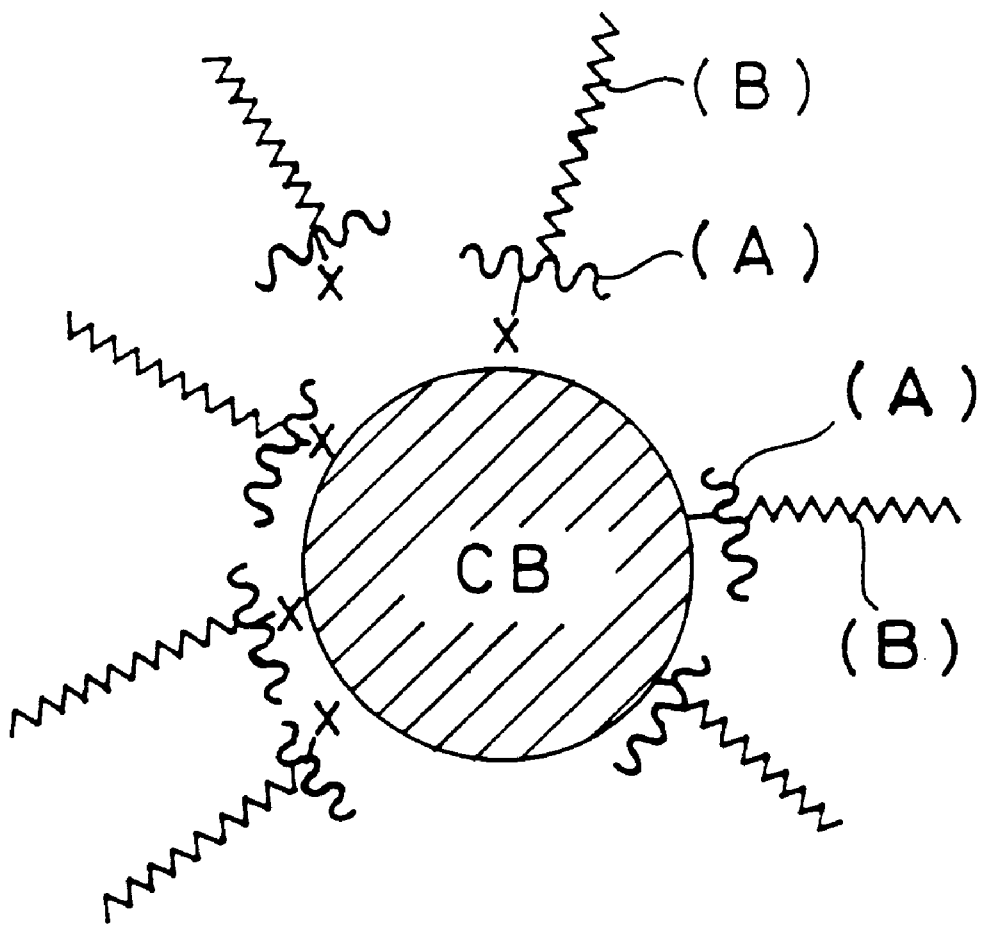
FIG. 1 is a diagram illustrating schematically the state of the proximity of the surface of carbon black in one embodiment of the method for production of carbon black graft polymer according to this invention.
Figure 2A:
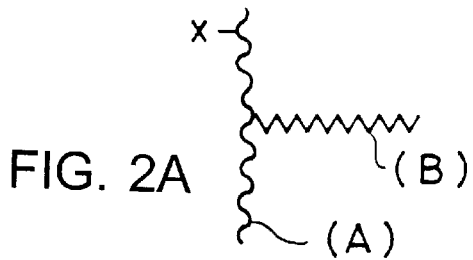
FIGS. 2(a)–(e) are diagrams illustrating schematically examples of the structure of the block- or graft-copolymer to be used in one embodiment of the method for the production of a carbon black graft polymer according to this invention and FIG. 2(f) is a diagram illustrating schematically the state of linkage of block- or graft-copolymers to the surface of a carbon black particle (CB).
Figure 2D:
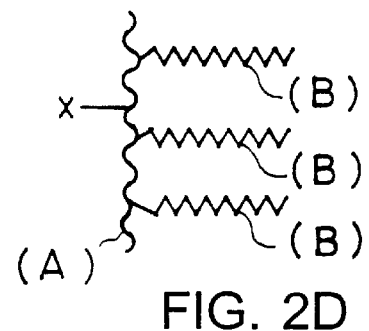
Figure 2B:
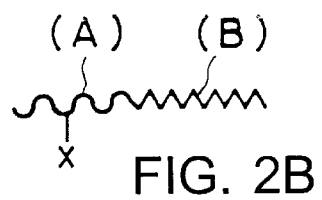
Figure 2C:
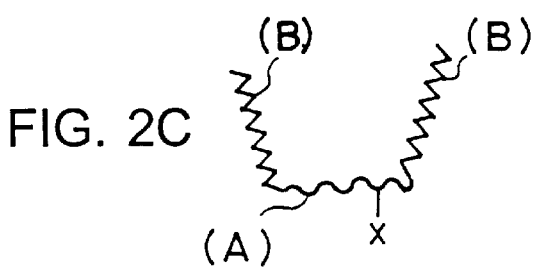
Figure 2F:
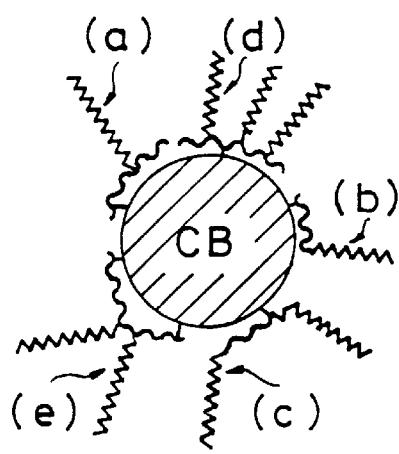
Figure 2E:
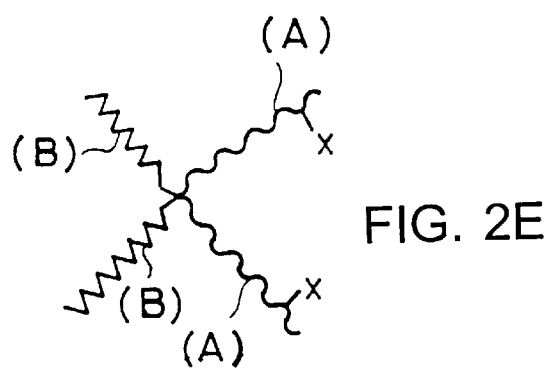
Figure 3A:
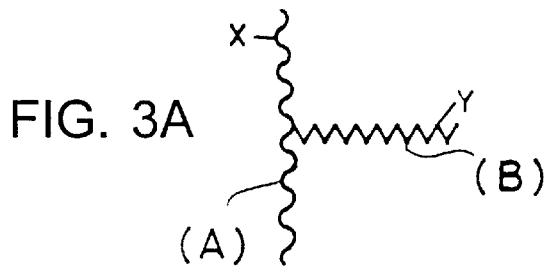
FIGS. 3(a)–(e) are diagrams illustrating schematically examples of the structure of the block- or graft-copolymer to be used in another embodiment of the method for the production of a carbon black graft polymer according to this invention and FIG. 3(f) is a diagram illustrating schematically the state of linkage of block- or graft-copolymers to the surface of a carbon black particle (CB).
Figure 3D:
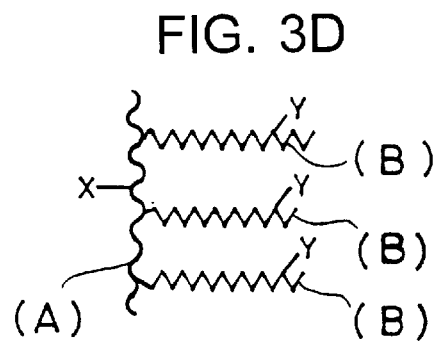
Figure 3B:
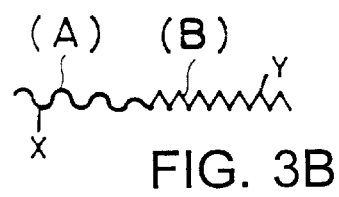
Figure 3C:
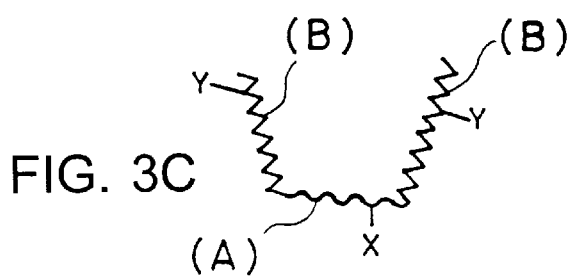
Figure 3F:
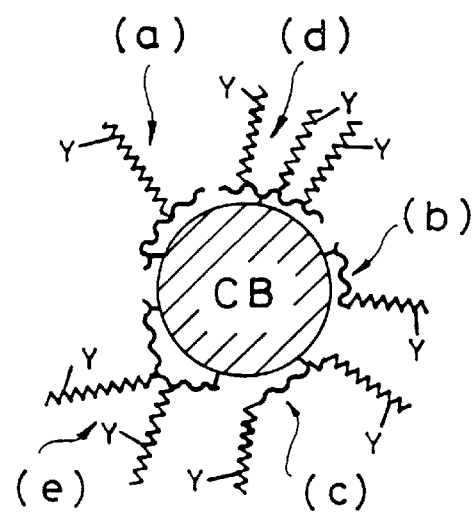
Figure 3E:
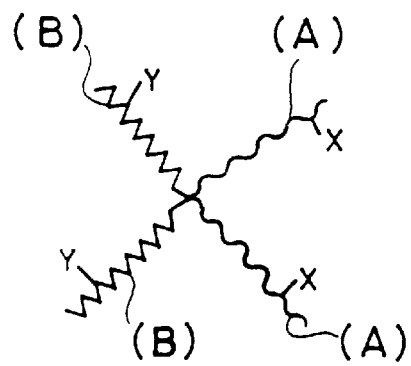
Figure 4A:
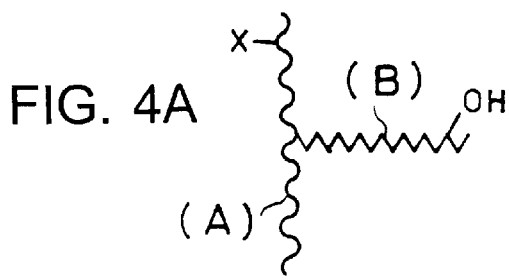
FIGS. 4(a)–(e) are diagrams illustrating schematically examples of the structure of the block- or graft-copolymer to be used in yet another embodiment of the method for the production of a carbon black graft polymer according to this invention and FIG. 4(f) is a diagram illustrating schematically the state of linkage of block- or graft-copolymers to the surface of a carbon black particle (CB).
Figure 4D:
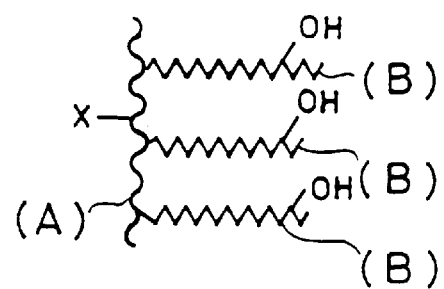
Figure 4B:
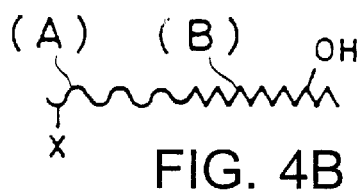
Figure 4C:
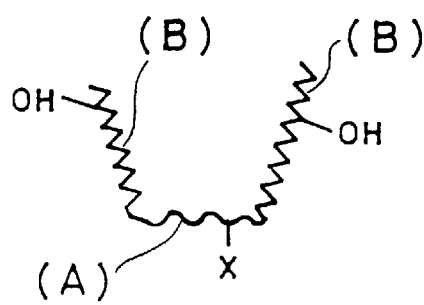
Figure 4F:
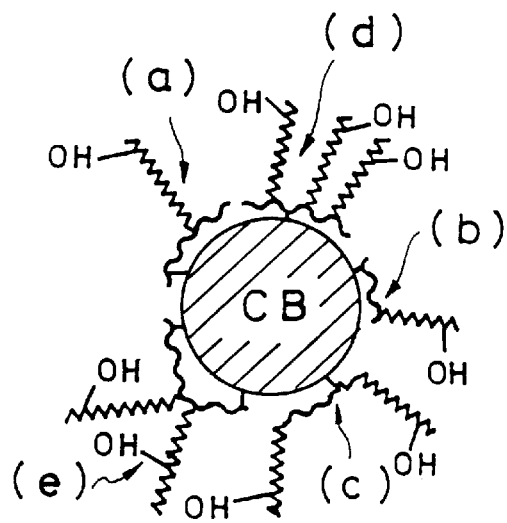
Figure 4E:
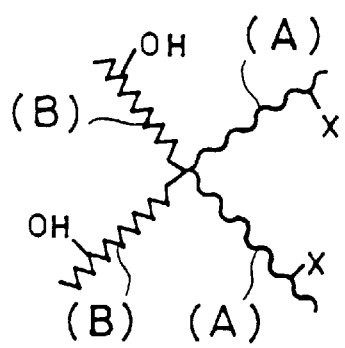

Now, this invention will be described more particularly below with reference to embodiments.

1. Carbon black graft polymer

The term "carbon black graft polymer" used herein means minute particles having a polymer moiety grafted to a carbon black moiety. The carbon black graft polymer has the polymer grafted to either individual primary particles or aggregates each of several primary particles of carbon black. Then, the term "grafting" used herein means irreversible addition of a polymer to such a substrate as carbon black as defined by Jean-Baptiste Donnet et al. in "Carbon Black" of their own production (published on May 1, 1978 by Kodansha K.K.).

By the irreversible addition reaction, the polymer moiety can be chemically bound to the surface of carbon black particles and consequently the two moieties can be infallibly bound. The addition reaction which can be used for "grafting" is known in four types, i.e. electrophilic addition reaction, radical addition reaction, nucleophilic addition reaction, and addition cyclization reaction.

The carbon black generally has particle diameters in the range of several nm to some hundred nm. Since the carbon black produces large cohesive strength between the individual particles thereof, however, it is generally treated as aggregates having particle diameters of not less than several microns. Since the cohesive force produced between the individual particles of the carbon black is markedly large as compared with the affinity of the carbon black for the other media, it is extremely difficult for the carbon black to be dispersed on the order of submicrons in the medium. In contrast, in the carbon black graft polymer, the polymer moiety effectively enters between the particles of carbon black and weakens the cohesive force between the particles of carbon black. So long as the polymer moiety has affinity for the medium, the carbon black graft polymer can be dispersed on the order of submicrons in the medium.

Even though the polymer moiety has high affinity for the medium, the properties of the carbon black graft polymer are not stabilized but are suffered to disperse when the polymer moiety is not effectively grafted to the carbon black moiety. An attempt to enable the affinity to remain above a certain level results in decreasing the content of the carbon black moiety in the carbon black graft polymer and imposing a limit on the uses to be found for the product. When the affinity manifested by the polymer moiety grafted to the carbon black for the medium is exclusively relied on, the stability of dispersion in the medium to be consequently attained has its limit and the fulfillment of functionally added requirements imposed on the carbon black graft polymer by varying uses found therefor becomes difficult.

The present inventors have made a diligent study on the conventional carbon black graft polymer with respect to ① the impartation thereto of such functionalities as are demanded by various uses found therefor and ② the improvement thereof in dispersibility to such degrees as are required by the various uses. They have consequently found that a carbon black graft polymer further improved in dispersibility and other functional properties is obtained by using as the polymer for constituting the polymer moiety a polymer which has a specific functional group such as an ethylenically unsaturated double bond or a carboxyl group in combination with a reactive group capable of reacting with the functional group on the surface of carbon black.

When the carbon black graft polymer the graft chain of which contains unsaturated double bond(s) is added to a photo-curable resinous composition or a thermosetting resinous composition, for example, it is fixed to the resin matrix through the photo-curing reaction or thermosetting reaction and, therefore, enabled to retain the dispersed state stably and also contribute to the curing reaction of the composition itself.

When the carbon black graft polymer the graft chain of which contains carboxyl group(s) is added to an alkali-soluble photo-curable resinous composition, it can improve the alkali developing property of the resinous composition.

If a polymer having a reactive group capable of reacting with the functional group on the surface of carbon black and having a carboxyl group is heated and mixed with carbon black in an effort to produce a carbon black graft polymer the graft chain of which contains the carboxyl group, the grafting aimed at will not be obtained because the reactive group and the carboxyl group of the polymer react and produce a gel. This invention, therefore, is enabled to obtain a carbon black graft polymer with the expected structure by grafting a polymer containing hydroxyl group(s) to carbon black and then treating the product of grafting with an acid anhydride thereby introducing carboxyl group(s) therein through the half-esterification of the hydroxyl group with the acid anhydride.

The present inventors have further made a diligent study with respect to the structure of the polymer which is destined to constitute the polymer moiety. They have consequently found that a carbon black graft polymer which allows effective grafting and excels in dispersibility in various media as compared with the conventional carbon black graft polymer can be obtained by using a block- or graft-copolymer.

The polymer having reactivity with carbon black and used heretofore in the production of the conventional carbon black graft polymer is either a random copolymer or a polymer having one reactive group at one terminal thereof and the reactive group capable of reacting with carbon black as distributed sparsely or substantially singly in one molecular chain. In contrast, the block- or graft- copolymer according to this invention is in such a form that the groups reactive with carbon black are concentrated in a specific site, namely the segment (A), and therefore is thought to heighten greatly the probability of reaction with carbon black.

Further, the improvement of the grafting efficiency is considered to be made more conspicuous by designing the molecular formulation of the polymer destined to form the polymer moiety so that a segment (B) having high affinity for the medium selected as a target and a segment (A) having lower affinity for the medium than the segment (B) make up the polymer and the segment (A) alone has a reactive group capable of reacting with the functional group on the surface of carbon black and contributing to the grafting, and then implementing the grafting in a liquid dispersion medium formed of either the target medium mentioned above or a medium having characteristic (such as the polarity) resembling those of the target medium.

FIG. 1 is a diagram illustrating schematically the state of the proximity of the surface of carbon black which arises when a block- or graft-copolymer having the reactive group mentioned above reacts with carbon black in a liquid dispersion medium formed of either the target medium or a medium having characteristic (polarity) resembling those of the medium. Since the polymer comprises the segment (A) containing the reactive group and the segment (B) having the affinity for the medium as mentioned above, the segment (B) is oriented so as to assume a shape stretched out toward the interior of the liquid dispersion medium and, as a necessary consequence, the segment (A) is made to encircle the surface of the carbon black particle and offer a cite of reaction appropriate for the grafting of the polymer to the carbon black in the reaction system as illustrated in the diagram. Consequently, the grafting proceeds effectively.

The graft chain bound to the surface of the carbon black graft polymer which is consequently obtained manifests high affinity for the medium selected as a target because it is so oriented that the segment (B) having high affinity for the medium may be exposed to the outer side. Thus, the carbon black graft polymer can be dispersed on the order of submicrons in the medium.

Alternatively, though on a similar idea, a block- or graft-copolymer which has a segment (A) containing a reactive group capable of reacting with the functional group on the surface of carbon black and a segment (B) having virtually none of the reactive group and manifesting lower affinity for carbon black than the segment (A) (namely having a segment (A) manifesting high affinity for carbon black and a segment (B) manifesting high affinity for the medium) may be grafted to carbon black.

Since the segment (A) of this polymer is oriented on the carbon black side in the reaction system, the reactive group present in the segment (A) is grafted more effectively to the surface of carbon black. The graft chain bound to the surface of the carbon black graft polymer which is produced by the grafting mentioned above manifests high affinity for the target medium because it is so oriented that the segment (B) having high affinity for the medium may be exposed to the outer side. Thus, the carbon black graft polymer can be dispersed on the order of submicrons in the medium. Incidentally in this case, unlike the case mentioned above, the grafting is not necessarily be carried out in a liquid dispersion medium having affinity for the segment (B) and formed of a medium having characteristic identical with or close to the characteristic of the target medium. It may be effected instead by melting and mixing only the polymer and the carbon black or carrying out the reaction in a liquid dispersion medium manifesting substantially equal affinity for the segment (A) and the segment (B). In order for the grafting to proceed more infallibly and efficiently, however, it is appropriately carried out in a liquid dispersion medium which has affinity for the segment (B).

The carbon black graft polymer which is formed by using the block- or graft-copolymer as the polymer destined to form the polymer moiety as mentioned above can be satisfactorily dispersed in various kinds of medium as compared with the conventional carbon black graft polymer because the polymer moiety is grafted effectively and had excellent dispersibility. Further, it is at an advantage in permitting the carbon black graft polymer to increase the carbon black content thereof, allowing the carbon black to alleviate the polymerization inhibiting effect inherent therein and exalt the electric insulation thereof, and enabling the grafting to proceed readily in an organic solvent.

When the carbon black graft polymer is formed by using the block- or graft-copolymer as the polymer destined to form the polymer moiety, the polymer indeed lends itself to enhancing the dispersibility, alleviating the polymerization inhibiting effect, and exalting the electric insulation. When this carbon black graft polymer is incorporated in a photo-curable resinous composition, for example, so as to give rise to a black photo-curable resinous composition, however, the carbon black graft polymer in this structure is substantially incapable of participating in such a curing reaction as photopolymerization or photo-crosslinkage. In order for this resinous composition to acquire a satisfying photo-curing property, this resinous composition requires to incorporate therein a photo-curable compound in a large amount relative to the amount of the carbon black graft polymer present therein and, as a necessary consequence, impose an upper limit to the amount of the carbon black graft polymer allowed to be incorporated therein and incur difficulty in acquiring thorough imperviousness to light with a film of small wall thickness. By the same token, even when the medium for incorporating the carbon black graft polymer therein is in such a form as to be cured by photopolymerization, thermal polymerization, or thermal cross-linking reaction, the fact that the carbon black graft polymer has reactivity with the medium destined to form a matrix proves advantageous in enabling the produced resinous composition to acquire a fully satisfactory curing property and impart stable dispersibility to the carbon black.

The present inventors, after further continuing a diligent study, have found that when an unsaturated double bond is introduced into the segment (B), namely that of the component segments of the blocking or grafting polymer destined to form the polymer moiety which is not used for reacting the functional group on the surface of carbon black but is oriented outwardly, the carbon black graft polymer consequently obtained, after being incorporated in the photo-curable resinous composition, permits the curing reaction of the composition to proceed satisfactorily, enables the film with even a small wall thickness to manifest thorough imperviousness to light, and excels in terms of strength of film and stability of dispersion of carbon black as well.

The present inventors have further found that the carbon black graft polymer which is obtained by adapting the block- or graft-copolymer for forming the polymer moiety mentioned above to contain hydroxyl group(s) particularly in the segment (B), i.e. that of the component segments which falls on the outwardly orienting side, grafting the polymer to carbon black, and then treating the product of grafting with an acid anhydride thereby introducing therein carboxyl group(s) by the reaction of half-esterification between the hydroxyl group and the acid anhydride is incorporated in an alkali-soluble photo-curable resinous composition, for example, the product acquires an alkali-developing property and enjoys the stability of dispersion of carbon black as well.

A pigment-complexed polymer which is obtained by using a pigment other than carbon black as a pigment component and complexing this pigment with the polymer moiety according to this invention can acquire as satisfying properties as the carbon black graft polymer of the present invention described above.

The term "pigment-complexed polymer" as used in the present specification means the product which results from heat-treating a pigment and a polymer having reactive group(s) capable of reacting with the functional group(s) on the surface of the pigment and has the polymer stably attached to the surface of individual primary particles or aggregates each of several primary particles of the pigment. The stabilized adhesion of the polymer to the surface of the pigment particles is theoretically explained by a supposition that a chemical bondage of some form or other such as, for example, the grafting mentioned above has occurred between the surface of the pigment particles and the polymer. The question of whether or not the grafting of this nature has occurred is analytically determined only with difficulty of certain degree. Actually in many cases, not merely the chemical bonding force but also the physical adhesive force may possibly act in large measure on the interface. In the sense of additionally embracing this probable state, the term "complex polymer" or "complexing" has been adopted herein.

The present invention will be described as centered on the embodiment which comprises using carbon black as a pigment and complexing a polymer with the carbon black thereby obtaining a pigment-complexed polymer. To facilitate comprehension of this invention, the pigment-complexed polymer which is obtained by the embodiment mentioned above will be expressed hereinafter as "carbon black graft polymer." It should be noted, however, that this expression can actually embrace not only what has resulted from "grafting" the polymer as defined above but also a carbon black-complexed polymer, namely what has resulted from "complexing" the polymer in the broad sense of the word.

1.1 Carbon black

The carbon black which is used in the production of the carbon black graft polymer of this invention is required to have a functional group such as carboxyl group or hydroxy group on the surface thereof and is not limited in any other respect. Any of various species of carbon black such as, for example, furnace black, channel black, acetylene black, and lamp black can be used. Among other ordinary commercially available species of carbon black, those which have carboxyl group(s) prove particularly advantageous. Appropriately, the carbon black used herein has a pH value of less than 7, preferably a pH value in the range of 1–5. The carbon black having carboxyl group(s) can be easily procured as acidic carbon black. The carbon black which is obtained by acidifying neutral or basic carbon black can be advantageously used. If the carbon black does not have such a functional group as carboxyl group or has a pH value exceeding 7, the grafting will possibly fail to proceed effectively. The test of carbon black for pH is performed by the method specified in JIS K 6211.

Appropriately the average particle diameter of carbon black is in the range of 0.0005–0.5 $\mu$m, preferably 0.001–0.2 $\mu$m. The carbon black which has an average particle diameter of less than 0.0005 $\mu$m has only meager commercial significance because it is not easily obtained. If the carbon black has an average particle diameter exceeding 0.5 $\mu$m, it will possibly fail to impart thorough dispersibility to the produced carbon black graft polymer.

The pigment to be used in producing a pigment-complexed polymer other than the carbon black graft polymer according to the present invention does not need to be particularly limited but may be an organic pigment, an inorganic pigment, or a mixture thereof.

As concrete examples of the inorganic pigment, powders or particles of alumina, titanium dioxide, barium titanate, magnesium titanate, calcium titanate, strontium titanate, zinc oxide, silica sand, clay, mica, tabular spar, diatomaceous earth, various kinds of inorganic oxide pigments, chromium oxide, cerium oxide, iron oxide red, antimony trioxide, magnesium oxide, zirconium oxide, barium sulfate, barium carbonate, calcium carbonate, fine silica powder, silicon carbide, silicon nitride, boron carbide, tungsten carbide, titanium carbide, and cerium oxide may be cited other than such species of carbon black as cited above. These inorganic pigments may have been treated with a titanium coupling agent, a silane coupling agent, or any of the known agents such as higher fatty acid metal salts which are capable of imparting hydrophobicity.

As concrete examples of the organic pigment, yellow pigments such as naples yellow, naphthol yellow-S, Hanza yellow-G, Hanza yellow-10G, benzidine yellow-G, benzidine yellow-GR, quinoline yellow lake, permanent yellow-NCG, and Tartrazine yellow lake, orange pigments such as molybdenum orange, permanent orange RK, benzidine orange G, and indanethrene brilliant orange GK, red pigments such as permanent red 4R, lithol red, pyrazolone red 4R, Watching Red Ca, lake red D, brilliant carmine 6B, eosin lake, rhodamine lake B, alizarin lake, and brilliant carmine B, purple pigments such as fast violet B and methyl violet lake, blue pigments such alkali blue lake, victoria blue lake, phthalocyanine blue, nonmetallic phthalocyanine blue, phthalocyanine blue partial chloride, fast sky blue, and indanethrene blue BC, and green pigments such as pigment green B, malachite green lake, and Fanal yellow green G may be cited.

1.2 Reactive group

The reactive group capable of reacting with the surface of carbon black in the polymer to be grafted to carbon black is only required to be capable of reacting with the functional group which is present on the surface of carbon black and consequently contributing to the grafting of the polymer to the carbon black and is not particularly limited in any other respect. Various reactive groups are available for this purpose.

In order for the grafting to be effected more infallibly and stably, it is appropriate that the polymer moiety be capable of being bound to carbon black through the medium of a covalent bond. Particularly, the bond is expected to be one member selected from the group consisting of ester bond, thioester bond, amide bond, amino bond, ether bond, thioether bond, carbonyl bond, thiocarbonyl bond, and sulfonyl bond and preferably one member selected from the group consisting of ester bond, thioester bond, and amide bond. In consideration of this point as well, the reactive group is appropriately at least one member selected from the class consisting of epoxy group, thioepoxy group, aziridine group, and oxazoline group. The reactive group which is associated with the carbon black is not necessarily limited to those groups enumerated above. If the polymer which is used has group(s) other than the reactive group, it will possibly impose a limit on the kinds of carbon black to be effectively used. The reason why the polymer preferably is expected to have the reactive group is that the carbon black and the polymer undergo an addition reaction with very high grafting efficiency even under mild conditions without reference to the kind and the state of the carbon black allowed to be used. The carbon black which has the carboxyl group(s) as the functional group(s) on the surface thereof as described above proves particularly advantageous because this carboxyl group undergoes an irreversible thermal addition reaction with an epoxy group, a thioepoxy group, an aziridine group or an oxazoline group with a high yield and, owing to this addition reaction, and forms the covalent bond mentioned above between the carbon black moiety and the polymer moiety.

As means for introducing the reactive group(s) into the polymer, generally (1) the method which comprises polymerizing a polymerizable monomer having the reactive group in the molecular unit thereof, when necessary, in combination with another polymerizable monomer and (2) the method which comprises causing a compound having the reactive group in the molecular unit thereof to react with a polymer capable of reacting with the compound thereby effecting introduction of the reactive group(s) into the polymer which are both disclosed in WO88/03545 (PCT/JP 87/00867) are available. Since this invention specifies the use of a graft- or block-copolymer containing not only the reactive group(s) mentioned above but also unsaturated double bond(s) or hydroxyl group(s), it possibly requires the polymer to be synthesized under more particular conditions as shown herein below.

Incidentally, the pertinent passage disclosed in WO88/03545 (PCT/JP 87/00867) mentioned above is incorporated in herein by reason of its association herewith.

1.3 Unsaturated double bond-containing polymer

The skeletal structure of the polymer for use in this invention which has such reactive group(s) as is capable of reacting with the functional group(s) on the surface of carbon black and has ethylenically unsaturated double bond (s) does not need to be particularly limited but may be selected from among various vinyl type polymer structures, polyester type structures, and polyether type structures, for example. Notwithstanding this statement, the polymer appropriately has such a block- or graft-type structure as will be described specifically in Section 1.5 afterward.

As a concrete example of the polymer having the simplest skeletal structure other than the block- or graft-type structure, the polymer having functional group(s) reactive with carbon black and unsaturated double bond(s) and obtained by randomly copolymerizing a monomer having the functional group reactive with carbon black and a monomer having a hydroxyl group, thereby allowing the polymer preparatorily to introduce the hydroxyl group therein through the aid of the monomer having the hydroxyl group, and thereafter causing the polymer to react with an unsaturated isocyanate compound may be cited.

Where resistance to heat is an additional requirement, an unsaturated epoxy ester resin containing at least one each of epoxy group and ethylenically unsaturated double bond in the molecular unit thereof may be cited. This term "unsaturated epoxy ester resin" refers to what is obtained by mixing an epoxy resin containing two or more epoxy groups in the molecular unit thereof with an unsaturated monobasic acid and allowing the carboxyl groups in the unsaturated monobasic acid to react with the epoxy groups in the epoxy resin at a ratio such that one or more epoxy groups may survive in the molecular unit.

The epoxy resin to be used herein is only required to be an epoxy resin containing two or more epoxy groups in the molecular unit thereof and is not particularly limited in any other respect. As concrete examples of the epoxy resin which answers this description, novolak type epoxy resins, bisphenol type epoxy resins, glycolic type epoxy resins, polyfunctional glycidyl amine resins such as tetraglycidyl aminodiphenyl methane, polyfunctional glycidyl ether resins such as tetraphenyl glycidyl ether ethane, the reaction products of epichlorohydrin with polyphenol compounds which are obtained by the condensation reaction of phenols and naphthols such as phenol, o-cresol, and m-cresol with aromatic aldehydes having a phenolic hydroxyl group, the reaction products of epichlorohydrin with polyphenol compounds obtained by the addition of phenols and diolefin compounds such as divinyl benzene and dicyclopentadiene, the products obtained by epoxidizing the ring-opened polymer of 4-vinyl cyclohexene-1-oxide with a peroxide, and the chain-elongated products of the epoxy resins mentioned above by the reaction thereof with a polybasic acid, a polyphenol, a polyfunctional amino compound, or a polythiol may be cited.

As concrete examples of the unsaturated monobasic acid, acrylic acid, methacrylic acid, polyfunctional (meth) acrylates containing one carboxyl group and two or more (meth)acryloyl groups, etc. may be cited.

The unsaturated epoxy ester resin in which one or more epoxy groups are surviving in one molecule of resin is obtained by causing the epoxy resin mentioned above to react with an unsaturated monobasic acid at a ratio of 0.05–0.95 chemical equivalent weight of the carboxyl group in the unsaturated monobasic acid to one chemical equivalent weight of the epoxy group in the epoxy resin.

As concrete examples of the esterifying catalyst to be used in the reaction of the epoxy resin containing two or more epoxy groups in the molecular unit with the unsaturated monobasic acid, tertiary amines such as triethyl amine, quaternary ammonium salts such as triethylbenzyl ammonium chloride, imidazole compounds such as 2-ethyl-4-methyl imidazole, phosphorus compounds such as triphenyl phosphine, organic acid salts of metals, inorganic salts of metals, and chelate compounds of metals may be cited. The unsaturated epoxy ester resin is obtained by carrying out the reaction at a temperature in the range of 80–130° C. by the use of such a catalyst as mentioned above in the presence or absence of a diluting agent which will be described specifically herein below. The amount of the esterifying catalyst to be used herein is generally in the range of 0.001–10% by weight, preferably in the range of 0.005–5% by weight, based on the sum of the amounts of the epoxy resin and the unsaturated monobasic acid to be used. If this amount falls short of 0.001% by weight, the reaction of the epoxy resin with the unsaturated monobasic acid will not thoroughly proceed. If the amount exceeds 10% by weight, the photocurable resinous composition which incorporates therein the carbon black graft polymer formed of the produced resin will be deficient in stability.

The unsaturated epoxy ester resin in the process of synthesis, when necessary, may use one solvent or a mixture of two or more solvents as a diluting agent. As concrete examples of the solvent usable as the diluting agent, hydrocarbons such as toluene and xylene, cellosolves such as cellosolve and butyl cellosolve, carbitols such as carbitol and butyl carbitol, esters such as cellosolve acetate and carbitol acetate, ketones such as methylethyl ketone, ethers such as diethylene glycol dimethyl ether, and dimethyl formamide, N-methyl-2-pyrrolidone, and g-butyrolactone may be cited.

The unsaturated double bond-containing polymer, however, is not limited in any respect to such an unsaturated epoxy ester resin or to a block- or graft-copolymer which will be specifically described in Section 1.6 herein below but may be selected from among the polymers of the various skeletal structures cited above on the condition that contains such a varying reactive group as mentioned above and an ethylenically unsaturated double bond.

While the unsaturated double bond-containing polymer has no particularly critical molecular weight, it appropriately has an average molecular weight in the range of 500–1000000, preferably in the range of 1000–100000, in consideration of the effect of the grafting of the polymer to the carbon black and the amount of work involved during the reaction of the polymer with the carbon black.

1.4 Hydroxyl group-containing polymer

The skeletal structure of the polymer containing reactive group(s) capable of reacting with the functional group on the surface of carbon black and containing hydroxyl group(s) and used in this invention for the production of the carbon black graft polymer containing carboxyl group(s) in the graft chain is not particularly critical but may be of a varying kind. The polymer nevertheless appropriately has a block- or graft-type structure as will be specifically described in Section 1.5 herein below. The hydroxyl group-containing polymer of the block- or graft-type structure will be specifically described in Section 1.6 herein below.

As concrete examples of the skeletal structure other than the block- or graft-type structure, the structures having such reactive groups as epoxy group bound to one terminal of a hydroxyl group-containing polymer chain which are represented by poly(meth)acrylic hydroxyalkyl ester type structures and poly(meth)acrylic hydroxyalkyl ester copolymer type structures may be cited. The production of such polymer can be implemented by following the procedure disclosed in WO88/03545 (PCT/JP 87/00867) with necessary modifications. The unsaturated epoxy ester resin cited in Section 1.3 above is in another aspect a polymer containing a hydroxyl group.

The hydroxyl group-containing polymer does not need to be limited to the concrete examples cited above but may be in any of the various skeletal structures cited above on the condition that it contains a varying reactive group and a hydroxyl group.

While the hydroxyl group-containing polymer has no particularly critical molecular weight, it appropriately has an average molecular weight in the range of 500–1000000, preferably in the range of 1000–100000, in consideration of the effect of the grafting of the polymer to the carbon black and the amount of work involved during the reaction of the polymer with the carbon black.

1.5 Block- or graft-copolymer

The structure particularly appropriate for the polymer which is used in this invention for the formation of the polymer moiety of the carbon black graft polymer by the grafting thereof to carbon black is a block- or graft-type structure having a segment (A) containing reactive group(s) capable of reacting with the functional group on the surface of carbon black and a segment (B) different in skeletal structure from the segment (A) mentioned above.

The block- or graft-copolymer is not limited to the simple structure of an A-B type block copolymer as shown in FIG. 2(*b*) and an A-B type graft copolymer as shown in FIG. 2(*a*) but may be selected from various polymers such as, for example, a B-A-B type block copolymers as shown in FIG. 2(*c*) or higher alternate block copolymers, comb-shaped graft copolymers having a plurality of segments B grafted to a segment A as shown in FIG. 2(*d*), and pentacle graft copolymers as shown in FIG. 2(*e*). In the diagrams mentioned above, the symbol X represents a reactive group. FIG. 2(*f*) represents the state in which various block- or graftpolymers are bound to the surface of a carbon black particle (CB),. The essential thing is that the block- or graft-copolymer may be in any of known forms on the condition that at least one segment (B) can be oriented with freedom of certain degree toward the outside from the surface of the carbon black particle as the copolymer was bound to the surface of the carbon black particle. Otherwise, the polymer may be in a form such that several kinds of segments falling under the category of segment (A)) are existed as segments (A) (similarly, regarding the category of segment (B), several kinds of segments may be existed), or a form such that a segment manifesting a quality different from that of the segment (A) or segment (B) (hereinafter referred to as "segment (C)"), for example, manifesting a quality which intermediates therebetween, elongating the graft chain, or imparting a function to heighten or lower the "flicker" (mobility) of the graft chain in a medium, is disposed between the segments (A) and the segments (B). The segment (C) may or may not have a reactive group. Generally, however, it preferably does not contain the reactive group for the sake of exalting the grafting efficiency. The segments (C) of the polymers, when necessary, may have incorporated therein a reactive group capable of forming a cross linkage with each other. The "segment (C)," in spite of the designation, may be broadly classified under the category of segment (A) or segment (B).

In this block- or graft-copolymer, the reactive group contained in the segment (A) is only required to be capable of contributing to the grafting of the copolymer to carbon black through the reaction thereof with the functional group present on the surface of carbon black and is not particularly limited in any other respect. Any of the various reactive groups cited above may be used.

The segment (A) containing the reactive group appropriately manifests low affinity for the medium selected as a target on account of the structure of the segment chain. The expression "low affinity" is used strictly herein relative to the affinity of the other segment (B). Depending on the kind of the target medium or the structure of the segment (B), therefore, the structure of the segment (A) cannot be generally specified but may be any of the various known structures. From another point of view, the fact that the segment (A) manifests high affinity for carbon black proves advantageous because the ability thereof to orient relative to the carbon black improves proportionately to the affinity. Appropriately in this respect, the segment (A) mentioned above has a main chain thereof formed principally of a carbon-carbon bond or preferably contains in the main chain an aromatic ring such as, for example, a benzene ring, a naphthalene ring, or an indene ring and, at the same time, has such a reactive group as mentioned above in the molecular unit thereof and the segment (B) mentioned above has a skeletal structure which has a smaller content of a carbon-carbon bond, particularly an aromatic ring, than the segment (A), for example, a polysiloxane structure, or a skeletal structure which contains in a large amount a bond such as an ether bond or an ester bond which is other than the carbon-carbon bond.

If the segment (A) is formed substantially wholly of a highly condensed polycyclic structure, then the segment (A) will acquire extremely increased rigidity and, while being grafted to carbon black, will possibly incur difficulty in having access to the surface of carbon black. Appropriately, therefore, the segment (A) has a proper linear structure.

The chain structure of the segment (A), as described above, can be suitably selected depending on the chain structure of the segment (B) which is selected with a view to the dispersibility intended to be imparted to carbon black. For example, it may be any of the various vinyl type polymers which are obtained by the homopolymerization or copolymerization of styrenic monomers, (meth)acrylic monomers, and alkylene type monomers or the polymer chains (containing the reactive group mentioned above) such as polyesters and polyethers. Among other concrete examples of the segment (A) enumerated above, the segment (A) is preferably a vinyl type polymer, particularly a vinyl type polymer which contains not less than 50 mol %, preferably not less than 60 mol %, of a vinyl type monomer component having an aromatic ring and has a reactive group as well because it can be combined with a varying kind of segment (B) which is selected to suit the target medium.

In consideration of such factors as economy, a homopolymer or copolymer formed principally of a styrene type monomer and a (meth)acryl type monomer, particularly a polymer chain containing not less than 50 mol %, preferably not less than 60 mol %, of a styrene type monomer component (having the reactive group mentioned above) proves particularly advantageous.

When the segment (A) containing the reactive group is adapted to manifest notably lower affinity for the target medium on the chain structure thereof than the segment (B), it is not necessarily required to manifest high affinity for carbon black. The segment (A) is satisfactorily usable even when the affinity thereof is substantially equal to or even lower than that of the segment (B) for carbon black. The segment (B), when necessary, may be in a styrene type structure.

The segment (B) is suitably selected, depending on the dispersibility thereof in the target medium and the properties intended to be imparted to carbon black, may be suitably selected from among polymer chains having polysiloxane type structures, poly(meth)acryl type structures, polyether type structures such as polyalkylene glycol, polyester type structures, polyalkylene type structures, polyamide structures, polyimide structures, and polyurethane structures.

For example, the chains of polysiloxane type structures can be adopted for the purpose of improving the dispersibility in media of low polarity, utilizing excellent qualities including water repellency, mold releasing property, resistance to heat, weatherability, flexibility, and low viscosity, and compensating for low-temperature brittleness, the (meth)acrylic type chains for the purpose of, by introducing various (meth)acryl ester monomer components, imparting an affinity variable amply from hydrophilicity to hydrophobicity, crystallinity, and water repellency (for example, a (meth)acrylic hydroxyalkyl ester is introduced to improve hydrophilicity, a (meth)acrylic dodecyl ester to improve hydrophobicity, a (meth)acrylic stearyl ester to improve crystallinity, or a fluoro(meth)acrylic ester to improve water repellency), and the polyalkylene glycol chains for the purpose of imparting such characteristics as hydrophilicity, lubricity, flexibility, or resistance to electrification.

It is also permissible to design the molecular formulation of the polymer so that the segment (A) containing a reactive group capable of reacting the functional group on the surface of carbon black may manifest higher affinity for carbon black than the segment (B) which has high affinity for the target medium.

In this case, the segment (A) containing the reactive group must be adapted to manifest high affinity for carbon black on the structure of the segment chain. The expression "high affinity" is used strictly herein relative to the affinity of the other segment (B). Depending on the structure of the segment (B), therefore, the structure of the segment (A) cannot be generally specified but may be selected from among the various known structures. Appropriately, however, the segment (A) mentioned above has a main chain thereof formed principally of a carbon-carbon bond or preferably contains in the main chain an aromatic ring such as, for example, a benzene ring, a naphthalene ring, or an indene ring and, at the same time, has such a reactive group as mentioned above in the molecular unit thereof, and the segment (B) mentioned above has a skeletal structure which has a smaller content of a carbon-carbon bond, particularly an aromatic ring, than the segment (A) such as, for example, a polysiloxane structure, or which contains in a large amount a bond such as an ether bond or an ester bond which is other than the carbon-carbon bond.

If the segment (A) is formed substantially wholly of a highly condensed polycyclic structure, then the segment (A) will acquire extremely increased rigidity and, while being grafted to carbon black, will possibly incur difficulty in having access to the surface of carbon black. Appropriately, therefore, the segment (A) has a proper linear structure.

The chain structure of the segment (A), as described above, can be suitably selected depending on the chain structure of the segment (B) such as, for example, the polymer chains having polysiloxane type structures, poly (meth)acryl type structures, polyether type structures like polyalkylene glycol, polyester type structures, polyalkylene type structures, polyamide structures, polyimide structures, and polyurethane structures, which is selected with a view to the dispersibility intended to be imparted to carbon black. The segment (A) is only required to have higher affinity for carbon black than the segment (B) and is not particularly limited in any other respect. It is generally a vinyl type polymer, particularly a vinyl type polymer containing not less than 50 mol %, preferably not less than 60 mol %, of an aromatic ring-containing vinyl type monomer component and, at the same time, containing the reactive group. In consideration of such factors as economy, a homopolymer or copolymer formed principally of a styrene type monomer and a (meth)acryl type monomer, particularly a polymer chain containing not less than 50 mol %, preferably not less than 60 mol %, of a styrene type monomer component (and having the reactive group mentioned above) proves particularly advantageous. Incidentally, when the segment (B) is a polysiloxane type polymer chain, the segment (A) mentioned above can be selected from among a relatively large number of kinds of polymer chains. When the segment (B) is a vinyl type structure such as, for example, a poly(meth) acryl type structure, the polymer chains which can form the segment (A) are notably limited in number. The polystyrene type structures, the (meth)acryl-styrene copolymer type structures, etc. are all that are available.

The method for producing the block- or graft-copolymer having the segment (A) containing the reactive group and the segment (B.) differing in skeletal structure from the segment (A) and preferably manifesting higher affinity for the target medium than the segment (A) is not particularly limited. The production can be effected by properly combining the technique for the production of a reactive polymer with the technique for the polymerization of a varying block- or graft-type polymer.

As a means for obtaining a graft-type polymer, the method which comprises subjecting a polymerizable monomer together with a polymerization initiator to solution polymerization, emulsion polymerization, bulk polymerization, or suspension polymerization in the presence of a macromolecular compound destined to form a graft chain thereby forming a polymer intended as a main chain has been known. This method, however, is defective in respect that when the macromolecular compound mentioned above contains no radically polymerizable functional group, the produced graft-copolymer entrains an ungrafted polymer in a large amount and consequently the efficiency of grafting is unduly low. Therefore, it is preferable that the method is done with using a radically polymerizable macromolecular compound as the macromolecular compound. However, when the segment (B) in the polymer chain contained in the produced carbon black graft polymer either coincides with or manifests high affinity for the binder resin or solvent which is destined to constitute the matrix of the composition in which the carbon black graft polymer is dispersed, even the graft polymer obtained by the method with a rather low grafting efficiency can be expected to enjoy highly effective exaltation of the stability of dispersion. The above mentioned radically polymerizable macromolecular compound, generally designated as "macromonomer," has a radically polymerizable group such as, for example, a (meth) acryloyl group or styryl group at one terminal thereof. It is obtained, for example, by causing a polymer containing a carboxyl group at one terminal thereof to react with a radically polymerizable monomer containing a glycidyl group in an organic solvent (JP-B-43-11224, for example, discloses a method which obtains this macromonomer by causing a prepolymer obtained by radically polymerizing a radically polymerizable monomer in an organic solvent in the presence of mercapto acetic acid to react with glycidyl methacrylate in the presence of a dimethyl lauryl amine catalyst).

For the purpose of obtaining the graft-copolymer according to this invention, therefore, it suffices to polymerize a polymerizable monomer (a) containing in the molecular unit thereof such a reactive group for carbon black as mentioned above and a polymerizable monomer (c) which is incorporated as occasion demands and destined to form the skeleton of the segment (A) in the presence of a radically polymerizable macromolecular compound (b) as a component for forming the segment (B).

As concrete examples of the polymerizable monomer (a) containing in the molecular unit thereof a reactive group for carbon black, epoxy group-containing polymerizable monomers represented by the following formula:

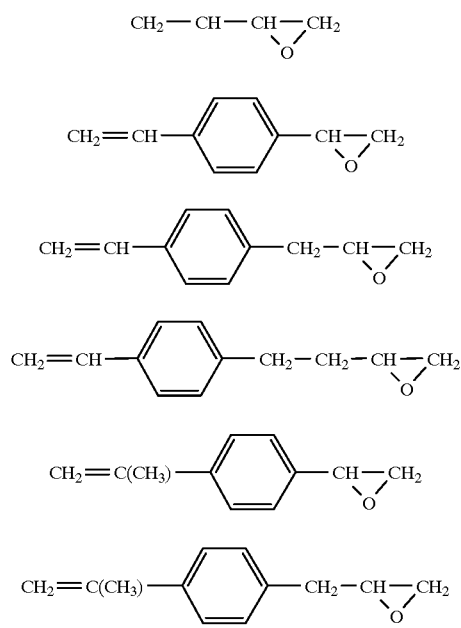

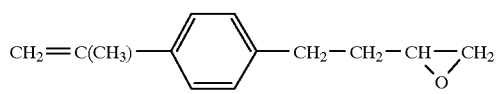

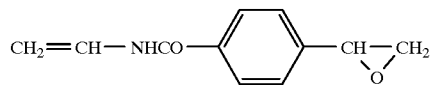

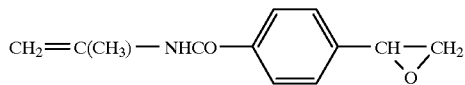

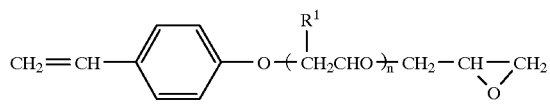

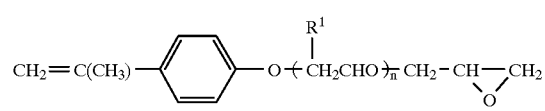

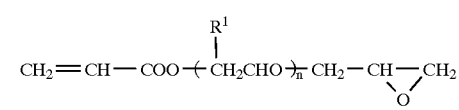

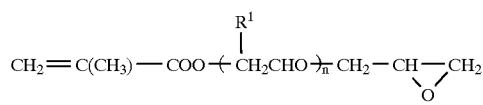

(wherein each $R^1$ is a hydrogen atom or a methyl group independently and each n is 0 or an integer from 1 to 20 independently);

thioepoxy group-containing polymerizable monomers represented by the following formulas:

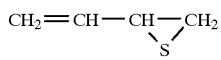

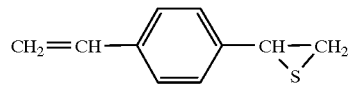

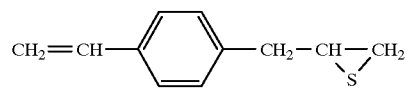

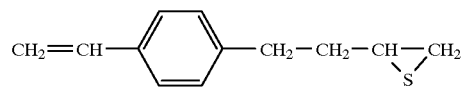

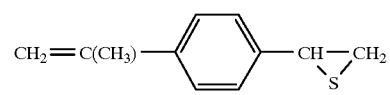

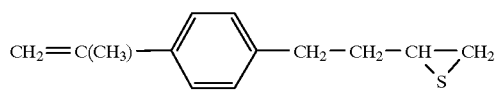

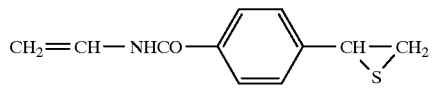

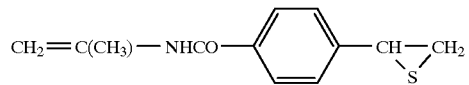

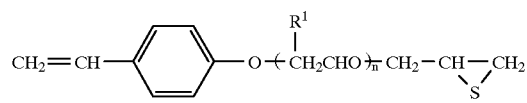

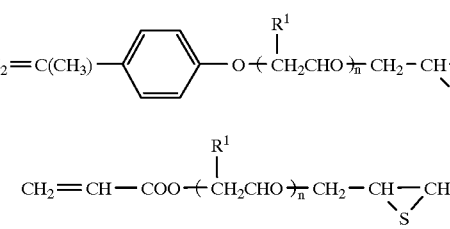

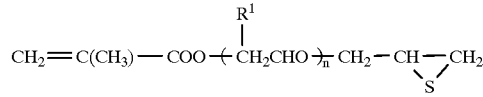

(wherein $R^1$'s and n's are as defined above in the formulas of the epoxy group-containing polymerizable monomers);

aziridine group-containing polymerizable monomers represented by the following formulas:

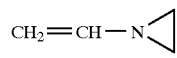

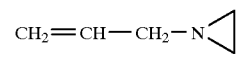

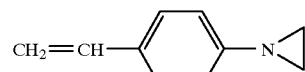

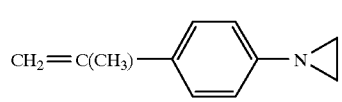

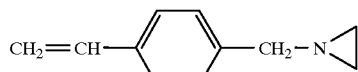

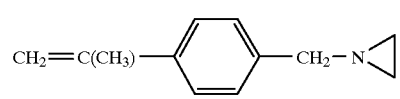

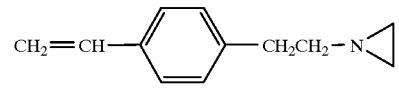

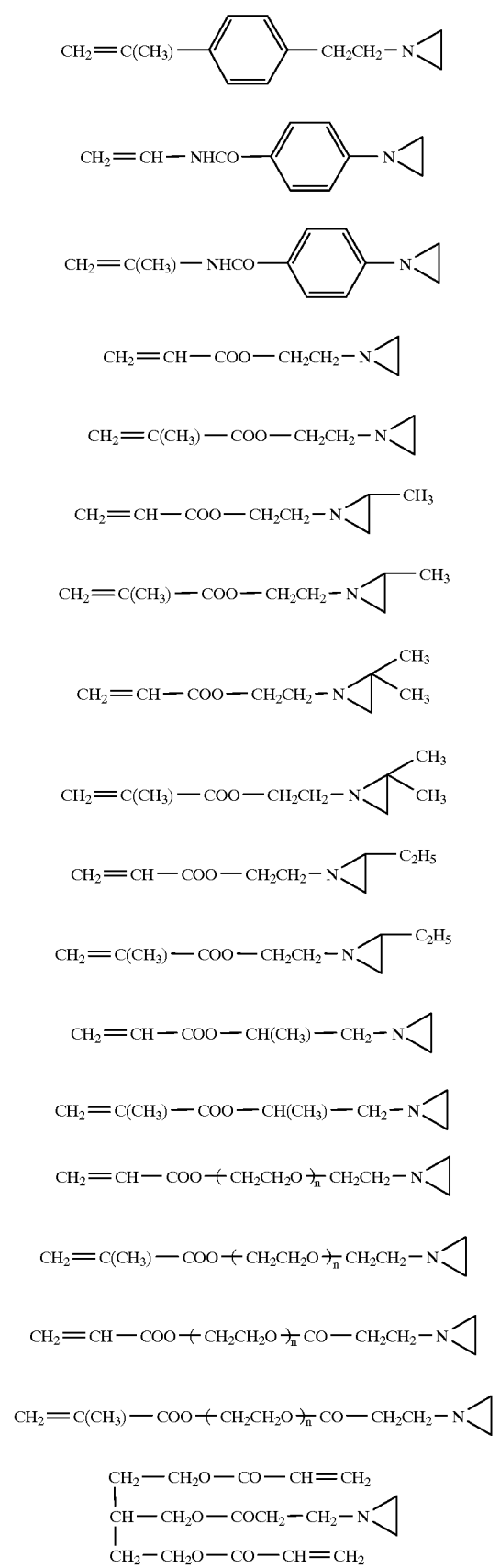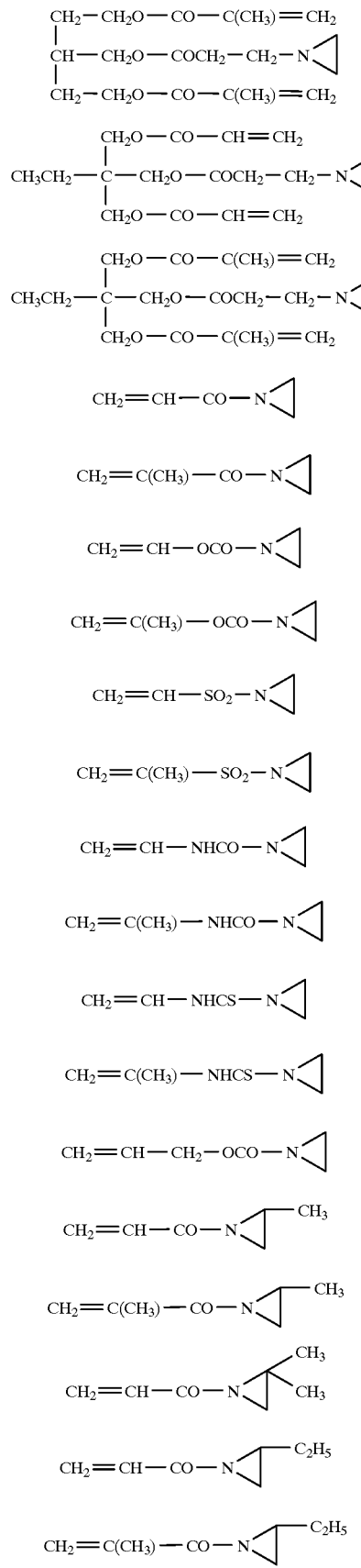

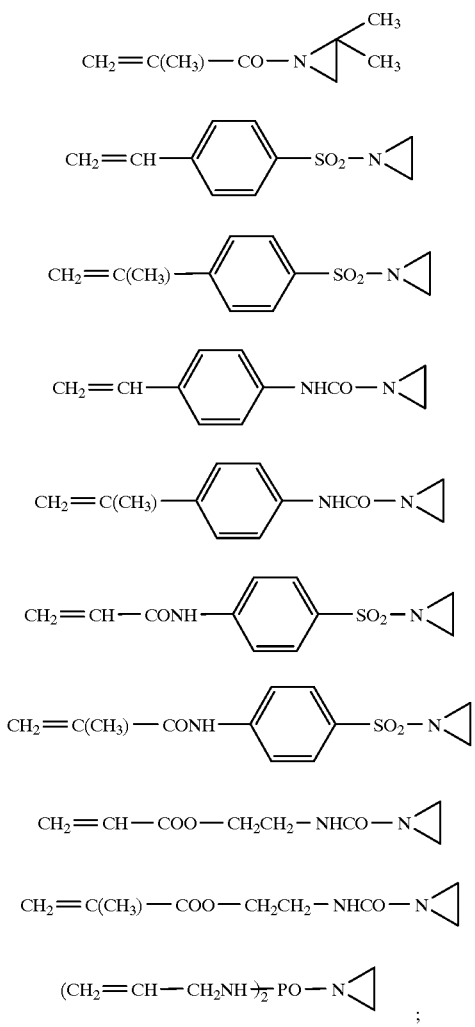

oxazoline group-containing polymerizable monomers such as 2-vinyl-2-oxazoline, 2-vinyl-4-methyl-2-oxazoline, 2-vinyl-5-methyl-2-oxazoline, 2-vinyl-4-ethyl-2-oxazoline, 2-vinyl-5-ethyl-2-oxazoline, 2-isopropenyl-2-oxazoline, 2-isopropenyl-4-methyl-2-oxazoline, 2-isopropenyl-5-methyl-2-oxazoline, 2-isopropenyl-4-ethyl-4-oxazoline, 2-isopropenyl-5-ethyl-2-oxazoline, and 2-isopropenyl-4,5-dimethyl-2-oxazoline; and N-hydroxyalkylamide group-containing polymerizable monomers such as N-hydroxymethyl acrylamide, N-hydroxyethyl acrylamide, N-hydroxybutyl acrylamide, N-hydroxyisobutyl acrylamide, N-hydroxy-2-ethylhexyl acrylamide, N-hydroxycyclohexyl acrylamide, N-hydroxymethyl methacrylamide, N-hydroxyethyl methacrylamide, N-hydroxybutyl methacrylamide, N-hydroxyisobutyl methacrylamide, N-hydroxy-2-ethylhexyl methacrylamide, and N-hydroxycyclohexyl methacrylamide may be cited. These polymerizable monomers may be used either singly or in the form of a mixture of two or more members.

The polymerizable monomer (c) which can be used, when needed, for the purpose of enabling the segment (A) to acquire a skeleton aimed at is only required to be capable of copolymerizing with the monomer (a) mentioned above and the radically polymerizable macromolecular compound (b), a component for forming the segment (B) as will be described herein after and is not particularly limited in any other respect. As concrete examples of the polymerizable monomer (c), styrene type monomers such as styrene, o-methyl styrene, m-methyl styrene, p-methyl styrene, a-methyl styrene, p-methoxy styrene, p-tert-butyl styrene, p-phenyl styrene, o-chlorostyrene, m-chlorostyrene, and p-chlorostyrene; acrylic acid or methacrylic acid type monomers such as acrylic acid, methyl acrylate, ethyl acrylate, propyl acrylate, n-butyl acrylate, isobutyl acrylate, dodecyl acrylate, stearyl acrylate, 2-ethylhexyl acrylate, methacrylic acid, methyl methacrylate, ethyl methacrylate, propyl methacrylate, n-butyl methacrylate, isobutyl methacrylate, n-octyl methacrylate, dodecyl methacrylate, 2-ethylhexyl methacrylate, and stearyl methacrylate; and etylene, propylene, butylene, vinyl chloride, vinyl acetate, acrylonitrile, acrylamide, methacrylamide, and N-vinyl pyrrolidone may be cited. From the group of polymerizable monomers cited above, one member or a combination of two or more members may be selected and put to use, depending on the molecular structure of the segment (A) which is wanted.

The radically polymerizable macromolecular compound (b) to be used for forming the segment (B) component is only required to have a reactive group at one terminal of a proper polymer chain, which is selected from among the polymer chains such as of polysiloxane type structures, poly(meth)acryl type structures, polyether type structures like polyalkylene glycol, polyester type structures, polyalkylene type structures, polyamide structures, polyimide structures, and polyurethane structures.

When the segment (B) is required to have a polysiloxane type structure, for example, the polysiloxane type structure may contain any of such polyorganosiloxanes as polydimethyl siloxane group, partially alkyl group-substituted polydimethyl siloxane group, partially aryl group-substituted polydimethyl siloxane group, and tris(trialkylsiloxy)silyl propyl group.

The radically polymerizable macromolecular compounds ($b_1$) having these polysiloxane type structures include polymerizable polysiloxanes such as, for example, (meth) acryloyl group-containing polydimethyl siloxane, styryl group-containing polydimethyl siloxane, (meth)acryloyl group-containing partially octyl-substituted polydimethyl siloxane, styryl group-containing partially octyl-substituted polydimethyl siloxane, styryl group-containing partially phenyl-substituted polydimethyl siloxane, and tris (trimethylsiloxy)silyl propyl (meth)acrylate. These macromolecular compounds may be used either singly or in the form of a combination of two or more members. Among other macromolecular compounds enumerated above, the compounds of the following formula prove particularly advantageous:

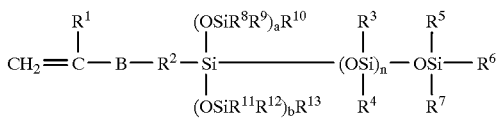

(wherein B is —COO— or a phenylene group, $R^1$ is a hydrogen atom or a methyl group, $R^2$ is an alkylene group of 1–6 carbon atoms, $R^3$–$R^{13}$ are identical or different and each is an aryl group, an alkyl group of 1–6 carbon atoms, or an alkoxyl group of 1–10 carbon atoms, a and b are identical or different and each is an integer of 0–10, and n is an integer of 0–200).

Similarly, where the segment (B) is required to have a polymeth(acryl) type structure, the radically polymerizable macromolecular compounds ($b_2$) which are usable herein include the compounds represented by the following formulas:

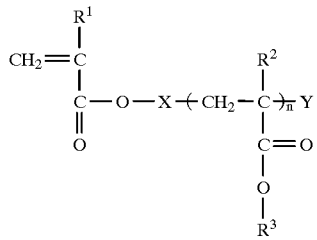

(wherein $R^1$ and $R^2$ are identical or different and each is a hydrogen atom or a methyl group, $R^3$ is an alkyl group of 1–25 carbon atoms, X is an arbitrary coupling chain, Y is the terminal of an initiating agent or a hydrogen atom, and n is an integer of 0–500);

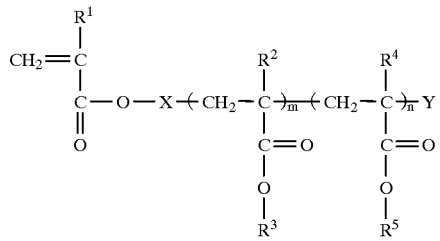

(wherein $R^1$, $R^2$, and $R^4$ are identical or different and each is a hydrogen atom or a methyl group, $R^3$ and $R^5$ are identical or different and each is an alkyl group of 1–25 carbon atoms, X is an arbitrary coupling chain, Y is the terminal of an initiating agent or a hydrogen atom, and m and n are identical or different and each is an integer of 0–500); and

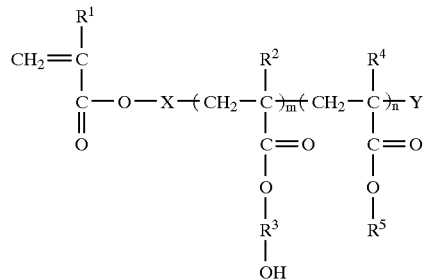

(wherein $R_1$ and $R^2$ are identical or different and each is a hydrogen atom or a methyl group, $R_3$ is an alkylene group of 1–25 carbon atoms, $R^4$ is an alkyl group of 1–25 carbon atoms, X is an arbitrary coupling chain, Y is the terminal of an initiating agent or a hydrogen atom, and n and m are identical or different and each is an integer of 0–500).

Then, where the segment (B) is required to have a polyalkylene glycol type structure, the radically polymerizable macromolecular compounds ($b_3$) which are usable herein include the compounds represented by the following formulas:

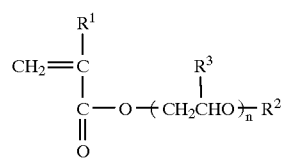

(wherein $R^1$, $R^2$, and $R^3$ are identical or different and each is a hydrogen atom or a methyl group and n is an integer of 0–500); and

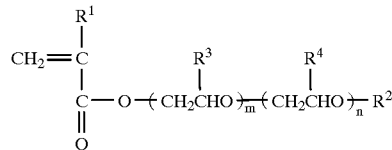

(wherein $R^1$, $R^2$, $R^3$, and $R^4$ are identical or different and each is a hydrogen atom or a methyl group and n and m are identical or different and each is an integer of 0–500).

Further, where the segment (B) is required to have a polystyrene type structure, the radically polymerizable macromolecular compounds ($b_4$) which are usable herein include the compounds represented by the following formula:

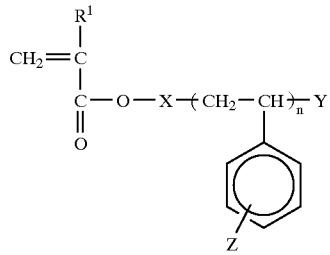

(wherein $R_1$ is a hydrogen atom or a methyl group, X is an arbitrary coupling chain, Y is the terminal of an initiating agent or a hydrogen atom, a halogen-substituted group, or an alkyl group of 1–8 carbon atoms, and n is an integer of 0–500).

The "coupling chain X" appearing in the group of formulas shown above is explained in detail in the "Chemistry and Industry of Macromonomers" (compiled under supervision of Yuya Yamashita and published by IPC K.K. on Sep. 20, 1988). All of the concrete examples shown in the publication are invariably usable herein.

The method to be used for obtaining the polymer may be any of the known methods of polymerization. For example, the methods of bulk polymerization, suspension polymerization, emulsion polymerization, and solution polymerization may be cited. Among other methods of polymerization mentioned above, the method of solution polymerization by the use of a radical catalyst proves particularly advantageous.

The radical catalyst may be any of the various radical catalysts which are generally used for the polymerization of vinyl monomers. As typical examples of the radical catalysts, azo type compounds such as 2,2'-azobis-isobutyronitrile and 2,2'-azobis(2,4-dimethyl valeronitrile) and peroxide type compounds such as benzolyl peroxide, di-tert-butyl peroxide, tert-butyl peroctoate, and tert-butyl peroxy-2-ethylhexanoate may be cited. The radical catalyst is generally used in an amount in the range of 0.2–10 parts by weight, preferably 0.5–5 parts by weight, based on 100 parts by weight of the monomer. The solvent for the polymerization is suitably selected, depending on the kind of monomer and the kind of radical polymerizable macromolecular compound to be used.

After the polymerization is completed, the solution of the reactive group-containing polymer obtained consequently can be used in its unmodified form for the reaction with carbon black. This solution can be distilled to isolate the polymer and expel the solvent and the polymer in a refined form can be put to use.

As another means which can be used for obtaining the graft-copolymer, the method which comprises causing a compound containing a reactive group for carbon black to react with a precursory polymer containing in a segment (A) a group capable of reacting with the compound and having a segment (B) grafted to the segment (A), thereby introducing the reactive group into the precursory polymer may be cited.

As concrete examples of the compound mentioned above, compounds containing in the molecular unit thereof two or more pieces of one species of the reactive groups for carbon black mentioned above, compounds containing in the molecular unit thereof two or more species of the reactive groups for carbon black mentioned above, and compounds containing in the molecular unit thereof at least one species of the reactive groups for carbon black and a functional group (or groups) other than the reactive groups mentioned above may be cited.

Incidentally, the "functional group" just mentioned refers to groups other than epoxy group, thioepoxy group, aziridine group, and oxazoline group and oxazoline group, and capable of reacting with the above mentioned group which is qualified as "capable of reacting with the compound" and had by the precursory polymer. As concrete examples of the group "capable of reacting with the compound" and had by the precursory polymer, isocyanate group, amino group, carboxyl group, hydroxyl group, and vinyl group may be cited.

As means for obtaining the block polymer, the anion living polymerization method, the cation living polymerization method, the iniferter method, etc. have been known. As another means, the method which comprises radically polymerizing the monomer of the segment (A) or the segment (B) (this invention prefers the segment (B) to the segment (A) because the segment (A) introduces the reactive group) in the presence of a compound such as 2-acetyl thioethyl thiol or 10-acetyl thiodecane thiol which contains a thioester and a thiol group in the molecular unit thereof, treating the produced polymer with an alkali such as sodium hydroxide or ammonia, thereby forming a polymer containing a thiol group at one terminal thereof, and radically polymerizing the monomer of the other segment in the presence of the thiol group terminal polymer is known.

For the purpose of obtaining the block copolymer according to this invention, it suffices to alter suitably the known method mentioned above, namely to use as the polymerizable monomer of the segment (A) a polymerizable monomer (a) containing the reactive group mentioned above in at least part thereof and introduce the reactive group into the segment (A) during the polymerization of the block copolymer or introduce the reactive group into the segment (A) after the polymerization of the block copolymer in the same manner as in the production of the graft copolymer mentioned above.

To cite an example for the sake of comprehension, the synthesis by the anion living method is carried out by adding styrene in a stream of nitrogen into tetrahydrofuran with the aid of 4-vinyl benzyl lithium, polymerizing the monomer, then polymerizing methyl methacrylate at a low temperature thereby obtaining an A-B block (styrene-methyl methacrylate) copolymer, and thereafter converting the vinyl group at the initiating terminal of the segment (A) into an epoxide group by the use of 3-chloro-perbenzoic acid thereby introducing the reactive group capable of reacting with carbon black into the segment (A). Another method may be adopted which comprises adding styrene in a stream of nitrogen into tetrahydrofuran with the aid of 4-vinyl benzyl lithium, polymerizing the monomer thereby obtaining the segment (A), then adding glycidyl methacrylate to the reaction system thereby coupling a segment having the reactive group with the segment (A), and thereafter polymerizing methyl methacrylate at a low temperature.

The molecular weight of the graft- or block-copolymer obtained as described above is not particularly limited. In consideration of the effect of grafting to carbon black and the workability of the polymer during the reaction thereof with carbon black, the polymer appropriately has an average molecular weight in the range of 1000–1000000, preferably in the range of 5000–100000.

The molecular weights of the segment (A) and the segment (B) in the graft- or block-copolymer are not particularly limited but are affected by the kinds of polymer chains forming these segments. From the standpoint of the efficiency of grafting to carbon black, the segment (A) appropriately has an average molecular weight in the range of 300–100000, preferably in the range of 5000–50000. From the standpoint of effecting the impartation of improved dispersibility to carbon black, the segment (B) appropriately has an average molecular weight in the range of 500–100000, preferably in the range of 1000–50000. Though the number of reactive groups had by the graft- or block-copolymer is not particularly limited, it appropriately falls in the approximate range of 50–1, preferably 20–1, on the average per molecule of the polymer.

1.6 Unsaturated double bond-containing block- or graft-copolymer

As the polymer having reactive group(s) capable of reacting with the functional group(s) on the surface of carbon black and having unsaturated double bond(s) and used to be grafted to carbon black as described above, it is appropriate to use a block- or graft-copolymer which has a segment (A) containing the reactive group(s) capable of reacting with the functional group(s) on the surface of carbon black and a segment (B) containing the unsaturated double bond(s).

The carbon black graft polymer according to this invention is only required to assume ultimately the form of a block- or graft-copolymer with such a necessary structure as mentioned above (providing that the reactive group of the segment (A) has reacted with the functional group on the surface of carbon black and formed a coupled group) and does not need to assume the form of the polymer with the necessary structure mentioned above at the step of grafting the polymer moiety to carbon black. To be specific, the carbon black graft polymer according to this invention can be produced not merely by the method (1) which comprises first forming a block- or graft-copolymer which has a segment (A) containing reactive group(s) capable of reacting with the functional group(s) on the surface of carbon black and a segment (B) containing unsaturated double bond(s), and then grafting this polymer to carbon black, but equally by the method (2) which comprises grafting to carbon black a precursory block- or graft-copolymer which has a segment (A) containing reactive group(s) capable of reacting with the functional group(s) on the surface of carbon black and a segment (B) containing no unsaturated double bond, and then introducing an unsaturated double bond(s) into the segment (B). Depending on the kind of the reactive group had by the segment (A), the reaction of the reactive group with the functional group on the surface of carbon black possibly needs the conditions of a relatively high temperature and a long time. If the segment (B) has the unsaturated double bond(s) in this case, the possibility of the unsaturated double bond(s) had by the segment (B) ceases to exist during the course of the grafting will be high. In this case, therefore, it is particularly advantageous to adopt the latter method (2).

To facilitate the comprehension of the present invention, the following description will be made as centered principally on the former method (1), namely the method which comprises grafting to carbon black the block- or graft-copolymer with a necessary structure having an unsaturated double bond already introduced in the segment (B). It ought to be understood that the method (1) and the method (2) are substantially equal excepting the step of grafting and the step of introduction of the unsaturated double bond(s) occur in a mutually different sequence.

The block- or graft-copolymer comes in various types as described in Section 1.5 above. FIGS. 3(a)–(f) illustrate typical structures of the block- or graft-copolymer according to the present embodiment of this invention. In the diagrams, each X's represent a reactive group and each Y's an unsaturated double bond.

In the block or graft polymer, the reactive group contained in the segment (A) and the method for selecting or combining the segment (A) and the segment (B) are the same as those described in Section 1.5 above and will be omitted from the following description.

In the block or graft polymer in this embodiment, however, the segment (B) must contain an unsaturated double bond in part thereof. Though this unsaturated double bond is allowed to occur in the main chain of the segment (B), it preferably occurs in a side chain coupled to the main chain of the segment (B) from the standpoint of facilitating the synthesis of the block- or graft-copolymer according to this invention.

The method for obtaining the block- or graft-copolymer which has a segment (A) containing a reactive group and a segment (B) containing an unsaturated double bond is basically the same as the method described in Section 1.5 above. The points common thereto will be omitted from the following description.

The production of the graft copolymer according to this embodiment is started, as described in Section 1.5 above, by polymerizing a polymerizable monomer (a) containing in the molecular unit thereof a reactive group for carbon black and a polymerizable monomer (c) destined to form the skeleton of a segment (A) and incorporated when necessary in the presence of a radically polymerizable macromolecular compound (b) as a component for forming the main chain of a segment (B) thereby obtaining a graft copolymer as a precursor formed of the segment (A) containing a reactive group for carbon black and the main skeletal part of the segment (B).

Then, a side chain or an extended chain having an unsaturated double bond into the segment (B) by causing to react with the precursor a compound (d) which has in the molecular unit thereof a reactive group for an active site provided in the main skeletal part of the segment (B) and has the unsaturated double bond.

Incidentally, the radically polymerizable macromolecular compound (b) as a component for forming the main chain of the segment (B) is required to have the molecular formulation thereof so designed as to have the active site (functional group) for introducing afterward the side chain or extended chain containing the unsaturated double bond.

The active site (functional group) to be provided in the main skeletal part of the segment (B) in the precursory polymer mentioned above is only required to have lower activity for the reactive group had by the segment (A) than the functional group on the surface of carbon black and is not particularly limited in any other respect. The active site may be any of various kinds of known active sites. More specifically, in the embodiment, where as the reactive group of the segment (A) such epoxy group, thioepoxy group, aziridine group, or oxazoline group as described above is used, and where the grafting is effected through the reaction between the carboxyl group present on the surface of carbon black and the reactive group of the segment (A), the functional group had by the segment (B) is only required to be other than carboxyl group. As concrete examples of the group answering the description, alcoholic or phenolic hydroxyl group, amino group, imino group, thiol group, silanol group, and isocyanate group may be cited. Among other groups mentioned above, alcoholic or phenolic hydroxyl group proves to be particularly advantageous. These functional groups are not specifically designated by some of the structural formulas cited as appropriate in the foregoing description on the radically polymerizable macromolecular compound. It ought to be understood, however, that the graft copolymer is easily obtained in a necessary structure by ensuring that the monomer used for the polymerization of the radically polymerizable macromolecular compound contains such a functional group in part thereof.

The compound (d) which contains a reactive group for the functional group had by the segment (B) and an unsaturated double bond in the molecular unit thereof is not particularly specified. Nevertheless, it is preferably a compound manifesting difference in reactivity between the opposite terminals thereof (heterofunctional compound), i.e. having an unsaturated double bond at one terminal and a reactive group showing reactivity to the active site (functional group) in the segment (B) at the other terminal. Incidentally, the polymerizable monomer (a) mentioned above is similarly a heterofunctional compound. This compound (d) is at least required to have a reactive group different from the active group of the polymerizable monomer (a) mentioned above.

The reactive group had by this compound (d) is only required to manifest reactivity to the active site (functional group) in the segment (B) and is not particularly limited in any other respect. Preferably, however, it is an isocyanate group. The reason for the preferability of the isocyanate group is that when the compound having the isocyanate group as the reactive group is used, an alcoholic or phenolic hydroxyl group, an amino group, an imino group, or a silanol group can be used as the functional group of the segment (B), and that when proper conditions are selected, the isocyanate group can be easily bound through a reaction to the functional group of the segment (B) and the unsaturated double bond had by the compound (d) can be introduced into the segment (B) without inducing the reaction between the functional group in the segment (B) and the reactive group such as an epoxy group, a thioepoxy group, an aziridine group, or an oxazoline group which has been introduced into the segment (A) or the reaction between the isocyanate group and the reactive group introduced into the segment (A). Particularly the fact that the functional group of the segment (B) is an alcoholic or phenolic hydroxyl group proves favorable because this functional group induces a nucleophilic reaction with the isocyanate group and forms a urethane bond.

As concrete examples of the isocyanate group-containing unsaturated compound (d₁) which is a particularly appropriate compound (d), and which having an isocyanate group as the reactive group at one terminal and an unsaturated double bond at the other terminal, partial reaction products between polyisocyanate compounds and hydroxyl group-containing (meth)acrylates such as (meth)acryloyl isocyanates, isocyanate alkyl (meth)acrylates, and hydroxyalkyl (meth)acrylates, and isocyanate group terminated urethane prepolymers obtained by causing polyols containing (meth)acryl residues to react with polyisocyanate compounds may be cited. In these isocyanate group-containing unsaturated compounds mentioned above, (meth)acryloyl isocyanates and isocyanate alkyl (meth)acrylates which have the following structural formula prove particularly appropriate:

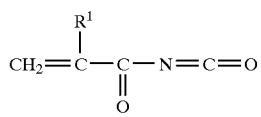

(wherein R¹ represents a hydrogen atom or a methyl group);

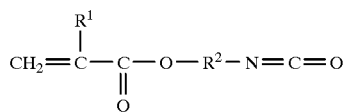

(wherein R¹ represents a hydrogen atom or a methyl group and R² represents an alkylene group of 1–10 carbon atoms); and

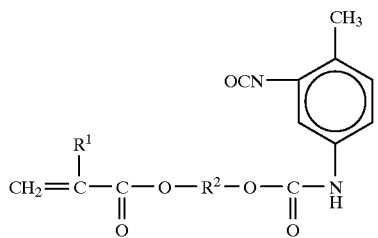

(wherein R¹ represents a hydrogen atom or a methyl group and R² represents an alkylene group of 1–10 carbon atoms).

When such an isocyanate group-containing unsaturated compound (d₁) as mentioned above is used as the compound (d) and caused to react with a precursory polymer containing an alcoholic or phenolic hydroxyl group as the functional group in the segment (B) to introduce an unsaturated double bond into the segment (B) of the precursory polymer, the amount of the compound (d) to be added must be adjusted so that the proportion of the isocyanate group to the hydroxyl group had by the segment (B) of the precursory polymer may fall in the range of 0.01–1 equivalent weight, preferably 0.3–1.0 equivalent weight, based on 1 equivalent weight of the hydroxyl group. If the amount of the isocyanate group is less than 0.01 equivalent weight, based on 1 equivalent weight of the hydroxyl group, the unsaturated double bond will not be introduced in an effective amount in the segment (B). Conversely, if the amount of the isocyanate group exceeds 1 equivalent weight, based on 1 equivalent weight of the hydroxyl group, the isocyanate group will further react with the produced urethane bond and consequently form an allophanate bond and prevent the formation of an expected structure and the unaltered isocyanate group-containing unsaturated compound will remain as an unwanted residue. The reaction conditions in the ranges of 20–100° C. and 1–5 hours are appropriate. If the temperature is unduly high, for example, the reaction will be at a disadvantage in suffering the unsaturated double bond of the isocyanate group-containing unsaturated compound to succumb to a polymerization reaction and give rise to gel and also suffering the isocyanate group to react with the epoxy group had by the segment (A) of the precursory polymer. It is allowable during the reaction to use a polymerization inhibitor for the purpose of repressing the polymerization reaction mentioned above. It is also allowable to use a catalyst in the reaction on the condition that the catalyst should avoid exerting any adverse effect on the physical properties of the product of the subsequent reaction. When the grafting reaction proceeds at a high temperature for a long time and consequently poses a problem, the urethanation catalyst in popular use may be adopted to preclude the problem.

As another means for obtaining the graft polymer according to the present embodiment in nearly the same manner as described in Section 1.5 above, the method which comprises causing a compound (e) having a reactive group for carbon black, for example, to react with a first precursory polymer having a group capable of reacting with the compound in a segment (A) and having a segment (B) grafted to the segment (A) thereby introducing the reactive group into the first precursory polymer and giving rise to such an ultimate precursor (the graft type precursory polymer consisting of the segment (A) having the reactive group for carbon black and the main skeletal part of the segment (B)) as mentioned above, and thereafter introducing a side chain or an extended chain having an unsaturated double bond to the segment (B) in the same manner as above may be cited.

As concrete examples of the compound (e), compounds containing in the molecular unit thereof two or more pieces of one species of the aforementioned reactive groups for carbon black, compounds containing in the molecular unit thereof two or more species of the aforementioned reactive groups for carbon black, and compounds containing in the molecular unit thereof one or more species of the aforementioned reactive groups for carbon black and a functional group (or groups) other than the aforementioned reaction groups may be cited.

The functional group mentioned above is other than epoxy group, thioepoxy group, aziridine group, and oxazoline group and is capable of reacting with the aforementioned group "capable of reacting with the compound" had by the segment (A) of the first precursory polymer mentioned above. As concrete examples of the group "capable of reacting with the compound" had by the segment (A) of the first precursory polymer, isocyanate group, amino group, carboxyl group, hydroxyl group, and vinyl group may be cited. This group is required to be different in kind from the aforementioned functional group had by the segment (B).

Incidentally, for the sake of the first precursory polymer mentioned above, it is permissible to introduce the unsaturated double bond into the segment (B) and then introduce into the segment (A) the reactive group for carbon black.

As a means for obtaining the block type polymer according to this invention, the known method described in Section 1.5 above may be adopted as suitably altered. Further, for the introduction of the unsaturated double bond into the segment (B) in the case of the block copolymer, the same method as in the case of the graft copolymer described above can be used.

The molecular weight of the graft or block polymer thus obtained, the molecular weights of the segment (A) and the segment (B), and the number of reactive groups had by the segment (A) are not particularly limited as pointed out in Section 1.5 above. Appropriately, they fall in the same ranges as specified in Section 1.5 above.

Though the number of unsaturated double bonds had by the segment (B) is not particularly limited, it appropriately falls in the approximate range of 20–1, preferably 10–1, on the average per molecule of the polymer. The number of double bonds itself per molecule of the polymer is suitably decided, depending on the relations (such as, for example, sensitivity and reflection properties) with the medium such as the curing composition in which the carbon black graft polymer is to be incorporated. In the case of a black photo-curable composition which will be specifically described herein below, when the amount of the photo-curable monomer to be added is required to be decreased, the sensitivity can be prevented from falling by increasing the number of double bonds had by the carbon black graft polymer.

1.7 Hydroxyl group-containing block- or graft-copolymer

As the polymer which has reactive group(s) capable of reacting with the functional group(s) on the surface of carbon black and has hydroxyl group(s) and which is used for the production of carbon black graft polymer having a graft chain containing carboxyl group(s) as described above, a block- or graft-copolymer having a segment (A) containing the reactive group(s) capable of reacting with the functional group(s) on the surface of carbon black and a segment (B) having a skeletal structure different from the segment (A) is appropriately used. In the block- or graft-copolymer mentioned above, the hydroxyl group(s) may be present in either of the segments. Appropriately it occurs at least in the segment (B).

The block- or graft-copolymer comes in various kinds as described in Section 1.5 above. FIGS. 4(a)–(f) illustrate examples of the structure of varying block- or graft-copolymer according to the present embodiment. In the diagrams, each X's represent a reactive group and each OH's represent a hydroxyl group.

The method for obtaining the aforementioned block- or graft-copolymer which has a segment (A) containing the reactive group(s) and a segment (B) having a skeletal structure different from the segment (A) and, at the same time, has hydroxyl group(s) is basically the same as described in Section 1.5 above. The points common to these two methods will be omitted from the following description.

The reactive group contained in the segment (A) and the method for selection or combination of the skeletal structures of the segment (A) and the segment (B) in the block- or graft-copolymer of the present embodiment are nearly the same as those described in Section 1.5 above and, therefore, will be omitted from the following description. In the case of the present embodiment, even when the main chain structures of the segment (A) and the segment (B) are substantially equal, in respect to the degrees of affinity for the target media or for carbon black the two segments can be differentiated amply by adjusting the number of hydroxyl groups contained in the segment (B) (when necessary, in the segment (A) as well).

The graft copolymer according to the present embodiment is obtained, for example, by polymerizing a polymerizable monomer (a) containing in the molecular unit thereof a reactive group for carbon black and, when necessary, additionally a polymerizable monomer (c) destined to form the skeleton of a segment (A), in the presence of a radically polymerizable macromolecular compound (b) as a component for forming the main chain of a segment (B) as described in Section 1.5 above.

The radically polymerizable macromolecular compound (b) intended to form the segment (B) component is only required to have the structure which has a reactive group at one terminal of a pertinent polymer chain having hydroxyl group(s) such as, for example, the polymer chain of a poly(meth)acrylic hydroxy-alkyl ester type structure or a (meth)acrylic alkyl ester-(meth)acrylic hydroxyalkyl ester copolymer type structure.

When the segment (B) has the (meth)acrylic alkyl ester-(meth)acrylic hydroxyalkyl ester copolymer type structure, for example, the compounds represented by the following formula are advantageously used as the radically polymerizable macromolecular compound (b):

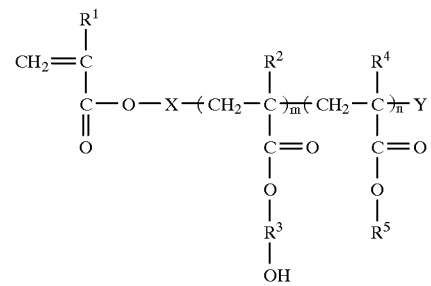

(wherein $R_1$ and $R_2$ are identical or different and each is a hydrogen atom or a methyl group, $R_3$ is an alkylene group of 1–25 carbon atoms, $R_4$ is an alkyl group of 1–25 carbon atoms, X is an arbitrary coupling chain, Y is the terminal of an initiating agent or a hydrogen atom, and n and m are identical or different and each is an integer of 0–500).

The polymerizable monomer (a) containing in the molecular unit thereof reactive group(s) for carbon black is any of the same compounds as enumerated in Section 1.5 and the polymerizable monomer (c) optionally used for enabling the segment (A) to assume such a necessary skeleton as mentioned above is any of practically the same compounds as enumerated in Section 1.5. For the purpose of introducing hydroxyl group(s) into the segment (A), a monomer selected from the group consisting of acrylic or methacrylic acid hydroxyalkyl ester type monomers such as, for example, hydroxymethyl acrylate, hydroxyethyl acrylate, hydroxypropyl acrylate, hydroxy-2-ethylhexyl acrylate, hydroxymethyl methacrylate, hydroxyethyl methacrylate, hydroxypropyl methacrylate, and hydroxy-2-ethylhexyl methacrylate; hydroxyacrylamide, and hydroxymethacrylamide can be used as suitably combined with a varying polymerizable monomer cited in Section 1.5 above.

For the purpose of obtaining the polymer according to the present embodiment, the other method for obtaining the graft copolymer or the method for obtaining the block type polymer which is described in Section 1.5 above can be similarly adopted.

The molecular weight of the graft or block type polymer thus obtained, the molecular weights of the segment (A) and the segment (B), and the number of reactive groups had by the segment (A) are not particularly limited as pointed out in Section 1.5 above. Appropriately they fall in the same ranges as mentioned above.

The number of hydroxyl groups is appropriately decided in accordance with the acid number of the polymer in the carbon black graft polymer obtained by the treatment with an acid anhydride. Though this acid number varies with the acid number of the alkali-soluble binder which is incorporated in the carbon black graft polymer, it is appropriately not less than 10, preferably not less than 50, and most preferably not less than 100. If this acid number is less than 10, the polymer will be unable to contribute to the alkali-developing property.

1.8 Production of unsaturated double bond-containing carbon black graft polymer

The carbon black graft polymer according to the first aspect of this invention is obtained by causing the polymer as described in Section 1.3 above, and which has the reactive group(s) capable of reacting with the functional group(s) on the surface of carbon black and has the ethylenically unsaturated double bond(s), to be heated and mixed with the carbon black. It is destined, therefore, to contain the ethylenically unsaturated double bond(s) in the grafted polymer.

Appropriately the mixing under heating treatment is carried out at a temperature in the range of 50–250° C., preferably 100–200° C., for a period in the range of 0.5–10 hours, preferably 2–5 hours with stirring. If the reaction temperature is less than 50° C., the grafting will possibly fail to proceed. Conversely, if this temperature exceeds 250° C., the polymer component will possibly be degraded.

This mixing under heating treatment can be carried out in a suitable solvent.

The mixing ratio of carbon black and the polymer mentioned above for the purpose of the grafting cannot be generally defined because it is affected by the kind of the polymer to be used and the use to which the product is put. Appropriately, the amount of the polymer is in the approximate range of 1–1000 parts by weight, preferably 2–500 parts by weight, based on 100 parts by weight of the carbon black. If the amount of the polymer is less than 1 part by weight, it will possibly become difficult to improve sufficiently the surface properties of carbon black. Conversely, if the amount exceeds 1000 parts by weight, the amount of the polymer bound to carbon black will be so large as to impair the economy of the production and will possibly degrade the properties properly expected of carbon black.

1.9 Production of carboxyl group-containing carbon black graft polymer

The carbon black graft polymer according to the second aspect of this invention is obtained by causing the polymer as described in Section 1.4 above, and which contains the reactive group(s) capable of reacting with the functional group(s) on the surface of carbon black and contains the hydroxyl group(s), to be heated and mixed with the carbon black and then treating the resultant reaction mixture with an acid anhydride. It is characterized by containing carboxyl group(s) in the graft chain.

The mixing under heating treatment is appropriately carried out at a temperature in the range of 40–300° C., preferably 70–250° C., for a period in the range of 0.5–10 hours, preferably 2–5 hours with stirring. If the reaction temperature is less than 40° C., the grafting will possibly fail to proceed sufficiently. Conversely, if the temperature exceeds 300° C., the polymer component will possibly be degenerated. When the reacting polymer containing the hydroxyl group(s) additionally contains such ethylenically unsaturated double bond(s) as mentioned above, for example, when the reacting polymer is the unsaturated epoxy ester resin as described in detail in Section 1.3 and Section 1.4, the mixing under heating treatment is properly carried out at a temperature in the range of 50–250° C., preferably in a more limited range of 100–200° C.

The mixing ratio of carbon black and the polymer mentioned above for the purpose of the grafting is appropriately in the approximate range of 1–1000 parts by weight, preferably 2–500 parts by weight, based on 100 parts by weight of carbon black as described in Section 1.8 above.

This mixing under heating treatment may be properly carried out in a suitable solvent.

After the polymer containing the reactive group(s) capable of reacting with the functional group(s) on the surface of carbon black and containing the hydroxyl group(s) is grafted to carbon black, the produced carbon black graft polymer is treated with the acid anhydride. The result is that the hydroxyl group(s) mentioned above in the grafted polymer chain is half-esterified with the acid anhydride to effect introduction of carboxyl group(s) in the polymer chain.

As concrete examples of the acid anhydride, dibasic acid anhydrides such as phthalic anhydride, succinic anhydride, maleic anhydride, tetrahydrophthalic anhydride, hexahydrophthalic anhydride, methyl tetrahydrophthalic anhydride, 3,6-endomethylene tetrahydrophthalic anhydride, methyl endomethylene tetrahydro-phthalic anhydride, tetrabromophthalic anhydride, and trimellitic acid and tetrabasic dianhydrides such as aliphatic or aromatic tetracarboxylic dianhydrides may be cited. These acid anhydrides may be used either singly or in the form of two or more members.

The amount of the acid anhydride to be used is appropriate in the range of 0.1–1.1 chemical equivalent weights per 1 equivalent weight of the hydroxyl group in the polymer grafted to carbon black. The reaction can be carried out at a temperature in the range of 50–130° C. in the presence or absence of a diluting agent in the presence or absence of a polymerization inhibitor such as hydroquinone or oxygen. For the reaction of half-esterification of the hydroxyl group and the acid anhydride, any of the catalysts described in ordinary literature such as, for example, Lecture 14 of New Experimental Chemistry, titled "Synthesis and Reaction of Organic Compounds (II)," page 1014, published by Maruzen K. K. on Dec. 20, 1977. The catalysts include acidic catalysts, basic catalysts, and inorganic metal salts, for example. As acid catalysts, sulfuric acid, p-toluene sulfonic acid, and combinations thereof may be cited. As basic catalysts, tertiary amines including triethyl amine, triethylene diamine, N-pentamethylethylene triamine, N,N-dimethyl benzyl amide, N,N-dimethyl lauryl amine, N,N,N',N'-tetramethyl propylene diamine, N-methyl morpholine, N-ethyl morpholine, N,N'-methyl piperazine, pyridine, 4-dimethylamino pyridine, 4-pyrrolidinopyridine, and 1,8-diazobicyclo-[5,4,0]-7-undecene (DBU), and combinations thereof may be cited. As concrete examples of the inorganic metal salt, chlorides of such metals as lithium, zirconium, potassium, sodium, tin, zinc, and lead, sodium acetate, and combinations thereof may be cited.

As another means for stably grafting the polymer chain containing carboxyl group(s) to carbon black, the method which comprises causing a polymer containing reactive group(s) capable of reacting with the reactive functional group(s) on the surface of carbon black and carboxyl group(s) as protected with so-called protective group(s) to be grafted through a reaction to carbon black and then depriving the produced carbon black graft polymer of the protective group(s) thereby giving rise to the carboxyl group(s) is conceivable. The protective group for the carboxyl group is known in various kinds. A tetrahydropyranyl group, for example, may be used as demonstrated in a working example which will be specifically described herein below.

1.10 Production of block- or graft-copolymer graft carbon black (Part 1)

Now, the method for the production of carbon black graft polymer according to the third embodiment of this invention will be described below. The grafting of the graft- or block-copolymer to carbon black such as is described in Section 1.5 can be effected by the method which is described in Section 1.8 above. For the purpose of obtaining this grafting with satisfying efficiency, it is proper to design the molecular formulation of the copolymer so that the segment (A) containing the reactive group(s) may manifest lower affinity for the target medium than the other segment (B) as described in Section 1.5 above, then to heat and mix the copolymer with the carbon black in the presence of a liquid dispersion medium formed of either the target medium mentioned above or a medium having characteristic resembling those of the medium, wherein the target medium being to be used for dispersing the ultimately obtained carbon black graft polymer. This liquid dispersion medium manifests high affinity or compatibility for the segment (B) of the polymer and low affinity or compatibility for the segment (A).

The liquid dispersion medium to be used, therefore, is suitably selected, depending on the combination of the segment (A) and the segment (B) in the polymer.

When the segment (A) has a polystyrene type structure and the segment (B) has a polysiloxane structure in the polymer, for example, the liquid dispersion media which are used advantageously include silicone oils such as polydimethyl siloxane, partially octyl-substituted polydimethyl siloxane, partially phenyl-substituted polydimethyl siloxane, and fluorosilicone oil, for example.

When the segment (A) has a polystyrene type structure and the segment (B) has a hydrophobic (meth)acryl type structure such as polymethyl methacrylate in the polymer, for example, the liquid dispersion media which are advantageously used herein include cellosolves such as methyl cellosolve and ethyl cellosolve; esters such as methyl acetate, ethyl acetate, and butyl acetate; ketones such as acetone, methylethyl ketone, and methylisobutyl ketone; and nonprotonic polar solvents such as pyrrolidone, N,N-dimethyl formamide, and dimethyl sulfoxide, for example.

When the segment (A) has a polystyrene type structure and the segment (B) has a hydrophilic (meth)acryl type structure such as methyl methacrylate-hydroxymethyl methacrylate copolymer in the polymer, for example, the liquid dispersion media which are advantageously used herein include water, water-alcohol mixture, alcohols such as methyl alcohol and ethyl alcohol; esters such as methyl cellosolve, ethyl cellosolve, and butyl cellosolve; ketones such as acetone; pyrrolidone, N,N-dimethyl formamide, and dimethyl sulfoxide, for example.

When the segment (A) has a polystyrene type structure and the segment (B) has a polyalkylene glycol type structure in the polymer, for example, the liquid dispersion media which are advantageously used herein include water, water-alcohol mixture, alcohols such as methyl alcohol and ethyl alcohol; glycols such as ethylene glycol and diethylene glycol; and polyhydric alcohols such as glycerin, for example.

During the course of the grafting of the polymer to carbon black carried out in the presence of such liquid dispersion medium as mentioned above, other substances such as a polymer other than the polymer mentioned above and a polymerizable monomer may be present in the reaction system.

This grafting is effected, for example, by stirring and mixing the polymer and the carbon black at a temperature in the range of 40–300° C., preferably 70–250° C., for a period in the range of 0.5–10 hours, preferably 2–5 hours. If the reaction temperature is less than 40° C., the grafting will possible fail to proceed. If the temperature exceeds 300° C., the polymer component will possibly be degenerated.

As respects the procedure of the reaction, it suffices to place carbon black, the polymer, and the liquid dispersion medium mentioned above in a reaction apparatus and then mix and heat them together in the apparatus.

The ratio of the carbon black to the polymer mentioned above in this grafting cannot be generally specified because it is varied by the kind of the polymer to be used and the use for which the product aimed at is applied. Properly, it is 100 parts by weight of carbon black to 1–1000 parts by weight, preferably 2–500 parts by weight, of the polymer. If the amount of the polymer is less than 1 part by weight, it will be possibly difficult to improve thoroughly the surface properties of the carbon black. Conversely, if it exceeds 1000 parts by weight, the amount of the polymer bound to the carbon black will be possibly so large as to render uneconomical the production of carbon black graft polymer and impair the inherent characteristics of carbon black as well.

The carbon black graft polymer thus obtained exhibits excellent dispersibility in various substances such as, for example, organic macromolecular compounds, water, and organic solvents and generally gains in electric insulation and, owing to the incorporation of the segment (B) of the polymer, acquires numerous properties. When the segment (B) of the polymer is a chain of the polysiloxane type structure, for example, it imparts excellence in water repellency, mold release, heat resistance, flexibility, and low viscosity and freedom from embrittlement at low temperatures. When the segment (B) is a (meth)acryl type chain, it imparts a particular variousness in hydrophilicity or hydrophobicity, with using the various (meth)acrylic ester monomer. When the segment (B) is a polyalkylene glycol chain, it imparts such properties as hydrophilicity, lubricity, flexibility, and antioxidant property.

1.11 Production of block- or graft-copolymer graft carbon black (Part 2)

The graft- or block-copolymer can be also grafted to carbon black with high efficiency, when the molecular formulation of the copolymer is designed so that the segment (A) having the reactive group(s) capable of reacting the functional group on the surface of carbon black may acquire higher affinity for carbon black than the segment (B) manifesting high affinity for the target medium as described in Section 1.5 above. This method basically nearly equals to the method of production described in detail in Section 1.10 above.

In this case, since the segment (A) of this polymer is oriented toward the carbon black side in the grafting system in the presence of a relatively optional dispersion medium (other than the liquid dispersion medium exhibiting extremely high affinity for the segment (A)) or even in the absence of the dispersion medium, the reactive group present in the segment (A) is effectively grafted by virtue of the surface of carbon black and a carbon black graft polymer having the same excellent properties is obtained in the same manner as the method described in Section 1.10 above.

In this method of production, the grafting of the polymer to carbon black is effected by stirring and mixing or melting and kneading these components in the presence of an arbitrary liquid dispersion medium or in the absence of this liquid dispersion medium, unless the dispersion medium manifests extremely high affinity for the segment (A) of the polymer.

The liquid dispersion medium which can be used in this grafting depends on the structure of the segment (A) of the relevant polymer. As concrete examples of the liquid dispersion medium effectively usable herein, water; alcohols such as methyl alcohol, ethyl alcohol, isopropyl alcohol, and butyl alcohol; hydrocarbons such as liquid paraffin, decane, decene, methyl naphthalene, decalin, kerosine, diphenyl methane, toluene, dimethyl benzene, ethyl benzene, diethyl benzene, propyl benzene, cyclohexane, and partially hydrogenated triphenyl; silicone oils such as polydimethyl siloxane, partially octyl-substituted polydimethyl siloxane, partially phenyl-substituted polydimethyl siloxane, and fluorosilicone oil; halogenated hydrocarbons such as chlorobenzene, dichlorobenzene, bromobenzene, chlorobiphenyl, and chlorodiphenyl methane; fluorides such as Daifloil (produced by Daikin Kogyo Co., Ltd.) and Demnum (produced by Daikin Kogyo Co., Ltd.); and esters such as ethyl benzoate, octyl benzoate, dioctyl phthalate, trioctyl trimellitate, dibutyl sebacate, ethyl (meth)acrylate, butyl (meth)acrylate, and dodecyl (meth)acrylate may be cited.

The other conditions for the grafting treatment are the same as those for the method described in Section 1.10 above and the properties of the produced carbon black graft polymer are the same as those of the product of the method.

1.12 Production of block- or graft-copolymer graft carbon black containing unsaturated double bond (Part 1)

Now, the method for the production of carbon black graft polymer according to the fourth aspect of this invention will be described below.

The grafting to carbon black of the graft- or block-copolymer having the segment (A) containing the reactive group(s) capable of reacting with the functional group(s) on the surface of carbon black and the segment (B) containing the ethylenically unsaturated double bond(s) described in Section 1.6 is properly carried out in the same manner as described in Section 1.10, in the presence of a liquid dispersion medium formed of either the target medium or a medium having characteristic resembling those of the medium, wherein the target medium being to be used for dispersing the ultimately obtained carbon black graft polymer. While many conditions such as for the liquid dispersion medium to be used are the same as those described in Section 1.10 above, the heating temperature and the mixing time are invariably lower and shorter than those in Section 1.10 above. Specifically, the grafting is carried out by stirring and mixing the components at a temperature in the range of 50–150° C., preferably 70–140° C., for a period in the range of 0.5–10 hours, preferably 1–5 hours. If the reaction temperature is less than 50° C., the grafting will possibly fail to proceed. If it exceeds 150° C., the unsaturated double bond had(s) by the segment (B) will possibly cease to exist. Incidentally, in the method of the first embodiment, it is advantageous to use as the reactive group(s) had by the segment (A) such a group as oxazoline group or aziridine group which reacts with the surface functional group of carbon black even under the condition of a relatively low temperature because the possibility of the unsaturated double bond ceasing to exist during the grafting treatment dwindles.

When the molecular formulation of the polymer it so designed that the segment (A) containing the reactive group (s) capable of reacting with the functional group on the surface of carbon black may have higher affinity for carbon black than the segment (B) manifesting high affinity for the target medium, the grafting of the polymer to carbon black is advantageously effected, as described in Section 1.11 above, by stirring and mixing or melting and kneading the components in the presence of an arbitrary liquid dispersion medium or in the absence of the liquid dispersion medium, unless the dispersion medium manifests extremely high affinity for the segment (A) of the polymer. The grafting in this second embodiment is carried out by stirring and mixing the components under the same conditions of heating temperature and mixing time as mentioned above, i.e. at a temperature in the range of 50–150°, preferably 70–140° C., for a period in the range of 0.5–10 hours, preferably 1–5 hours.

1.13 Production of block- or graft-copolymer graft carbon black containing unsaturated double bond (Part 2)

Further, a method for production according to the third embodiment for grafting to carbon black the graft- or block-copolymer having the segment (A) containing the reactive group(s) capable of reacting the functional group(s) on the surface of carbon black and the segment (B) containing the ethylenically unsaturated double bond(s) will be described below.

The method of production according to the third embodiment is basically nearly equal to the method of production according to the first embodiment described in Section 1.12 above, excepting the step of grafting the polymer portion to carbon black and the step of introducing the unsaturated double bond(s) into the segment (B) of the polymer are reversed in the order of occurrence. Specifically, the method of production according to the third embodiment comprises obtaining a block or graft type precursory polymer formed of a segment (A) containing reactive group(s) for carbon black and the main skeletal part of a segment (B), then grafting the precursory polymer to carbon black, and thereafter introducing an unsaturated double bond into the segment (B) of the precursory polymer grafted to carbon black, for example, by the use of the compound (d) as mentioned above. According to this method, since the segment (B) has no unsaturated double bond prior to the grafting, the problem of the disappearance of the unsaturated double bond during the course of the grafting as incurred in the method of the first embodiment does not occur even when the grafting treatment involves such reaction conditions as relatively high temperature and long time such as when an epoxy group is used as the reactive group had by the segment (A). Further, since the reactive group(s) had by the segment (A) is used up for the bondage of the polymer to the carbon black prior to the introduction of the unsaturated double bond(s), the problem of inducing a reaction between the reactive group such as isocyanate group had by the compound (d) and the reactive group had by the segment (A) does not arise. The method under discussion is at an advantage in precluding these problems. Further, the hydroxyl group which occurs after the epoxy group has reacted with carbon black and the epoxy ring has been consequently opened similarly has the possibility of entailing addition of an isocyanate group. Actually, however, since the hydroxyl group arising in consequence of the ring opening is present in the proximity of the surface of carbon black, the reactive group of the compound (d) preferentially reacts with the hydroxyl group had by the segment (B) extending into the medium.

The liquid dispersion medium to be used herein, therefore, is suitably selected in accordance with the combination of the segment (A) and the segment (B) in the relevant polymer.

The grafting of the precursory polymer to carbon black in the third embodiment has relatively moderate limits as compared with that in the first embodiment mentioned above. It can be effected, for example, by stirring and mixing the components at a temperature in the range of 100–250°

C., preferably 140–200° C., for a period in the range of 0.2–5 hours, preferably 0.5–3 hours. Further, the conditions for the introduction of unsaturated double bond(s) by the use of a compound (d) to the segment (B) of the grafted precursory polymer are relatively moderate. The introduction is attained, for example, at a temperature in the range of 10–100° C. for a period in the range of 0.5–5 hours. The other points are substantially the same as those in the first embodiment mentioned above and, therefore, will be omitted from the following description.

Now, the method of production according to the fourth embodiment will be described. The method of the fourth embodiment, similarly to that of the third embodiment mentioned above, comprises obtaining the block type or graft type precursory polymer composed of the segment (A) containing the reactive group(s) for carbon black and the main skeletal part of the segment (B), then grafting this precursory polymer to carbon black, and thereafter introducing unsaturated double bond(s) by the use of the compound (d) mentioned above to the segment (B) of the precursory polymer grafted to carbon black. Further, in the same manner as in the second embodiment described above, the block type or graft type polymer (precursory polymer) which has the molecular formulation thereof designed so that the segment (A) containing the reactive group(s) capable of reacting with the functional group(s) on the surface of carbon black may manifest higher affinity for carbon black than the segment (B) awaiting introduction of the unsaturated double bond(s) is used and grafted to carbon black. The conditions imposed on the method of production according to the fourth embodiment are substantially equal to those for the method of production according to the second embodiment. Similarly to the method of production according to the third embodiment, however, the conditions of reaction temperatures during the grafting treatment and the introduction of the unsaturated double bond(s) in the present embodiment may be relatively extensive as compared with those in the method of production according to the second embodiment.

1.14 Production of block- or graft-copolymer graft carbon black containing carboxyl group The carbon black graft polymer according to the fifth aspect of this invention can be produced by causing the hydroxyl group-containing graft- or block-copolymer described in Section 1.7 above to be heated and mixed with carbon black and then treating the resultant mixture with the acid anhydride.

The mixing under heating of the hydroxyl group-containing graft- or block-copolymer with carbon black is preferably carried out in the presence of the liquid dispersion medium formed of either the target medium or the medium having characteristic resembling those of the target medium, wherein the target medium being to be used for dispersing the ultimately obtained carbon black graft polymer. The conditions imposed herein such as the liquid dispersion medium to be used, the temperature, the mixing time, and the ratio of combination of the polymer and carbon black are the same as those described in Section 1.10 above.

It is otherwise permissible to adopt the same method as described in Section 1.11 above.

The subsequent treatment with the acid anhydride can be carried out in the same manner as described in Section 1.9 above.

1.15 Method of mixing under heating

In the production of the carbon black graft polymer according to this invention, the treatment of mixing under heating the reactive polymer as mentioned above with carbon black is carried out as described in Sections 1.8–1.14 above. This treatment of mixing under heating is preferably carried out in the liquid dispersion medium.

This mixing under heating treatment can use a stirring tank which is adopted for ordinary stirring or a mixing device such as, for example, a ball mill, a mixer, or a kneader which is adopted for mixing. It is particularly advantageous to use for this treatment an apparatus for wet dispersion which comprises a vessel for holding there in a liquid to be treated, a stirrer adapted to rotate in the vessel, a heating device for heating the liquid held in the vessel, and a plurality of granular media held inside the vessel.

Numerous wet dispersing devices and wet pulverizing devices for producing a stirring or disintegrating action by combined use of a stirrer and such granular media as beads are known in the art. This invention uses an apparatus that combines a device of this kind with a heating device for heating the liquid being treated. The use of the apparatus of this structure permits a carbon black graft polymer having an amply minute particle diameter (having the polymer grafted to carbon black which has been satisfactorily disintegrated from a secondarily agglomerated state) to be produced with extremely high efficiency.

This mixing under heating method can be applied not only for the production of a carbon black graft polymer according to this invention described in Sections 1.8–1.14 above but also for the treatment for surface improvement of a wide variety of minute solid particles. The method for the treatment for surface improvement will be described in detail in Section 4 below.

1.16 Characteristic of carbon black graft polymer

The carbon black graft polymer according to this invention which is obtained as described above appropriately has an average particle diameter in the range of 0.001–0.5 $\mu$m, preferably 0.005–0.2 $\mu$m. A carbon black graft polymer having an average particle diameter of less than 0.001 $\mu$m has small commercial significance because carbon black suitable as the raw material therefor is not easily procured. If the average particle diameter exceeds 0.5 $\mu$m, the carbon black graft polymer will possibly fail to manifest ample dispersibility.

In the carbon black graft polymer of this invention, the appropriate ratio of the carbon black moiety to the polymer moiety is 100 parts by weight of the former to 1–1000 parts by weight, preferably 5–500 parts by weight, of the latter. If the proportion of the latter is less than 1 part by weight, the produced carbon black graft polymer will possibly fail to exhibit ample dispersibility in the target medium or acquire improvement in such properties as electric insulation and ability to inhibit photopolymerization because of agglomeration the individual particles thereof. If the proportion of the latter exceeds 1000 parts by weight, the produced carbon black graft polymer will possibly fail to manifest such characteristics as coloration and imperviousness to light which are inherent in carbon black because the polymer moiety is grafted excessively to the carbon black moiety.

The carbon black graft polymers of this invention which are obtained as described above excel in stability of dispersion. Particularly when the grafted polymer moiety has the ethylenically unsaturated double bond(s), the produced carbon black graft polymer is enabled to acquire a curing reactivity. In the form of a hardened film, for example, the carbon black graft polymer is enabled to manifest highly satisfactory electric insulation because it is immobilized as uniformly dispersed in the matrix. When the grafted polymer moiety has the carboxyl group(s), the produced carbon black graft polymer enjoys satisfying alkali developability. When the grafted polymer moiety is the block- or graft-copolymer as mentioned above, the produced carbon black graft polymer exhibits literally excellent dispersibility in various substances such as, for example, organic micromolecular compounds, water, and organic solvents and generally enjoys enhanced electrical insulation and, owing to the introduction of the segment (B) of the polymer mentioned above, acquires numerous characteristic properties. Such characteristic properties as water repellency, mold release, heat resistance, weatherability, flexibility, low viscosity, and ability to preclude embrittlement at low temperatures are obtained when the segment (B) of the polymer is a chain of polysiloxane type structure. Particular variousness in hydrophilicity or hydrophobicity can be attained by using of a varying (meth)acryl ester monomer component when the segment (B) of the polymer is a (meth)acryl type chain. Such characteristic properties as hydrophilicity, lubricity, flexibility, and antistatic property are imparted when the segment (B) of the polymer is a polyalkylene glycol chain.

2. Use

The carbon black graft polymers of this invention excel in such basic properties as coloration, imperviousness to light, ability to enhance packing strength, and stability of dispersion and are such various functional properties as mentioned above as well. Owing to these characteristic properties, they can be utilized as incorporated in various solvents, thermopolymerizable and photopolymerizable monomers or oligomers, and/or various compositions based on various resins.

When the carbon black graft polymer(s) according to this invention is incorporated as a coloring agent, a filler, etc. in various compositions, the whole amount of the carbon black graft polymer(s) in the pertinent composition does not need to consist of one species where all particles have a same kind of the grafted polymer moiety, i.e., a perfectly identical characteristic, but may be a combination of two or more species which are different in the grafted polymer moieties thereof from each other. For example, a combination of two or more different species selected from the class consisting of carbon black graft polymers containing the ethylenically unsaturated double bond(s) according to the first aspect of this invention, carbon black graft polymers containing the carboxyl group(s) according to the second aspect of this invention, carbon black graft polymers containing the block- or graft-copolymer moiety according to the third aspect of this invention, carbon black graft polymers having the block- or graft-copolymer containing the ethylenically unsaturated double bond(s) according to the fourth aspect of this invention, and carbon black graft polymers having the block- or graft-copolymer moiety containing the carboxyl group(s) according to the fifth aspect of this invention, a combination of carbon black graft polymers whose polymer moieties have different molecular weights, and a combination of carbon black graft polymers whose polymer moieties have different chain structures are conceivable. The combined use of a plurality of species of carbon black graft polymers manifests an outstanding effect where the requirements imposed by a pertinent composition are not easily fulfilled by one species of carbon black graft polymer or where the use of one species of carbon black graft polymer raises a problem from the economic point of view despite the requirements imposed by that species are perfectly or sufficiently fulfilled.

2.1 Photo-curable resin composition

A particularly proper use found for the carbon black graft polymers of this invention is a coloring agent to be incorporated in a photo-curable resin composition. For example, a photo-curable resin composition can be obtained by adding the carbon black graft polymer to a photo-curable resin composition. This photo-curable resin composition can be appropriately used for forming a black matrix in a color filter, for example.

Besides the carbon black graft polymer, the photo-curable resin composition of this invention has (i) a photopolymerizable unsaturated compound, (ii) a photopolymerization initiator, and (iii) a binder as essential components thereof. It may use a solvent and, when necessary, may additionally incorporate therein a plasticizer, a discoloring agent, a unifunctional ethylenically unsaturated compound, and other adjuvants. Consequently, such properties of a photo-curable resin or a photoresist as photogenic property, printing property, and film property can be adjusted.

(i) The photopolymerizable unsaturated compound is only required to contain at least two ethylenically unsaturated double bonds in the molecular unit thereof and to be capable of addition polymerization. As concrete examples of the photopolymerizable unsaturated compounds preferably usable herein, acrylic or methacrylic esters of polyols which are disclosed in JP-B-35-5093, JP-B-35-14719, and JP-B-44-28727, etc. and such as, for example, diethylene glycol di(meth)acrylates, triethylene glycol di(meth)acrylates, tetraethylene glycol (meth)acrylates, nonaethylene glycol (meth)acrylates, pentaerythritol tri(meth)acrylates, trimethylol propane tri(meth)acrylates, trimethylol propane di(meth)acrylates, pentaerythritol tetra(meth)acrylates, dipentaerythritol penta(meth)acrylates, dipentaerythritol hexa(meth)acrylates, and 1,6-hexane diol di(meth)acrylates; and bis(meth)acrylamides such as, for example, methylene bis(meth)acrylamides and m-xylylene bis(meth)acrylamides; compounds containing a urethane group such as, for example, di(2-methacryloxyethyl) 2,4-tolylene diurethane and di-2-2-acryloxyethyl) hexamethylene diurethane; (meth)acryl urethane oligomers obtained by preparing a terminal isocyanate compound by the reaction of a polyol with a diisocyanate and then causing β-hydroxyalkyl (meth) acrylates to react with the obtained terminal isocyanate compound such as, for example, oligomers obtained by causing 1 mol of β-hydroxyethyl acrylate to react the reaction product of 4 mols of 2,4-tolylene diisocyanate with 3 mols of ethylene glycol; and diacrylates such as, for example, 2,2-bis(hydroxyphenyl) propane, 2,2-bis (hydroxyethoxyphenyl) propane, and 2,2-bis (hydroxyethoxyethoxyphenyl) propane may be cited.

(ii) As concrete examples of the photopolymerization initiator, aromatic ketones such as, for example, benzophenone, 4,4'-bis(dimethylamino) benzophenone, 4,4'-bis(diethylamino) benzophenone, 4-methoxy-4'-dimethylaminobenzophenone, 4,4'-dimethoxybenzophenone, 4-dimethylaminobenzophenone, 4-dimethylaminoacetophenone, benzyl anthraquinone, 2-tert-butyl anthraquinone, 2-methyl anthraquinone, phenanthraquinone, xanthone, thioxanthone, 1-chlorothioxanthone, 2,4-diethyl thioxanthone, fluorenone, and acridone; benzoin and benzoin ethers such as, for example, benzoin methyl ether, benzoin ethyl ether, benzoin propyl ether, benzoin isopropyl ether, and benzoin phenyl ether; 2,4,5-triarylaimidazol dimers such as, for example, 2-(o-chlorophenyl)-4,5-diphenyl imidazol dimer, 2-(o-chlorophenyl)-4,5-di(m-methoxyphenyl) imidazol dimer, 2-(o-fluorophenyl)-4,5-diphenyl imidazol dimer, 2-(o-methoxyphenyl)-4,5-diphenyl imidazol dimer, and 1-(p-methoxyphenyl)-4,5-diphenyl imidazol dimer; polyhalogen compounds such as, for example, carbon tetrabromide, phenyl tribromomethyl sulphone, phenyl tribromomethyl sulphone, and phenyl trichloromethyl ketone; and combinations of two or more compounds disclosed in JP-A-53-133428, JP-B-57-1819, JP-B-57-6096, and U.S. Pat. No. 3,615,455 such as, for example, combinations of a 2,4,5-trirylimidazole dimer with 2-mercapto benzoxazole or leucocrystal violet; combinations of 4,4'-bis(dimethylamino) benzophenone with benzophenone or benzoin methyl ether disclosed in U.S. Pat. No. 3,427,161; combinations of benzoyl-N-methyl naphthothiazolin with 2,4-bis (trichloromethyl)-6,4-methoxyphenyl triazol disclosed in U.S. Pat. No. 423985; and combinations of dimethylthioxanthone with 4-dialkyl-aminobenzoic esters disclosed in JP-A-57-23602 may be cited.

(iii) The binders are known in three types, i.e. the alkali developing type having an unexposed part removed with an alkaline aqueous solution, the solvent developing type having an unexposed part removed with an organic solvent, and the water developing type having an unexposed part removed with water. This invention does not discriminate the binder on account of the nature of development.

When the photo-curable resin composition of this invention is used for a black matrix in a color filter, for example, it is properly formulated so as to contain an alkali-soluble binder and consequently rendered soluble with an alkali. The alkali-developable photo-curable resin composition basically comprises a photopolymerization initiator, a polyfunctional monomer, and a polymer binder containing an alkali-soluble group in the molecular unit thereof. This composition, on exposure to light, is hardened and rendered insoluble in an alkali aqueous solution.

The alkali-soluble photo-curable composition containing the carbon black graft polymer as mentioned above and befitting the role of an alkali-developable sensitive layer permits the use of the following binders therein:

Styrene-containing alkali-soluble resins such as styrene-acrylic acid copolymer, styrene-methacrylic acid copolymer, and styrene-α-methylstyrene-acrylic acid copolymer;

Alkali-soluble resins having a repeating unit derived from at least one compound selected from the group consisting of acrylic acid or methacrylic acid and (B) another repeating unit derived from at least one compound selected from the group consisting of benzyl acrylate, benzyl methacrylate, phenethyl acrylate, phenethyl methacrylate, 3-phenylpropyl acrylate, and 3-phenylpropyl methacrylate, such as benzyl acrylate-acrylic acid copolymer, benzyl acrylate-methacrylic acid copolymer, benzyl methacrylate-acrylic acid copolymer, and benzyl methacrylate-methacrylic acid copolymer;

alkali-soluble resins containing methyl methacrylate such as methyl methacrylate-2-ethylhexyl methacrylate-(meth)acrylic acid terpolymer, methyl methacrylate-styrene-ethyl acrylate-(meth)acrylic acid quaternary polymer, and methyl methacrylate-ethyl actylate-(meth)acrylic acid terpolymer;

Alkali-soluble resins containing acrylonitrile such as acrylonitrile-2-ethylhexyl methacrylate-methacrylic acid terpolymer;

Alkali-soluble resins formed of half-esterified maleic anhydrides such as styrene-maleic mono-n-butyl ester copolymers and partially half-estered styrene-maleic anhydride copolymers;

and combinations thereof.

Further, the photo-curable resin composition, when necessary, may incorporate therein as a film-forming component an organic macromolecular polymer which is compatible with such a photopolymerizable compound. As concrete examples of the organic macromolecular polymer of this description, polyacrylic esters or partial hydrolyzates, polymethacrylic esters or partial hydrolyzates, polyvinyl acetate or hydrolyzate, and polystyrene, polyvinyl butyral, polychloroprene, polyvinyl chloride, chlorinated polyethylene, chlorinated polypropylene, polyvinyl pyrrolidone, and copolymers or half-esters of styrene with maleic anhydride may be cited. It may further incorporate therein a suitable organic solvent in an amount incapable of impairing the photo-curing property thereof. As concrete examples of the organic solvent which is incorporated therein, lower alcohols such as methyl alcohol, ethyl alcohol, and butyl alcohol; amides such as dimethyl formamide; esters such as methyl acetate, ethyl acetate, and butyl acetate; ethers such as 2-ethylhexyl ether, dioxane, ethylene glycol, and monomethyl ether; furans such as 2-methyl tetrahydrofuran and furfural; halogen compounds such as chloroform, methyl chloroform, and trichloroethylene; aliphatic hydrocarbons such as n-hexane and n-heptane; ketones such as acetone, methylethyl ketone, and methylisobutyl ketone; nitriles such as acetonitrile and dodecyl nitrile; and sulfur derivatives such as carbon disulfide and thiophene may be cited. It may, when necessary for preventing the photo-curing treatment from proceeding excessively, incorporate therein a polymerization inhibitor such as hydroquinone or p-benzoquinone. Besides, it may optionally incorporate therein other known additives such as, for example, a tackifier, a thixotropy-imparting agent, a leveling agent, a defoaming agent, and an adhesiveness-imparting agent.

The photo-curable resin composition of this invention is produced by having the carbon black graft polymer mentioned above incorporated in a photo-curable resin composition. Though the amount of the carbon black graft polymer to be incorporated in the photo-curable resin composition is variable with the kind of the photo-curable resin composition to be used, it is generally in the range of 1–80% by weight, preferably 5–60% by weight. If the amount of the carbon black graft polymer to be incorporated is less than 1% by weight, the cured film will possibly be deficient in blackness. Conversely, if this amount exceeds 80% by weight, the cured film will possibly be deficient in strength.

Incidentally, as described above, the whole amount of the carbon black graft polymer(s) of this invention to be incorporated in the photo-curable resin composition of this invention does not need to consist of one species where all particles have a same kind of the grafted polymer moiety, i.e., a perfectly identical characteristic, but may be a combination of two or more species which are different in the grafted polymer moieties thereof from each other.

The photo-curable resin composition according to this invention, when necessary, may incorporate further therein another coloring agent component such as, for example, an organic pigment and another treated carbon black in an amount incapable of impairing the properties of the composition.

As concrete examples of the other treated carbon black, a product which is obtained by reacting with carbon black under an unpolymerizing condition a polymerizable monomer having a reactive group capable of reacting the functional group on the surface of carbon black and having an ethylenically unsaturated double bond, namely, such as the epoxy group-containing polymerizable monomer, the thioepoxy group-containing polymerizable monomer, the aziridine group-containing polymerizable monomer, the oxazoline group-containing polymerizable monomer, and the N-hydroxyalkyl amide group-containing polymerizable monomer, those which are disclosed in Section 1.5 above. Incidentally, the product manifest properties resembling those of the carbon-black graft polymers having the ethylenically unsaturated double bond according to the first aspect of this invention, with the polymer moieties thereof adapted to a low polymerization degree.

The species of graft carbon black according to this invention are invariably such that the polymer moieties thereof grafted with high efficiency to the surface of carbon black. When they are added to the photo-curable resin composition, therefore, the polymerization inhibiting functional groups such as quinone group and phenolic hydroxyl group which are present on the surface of carbon black are coated, with the result that the otherwise possible retardation of the photo-curing process of the photo-curable resin composition will be inhibited. Particularly when the carbon black graft polymer has ethylenically unsaturated double bond(s) in the polymer chain, it can contribute to the curing reaction. It not only promotes the curing reaction but also renders difficult the decline of the strength of the cured film even when the amount of carbon black to be added is increased. When the carbon black graft polymer has carboxyl group(s) in the polymer chain, it exhibits excellent dispersibility to a medium and acquires an improvement in the solubility in an alkali solvent. When the carbon black graft polymer has the block- or graft-copolymer as mentioned above, the surface functional group of the carbon black and the reactive group of the segment (A) in the block- or graft-copolymer moiety mentioned above have high reactivity and the polymer moiety is grafted with high efficiency to the surface of the carbon black, with the result that the polymerization inhibiting functional group present on the surface of the carbon black will be coated more satisfactorily and the retardation of the photo-curing process of the photo-curable resin composition will be repressed. Further, since the segment (B) of the copolymer grafted to the carbon black orientates outwardly, the produced graft carbon black has enhanced affinity for various substances and outstanding dispersibility in various photo-curable resin compositions and manifests fully satisfactory lubricity and, when dispersed in a photo-curable resin composition, manifests proper viscosity.

The photo-curable resin composition of this invention can form a black film when it is applied to a varying substrate such as, for example, glass plate, plastic sheet or film, paper, synthetic paper, or silicon wafer by a varying coating means such as, for example, a bar coater, a spin coater, a roll coater, a spray coater, dipping, gravure printing, or screen printing and then cured by irradiation with an ultraviolet light at a dose of 10–5000 mJ.

2.2 Black matrix

The formation of a black matrix in a color filter by the use of the photo-curable resin composition of this invention as described above is carried out, for example, as follows.

The black photo-curable resin composition is applied to a substrate such as a glass sheet with a spin coater. Then, the applied film of the composition is dried (prebaked) with a hot-air drier or a hot plate at a temperature of not more than 150° C., preferably in the range of 80–120° C., for a period in the approximate range of 1–60 minutes. The film of the black photo-curable resin composition consequently obtained generally has a proper thickness in the approximate range of 1.0–3.0 mm. Then, a mask of a prescribed shape such as a dotted pattern or a striped pattern is attached fast to the film of the black photo-curable resin composition. Though the pattern of the mask, the film is exposed to a collimated beam from an ultraviolet light source such as, for example, a high-pressure mercury-vapor lamp in a dose of 50–1000 mJ. Subsequently, the film is developed to form a pattern such as of a black matrix.

The development of the film exposed to the pattern is effected by immersing the film in a suitable developing liquid at a temperature in the approximate range of 0–100° C. thereby dissolving out and removing the uncured part of the film. After the development, the colored picture element consequently formed is appropriately rinsed with a suitable cleansing liquid and then heat-treated (afterbaked) with a hot-air drier or a hot plate at a temperature in the approximate range of 100–300° C. for a period in the approximate range of 1–120 minutes to harden the colored picture element thoroughly.

The formation of a black matrix in a color filter by the use of the black photo-curable resin composition according to this invention can be attained by either the method which comprises first forming a black matrix on a substrate and then forming patterns colored in red, green, and blue thereon or the method which comprises forming patterns colored in red, green, and blue in advance on a substrate and then forming a black matrix thereon.

Incidentally, when the carbon black graft polymer according to this invention which has been incorporated in the photo-curable resin composition has the unsaturated double bond(s) as mentioned above, it is bound during the process of exposure to the light to the resin matrix forming the film through the medium of cross-linked or polymerized chain(s) which is formed by the action of the unsaturated double bond(s). As a result, the dispersed state of the carbon black present in the film is stably retained even when the afterbaking treatment is carried out as described above. Thus, the disadvantage that the afterbaking treatment results in a decline of the electric resistance of the film is not experienced by the film.

2.3 Liquid recording medium

An advantageous-and typical use found for the carbon black graft polymer according to this invention is a liquid recording medium in the ink jet printing method.

The liquid recording medium according to this invention is only required to contain as a coloring agent moiety the carbon black graft polymer as mentioned above and is not particularly limited with respect to a liquid medium or other components. It is only required to select the composition thereof suitably so as to acquire liquid physical properties (viscosity, surface tension, electroconductivity, boiling point, thermoconductivity, and water solubility or water insolubility) which are adequate for the operating method for the ink jet printing apparatus using the liquid recording medium (such as, for example, the method of pressure application by piezoelectricity and the method of pressure application by heating), the condition of discharge (such as, for example, the drive voltage and the drive frequency of the piezoelectric element, the shape and material of the discharge orifice, and the diameter of the discharge orifice in the method for pressure application by piezoelectricity or the amount of thermal energy per unit time, the kind of the heat-exchange energy, the shape of the discharge orifice, and the diameter of the discharge orifice in the method of pressure application by heating), and the kind of the material as the basis for printing (such as paper or film).

As concrete examples of the liquid medium to be effectively used herein, water; monohydric alcohol type solvents such as methyl alcohol, ethyl alcohol, n-propyl alcohol, isopropyl alcohol, butyl alcohol, sec-butyl alcohol, tert-butyl alcohol, isobutyl alcohol, pentyl alcohol, hexyl alcohol, heptyl alcohol, octyl alcohol, nonyl alcohol, decyl alcohol, furfuryl alcohol, and tetrahydrofurfuryl alcohol; polyhydric alcohol type solvents such as ethylene glycol, diethylene glycol, triethylene glycol, propylene glycol, tetraethylene glycol, polyethylene glycol, glycerin, 1,2,6-hexane triol, and thioglycol; ketoalcohol type solvents such as acetone, methylethyl ketone, methylpropyl ketone, methylamyl ketone, cyclohexanone, and diacetone alcohol; ether type solvents such as ethyl ether, butyl ether, tetrahydrofuran, dioxane, ethylene glycol monomethyl ether, ethylene glycol monoethyl ether, diethylene glycol monomethyl ether, diethylene glycol monoethyl ether, propylene glycol monomethyl ether, propylene glycol monoethyl ether, triethylene glycol monomethyl ether, triethylene glycol monoethyl ether, diethylene glycol dimethyl ether, and diethylene glycol diethyl ether; ester type solvents such as ethyl formate, methyl acetate, ethyl acetate, phenyl acetate, ethyl lactate, ethylene carbonate, propylene carbonate, and ethylene glycol monoethyl ether acetate; amine type solvents such as monoethanol amine, diethanol amine, and triethanol amine; amide type solvents such as dimethyl formamide and dimethyl acetamide; nitrogen-containing cyclic compound type solvents such as pyrrolidone, N-methyl-2-pyrrolidone, and 1,3-dimethyl-2-imidazolizinone; hydrocarbon type solvents such as hexane, octane, cyclopentane, benzene, toluene, and xylol; and halogenated hydrocarbon type solvents such as carbon tetrachloride, trichloroethylene, tetrachloroethane, and dichlorobenzene may be cited. From the group of liquid media mentioned above, one member or a combination of a plurality of members can be suitably selected to fulfill the properties which the recording medium to be used is expected to have.

Among other liquid media enumerated above, water, monohydric alcohols or polyhydric alcohols, cellosolves, and cellosolve acetate prove proper and water and ethanol prove particularly proper in consideration of ease of procurement, economy, effects on environment, ease of manufacture of recording medium, etc. Then, diethylene glycol and thiodiglycol prove proper from the standpoint of preventing the ink from clogging the orifice. In terms of the density of image and the stability of discharge, nitrogen-containing cyclic compounds and ether compounds of polyalkylene oxide prove proper. Further, in terms of the response of frequency, the use of a lower alcohol or the addition of a surfactant which will be specifically described herein below proves proper.

The amount of the carbon black graft polymer to be incorporated relative to that of the liquid medium in the liquid recording medium according to this invention is not particularly limited. It suffices to adjust the amount of the carbon black graft polymer, for example, so that the pigment concentration may fall in the range of 1–20% by weight, preferably 2–12% by weight. In this situation, the amount of the carbon black graft polymer is in the range of 1–100 parts by weight, preferably 2–50 parts by weight, based on 100 parts by weight of the liquid medium.

The liquid recording medium according to this invention has such a liquid medium as mentioned above and a coloring agent formed of the carbon black graft polymer as basic components thereof. It may, when necessary, incorporate further therein various additives such as viscosity-adjusting agent, surface tension-adjusting agent, pH-adjusting agent, resistivity-adjusting agent, wetting agent, and infrared absorption heating agent. It may further incorporate therein a varying dye or pigment as a coloring agent in an amount incapable of impairing the effects of the present invention.

The viscosity-adjusting agent and the surface tension-adjusting agent can be added mainly for the purpose of enabling the liquid recording medium to flow through the nozzle at a fully satisfactory flow rate proportionately to the recording speed, preventing the recording medium to roll around the orifice of the nozzle, and preventing the recording medium from inducing the phenomenon of oozing when it is applied to the recording material.

The viscosity-adjusting agent and the surface tension-adjusting agent may be any of the known products on the sole condition that they avoid exerting adverse effects on the liquid medium and the coloring agent to be used. As concrete examples of the viscosity-adjusting agent, polyvinyl alcohol, hydroxypropyl cellulose, carboxymethyl cellulose, hydroxyethyl cellulose, methyl cellulose, water-soluble (meth)acryl type resins, polyvinyl pyrrolidone, gum arabic, and starch may be cited. As concrete examples of the surface tension-adjusting agent, various kinds of surfactants including anionic surfactants such as polyethylene glycol ether and sulfuric esters, cationic surfactants such as poly-2-vinyl pyridine derivatives and poly-4-vinyl pyridine derivatives, and nonionic surfactants such as polyoxyethylene alkyl ethers, polyoxyethylene alkylphenyl ethers, polyoxyethylene alkyl esters, polyoxyethylene sorbitan monoalkyl esters, and polyoxyethylene alkyl amines; amine acids such as diethanol amine, propanol amine, and morpholine acid; basic substances such as ammonium hydroxide and sodium hydroxide; and substituted pyrrolidones such as N-methy-2-pyrrolidone may be cited.

These viscosity-adjusting agents and surface tension-adjusting agents, when necessary, may be used in the form of a combination of several members selected from among them. Though the amounts of the viscosity-adjusting agent and the surface tension-adjusting agent to be added are varied by such factors as the kind of the liquid medium to be used and the amount of the coloring agent to be added, appropriately the amount of the viscosity-adjusting agent is in the approximate range of 0.1–30 parts by weight and the amount of the surface tension-adjusting agent in the approximate range of 0.01–10 parts by weight, based on 100 parts by weight of the liquid recording medium. The pH-adjusting agent can be added, when necessary, for chemically stabilizing the liquid recording medium, namely for allowing the liquid recording medium to remain at a prescribed pH value thereby preventing the physical properties thereof from being degraded by protracted storage and preventing the coloring agent and other components from sedimentation and agglomeration. As concrete examples of the pH-adjusting agent, lower alkanol amines; monovalent hydroxides such as alkali metal hydroxides; and ammonium hydroxide may be cited.

When the recording aimed at is obtained by electrically charging the droplets of the liquid recording medium according to this invention, the resistivity of the liquid recording medium constitutes itself an important factor for the charging property of the medium. In the case of this recording method, the resistivity-adjusting agent can be added for the purpose of adjusting the magnitude of the resistivity of the liquid recording medium in a prescribed range. As concrete examples of the resistivity-adjusting agent, inorganic salts such as ammonium chloride, sodium chloride, and potassium chloride; water-soluble amines such as triethanol amine and quaternary ammonium salts may be cited.

The wetting agent which is effectively used in the liquid recording medium of this invention may be any of various kinds of compounds known as wetting agents. As concrete examples of the wetting agent, polyalkylene glycols such as polyethylene glycol and polypropylene glycol; alkylene glycols such as ethylene glycol, propylene glycol, butylene glycol, and hexylene glycol; alkyl ethers of alkylene glycols and dialkylene glycols such as ethylene glycol methyl ether, diethylene glycol methyl ether, and diethylene glycol ethyl ether; glycerin; alkoxy triglycols such as methoxy triglycol and ethoxy triglycol; and N-vinyl-2-pyrrolidone oligomers may be cited. These wetting agents may be used either singly or in the form of a combination of two or more members. Incidentally, most of these wetting agents function also as a liquid medium.

When the liquid recording medium according to this invention is used for the recording by being heated with an electromagnetic wave energy, especially an infrared ray, it is proper to add an infrared ray absorption heating agent to the liquid recording medium. This invention contemplates using carbon black as a coloring agent component, as described above, and expects the carbon black to function as an infrared ray absorption heating agent. As concrete examples of the other infrared ray absorption heating agent, dyes such as water-soluble nigrosine, modified water-soluble nigrosine, and alcohol-soluble nigrosine, inorganic pigments such as ultramarine blue, cadmium yellow, iron oxide red, and chrome yellow, and organic pigments such as azo type, triphenyl methane type, quinoline type, anthraquinone type, and phthalocyanine type pigments may be cited. Naturally, most of these heating agents function also as a coloring agent.

The liquid recording medium according to this invention can incorporate therein such a resin component as, for example, alkyd resin, acryl resin, acrylamide resin, polyvinyl alcohol, or polyvinyl pyrrolidone for the purpose of acquiring an ability to form a film of itself on the surface of the recording material and enhance the strength of the formed film.

2.4 Liquid developing agent for electrostatic latent image

Another advantageous typical use found for the carbon black graft polymer according to this invention is a liquid developing agent for an electrostatic latent image.

The liquid developing agent according to this invention is only required to contain as a coloring agent component the carbon black graft polymer as mentioned above and is not particularly limited with respect to the carrier liquid, the fixing agent, or any other component. These other components may be selected from various known compounds. The liquid developing agent can incorporate therein as a coloring agent component various dyes and pigments in an amount incapable of impairing the effect of this invention.

As typical examples of the carrier liquid, nonpolar solvents like hydrocarbon type solvents which manifest electric insulation at a dielectric constant of not more than $3.5\Omega$ (a volume specific resistance of not less than $10^7$ $\Omega$·cm) maybe cited. Among other hydrocarbon type solvents mentioned above, aliphatic hydrocarbons, aromatic hydrocarbons, and mixtures thereof which have boiling points in the range of 150–220° C. prove particularly advantageous. Specifically, Isopar G, H, L (produced by Exxon), Shellsol A, AB (produced by Shell), and Naphthesol L, m, H (produced by Nippon Oil Company, Ltd.) may be cited, though not exclusively.

The fixing agent is required to be a resin which is insoluble in or swellable with the carrier liquid. As concrete examples of the fixing agent, polyethylene resin, (meth)acryl resins, styrene resin, vinyl acetate resin, ester resins, amide resins, phenol-modified alkyd resins, epoxy resins, linseed oil-modified alkyd resins, epoxy resins, linseed oil-modified alkyd resins, coumaron-indene resin, phenol-formalin resin, rosin type resins, styrene-butadiene rubber, and cyclized rubber may be cited.

The liquid developing agent, when necessary, can incorporate therein an electric charge-adjusting agent. This charge-adjusting agent may be any of all the agents known as electric charge-imparting agent and electric charge-adjusting agent. As concrete examples of these agents, metal salts of such fatty acids as naphthenic acid, octenic acid, oleic acid, stearic acid, and lauric acid, metal salts of sulfosuccinic esters, metal salts of oil-soluble sulfonic acids disclosed in JP-B-45-556, metal salts of abietic acid or hydrogenated abietic acid disclosed in JP-B-48-25666, calcium salts of alkylbenzene sulfonic acids disclosed in JP-B-55-2620, metal salts of aromatic carboxylic acids or sulfonic acids disclosed in JP-A-52-107837, nonionic surfactants such as polyoxyethylated amylamine, oils such as lecithin and linseed oil, polyvinyl pyrrolidone, and organic acid esters of polyhydric alcohols may be cited.

2.5 Other uses

The other uses found for the carbon black graft polymer according to this invention, though not particularly limited, include various resinous compositions, coating compositions, inks, thermographic transfer inks, thermographic transfer ink ribbon coating agents, backcoating agents for magnetic recording media, electrostatic charge image developing toners, paint, materials requiring high resistance and imperviousness to light, artificial marble, coloring agents for plastic or rubber forming materials or light-impervious fibers, modifying agents or fillers for plastic such as polyolefin or polyester and rubber, lubricants, traction drive fluids, electroviscous fluids and nonlinear optical materials, electric resistance-adjusting agents such as antistatic materials, resisting materials in copying devices, planar heaters utilizing the PTC characteristics, and sealing agents for semiconductor device, for example.

A product obtained by adding the carbon black graft polymer to a thermoplastic resin can be used as toners, films, and fibers which are had of such characteristics as mentioned above. A product resulting from adding the carbon black graft polymer to a thermosetting resin acquires similar characteristics and permits a solution for the problem heretofore posed to carbon.

A product obtained by adding the carbon black graft polymer of this invention to such a binder as is used for a coating composition is capable of forming a strong film when it is applied to a varying substrate. As concrete examples of the binder effectively usable herein, thermoplastic resins, thermosetting resins, and reactive resins may be cited. One member or a mixture of two or more members may be selected from among these resins depending on the kind of use.

The carbon black graft polymer according to this invention has carbon black dispersed in the form of microfine particles. The dispersion of the carbon black graft polymer in a liquid phase, therefore, can be used in its unmodified form or in a form suitably incorporating further therein other necessary components as inks enjoying high stability of dispersion and manifesting an outstanding coloring power for oil writing pens, for data recording, or for printing.

3. Production of carbon black-containing resin composition

As one means to graft the block- or graft-copolymer described in Section 1.5 above to carbon black, the method for producing a carbon black-containing resin composition, characterized by melting and mixing a resin component destined to serve as a dispersion medium and carbon black in combination with the block- or graft-copolymer which has the segment (A) containing the reactive group(s) capable of reacting with the functional group(s) on the surface of the carbon black and has the segment (B) containing substantially none of the reactive group and manifesting higher affinity for the resin component than the segment (A) is now proposed. When the target medium in which the carbon black is to be dispersed is a resin component, the carbon black enjoys satisfying dispersibility in a product obtained by directly melting and mixing the carbon black in the resin component as the target medium instead of stirring and mixing the carbon black and the graft- or block-copolymer in a liquid dispersion medium as contemplated by the first aspect of this invention mentioned above. This product, therefore, can be obtained by a simpler procedure. The satisfying dispersibility in this case is due to the fact that the block- or graft-copolymer exhibits its orientation ability in the molten state resin component (in the dispersion medium) during the course of the melting and mixing treatment and it is consequently grafted highly efficiently to the carbon black.

4. Method of treatment for surface improvement

The method of treatment of the minute solid particles for surface improvement according to this invention resides in conferring surface improvement on minute solid particles by placing the minute solid particles and a reactive polymer having reactive group(s) capable of reacting with the functional group(s) present on the surface of the minute solid particles in a liquid dispersion medium and subjecting the resultant mixture to a heating and dispersing treatment. The minute solid particles present in the liquid dispersion medium are exposed to a physical force of torque arising from the stirring in the dispersing treatment and consequently transformed from the state of secondary agglomeration through disintegration to the primary particulate state within the liquid dispersion medium. Since the dispersion system is in a heated state at this time, the reactive polymer is grafted to the minute solid particles because the functional group on the surface of the minute solid particles readily reacts with the reactive group of the reactive polymer. Moreover, since the reaction of the minute solid particles with the reactive polymer occurs in the liquid dispersion medium, it is thought to spread relatively uniformly throughout the entire system and proceed moderately as compared with the reaction produced by melting and mixing the minute solid particles with the reactive polymer. Thus, the treatment of surface improvement is attained satisfactorily even when the ratio of the amount of the reactive polymer to that of the minute solid particles is low as well as when the number of reactive groups per molecule of the reactive polymer is relatively large. During the treatment of dispersion in this liquid dispersion medium, the surface treatment is satisfactorily attained unlike that involved in the reaction by melting and mixing probably because the force of torque to be exerted on the reactive polymer of a low molecular weight is ample. Thus, the method of this invention not only obviates the necessity for using the reactive polymer so much as in the conventionally known reaction by melting and mixing but also imposes only a small limit on the reactive polymer and permits the surface property of the minute solid particles to be altered so as to meet varying demands.

Incidentally, the dispersion of minute solid particles which is obtained in consequence of the implementation of the method of this invention acquires uniform and stable dispersibility because the minute solid particles present therein have been endowed with surface improvement and enabled to manifest enhanced affinity for the liquid dispersion medium. This dispersion can be used in its unmodified form in various applications. The minute solid particles in this dispersion, when necessary, may be separated from the dispersion and put to use as such in various applications.

The "grafting" of the reactive polymer to the surface of the minute solid particles is as defined in Section 1 above.

In the method of treatment for surface improvement of minute solid particles according to this invention, the minute solid particles which are subjected to the treatment are only required to have such a functional group as is capable of reacting with the reactive group of the reactive polymer and are not limited particularly in any other respect. As concrete examples of the minute solid particles effectively usable herein, pigments, magnetic powders, ceramic powders, and organic particulates may be cited.

The method of treatment is advantageously applicable for pigments and particularly inorganic pigments such as, for example, carbon black, clay, calcium carbonate, titanium dioxide, titanium white, aluminum hydroxide, talc, slaked lime, magnesium hydroxide, iron oxide red, cement, alumina, zirconia, silica, silicon carbide, and silicon nitride and further for magnetic powders, particularly for carbon black. As the carbon black, those which are described in Section 1.1 above are preferable.

The reactive polymer to be used in this invention is only required to have such a reactive group as is capable of reacting with the functional group on the surface of the minute solid particles mentioned above. Appropriately, it has as the reactive group at least one reactive group selected from the class consisting of epoxy group, thioepoxy group, aziridine group, and oxazoline group. This reactive polymer is selected from among such vinyl type polymers, polyesters, and polyethers as have in the molecular unit thereof the reactive group just mentioned. As a matter of course, the polymers described in Section 1 above are included in the reactive polymers under discussion.

As means to obtain the reactive polymer, the following methods may be cited, as shown already in Section 1.2 above:

(1) A method which comprises polymerizing a polymerizable monomer having the reactive group(s) mentioned above in the molecular unit thereof (hereinafter referred to as "monomer k"), when necessary, in combination with other polymerizable monomer (hereinafter referred to as "monomer l");

(2) A method which comprises causing a compound having the reactive group(s) mentioned above in the molecular unit thereof (hereinafter referred to as "compound m") to react with a polymer having group(s) capable of reacting with the compound c (hereinafter referred to as "polymer n") thereby introducing the reactive group(s) into the polymer d; and (3) A method which comprises using a polymer having reactive group(s) which is different in kind than the reactive group(s) mentioned above in the molecular unit thereof (hereinafter referred to as "polymer o") and converting this polymer by a known method into a polymer (A) having the reactive group(s).

This invention prefers the method (1) to the other two methods mentioned above.

As concrete examples of the monomer k which can be used in the method (1) above, the epoxy group-containing polymerizable monomers, thioepoxy group-containing polymerizable monomers, aziridine group-containing polymerizable monomers, oxazoline group-containing polymerizable monomers, and N-hydroxyalkylamide group-containing polymerizable monomers disclosed as the monomer a in Section 1.5 above may be cited. These monomers can be used either singly or in the form of a combination of two or more members.

The monomer l which can be used, when necessary, in the method (1) is only required to be capable of copolymerizing with the monomer k and is not particularly limited in any other respect. As concrete examples of the monomer l, the monomers cited as the polymerizable monomer c in Section 1.5 above may be cited. These monomers can be used either singly or in the form of a combination of two or more members.

According to the method (1), the reactive polymer having the reactive group can be obtained by polymerizing the monomer k, when necessary, in combination with the monomer l suitably by any of the known methods of polymerization such as, for example, bulk polymerization method, suspension polymerization method, emulsion polymerization method, precipitation polymerization method, and solution polymerization method.

As concrete examples of the compound m which can be used in the method (2):

(2-1) compounds having two or more pieces of one species of the reactive group mentioned above in the molecular unit thereof, (2-2) compounds having two or more species of the reactive group mentioned above in the molecular unit thereof, and (2-3) compounds having at least one species of the reactive group mentioned above and a group other than the reactive group mentioned above in the molecular unit thereof may be cited.

It is provided, however, that the "group other than the reactive group mentioned above" mentioned in the item (2-3) above refers to that which is other than aziridine group, oxazoline group, N-hydroxyalkylamide group, epoxy group, and thioepoxy group and is capable of reacting with the group contained in the polymer (n) which will be described specifically herein below. As concrete examples of this group, isocyanate group, amino group, carboxyl group, hydroxyl group, vinyl group, and halogen group may be cited.

As concrete examples of the polymer (n) in the method (2), polymers such as vinyl type polymers, polyesters, and polyethers which have a group capable of reacting with the compound c as enumerated in the aforementioned items (2-1)–(2-3) are cited. As concrete examples of the group which is capable of reacting with the compound (m), hydroxyl group (including phenolic hydroxyl group), carboxyl group, quinone group, amino group, and epoxy group may be cited. The polymer (n) which has this group can be easily obtained by such known methods of polymerization as radical polymerization or polycondensation.

According to the method (2), the reactive polymer having the reactive group can be obtained by causing the compound (m) to react with the polymer (n) under selected conditions such that at least one of the reactive groups may remain unaltered.

The polymer (o) in the method (3) is a polymer which has in the molecular unit thereof group(s) capable of being converted into aziridine group(s), oxazoline group(s), N-hydroxyalkylamide group(s), epoxy group(s), or thioepoxy group(s), the group(s) being such as, for example, vinyl group(s), carboxyl group(s), chlorohydrin group(s), or glycol group(s). This polymer can be easily converted by a known method into a reactive polymer having aziridine group(s), oxazoline group(s), N-hydroxyalkylamide group (s), epoxy group(s), and/or thioepoxy group(s).

Appropriately for the purpose of simultaneously satisfying satisfying binding property and surface improvement, the reactive polymer to be used in this invention has the molecular formulation thereof so designed as to have a segment (A) manifesting high affinity for the minute solid particles to which the reactive polymer is intended to be bound and a segment (B) manifesting high affinity for a target medium in which the minute solid particles are intended to be dispersed, similarly to the reactive polymer described in Section 1.5 above. Properly, the reactive polymer is a block- or graft-copolymer which has such segments of different properties as mentioned above. The reactive group is allowed to exist exclusively in the segment (A) which has high affinity for the minute solid particles. The block- or graft-copolymer is not limited to the simple A-B type but is so extensive as to embrace a high-degree alternate block type as B-A-B and a comb type having a plurality of segments (B) grafted to a segment (A), and etc.

The molecular weight of the reactive polymer to be used in this invention can fall in a relatively wide range. The number average molecular weight, for example, is in the approximate range of 1000–1000000, preferably 5000–100000.

The number of reactive groups which the reactive polymer has per molecule can fall in a relatively wide range. It may be in the approximate range of 1–50, preferably 1–20, on the average per molecule.

The liquid dispersion medium to be used in the method of surface treatment of this invention for holding the minute solid particles and the reactive polymer therein is not particularly limited. It may be any of various water-soluble and water-insoluble liquid dispersion media. As concrete examples of this liquid dispersion medium, water; alcohols such as methyl alcohol, ethyl alcohol, isopropyl alcohol, butyl alcohol, allyl alcohol; glycols and derivatives thereof such as ethylene glycol, propylene glycol, diethylene glycol, polyethylene glycol, polypropylene glycol, diethylene glycol monoethyl ether, polypropylene glycol monoethyl ether, polyethylene glycol monoallyl ether, and polypropylene glycol monoallyl ether; glycerols and derivatives thereof such as glycerol, glycerol monoethyl ether, and glycerol monoallyl ether; ethers such as tetrahydrofuran and dioxane; ketones such as methylethyl ketone and methyl isobutyl ketone; hydrocarbons such as liquid paraffin, decane, decene, methyl naphthalene, decalin, kerosine, diphenyl methane, toluene, dimethyl benzene, ethyl benzene, diethyl benzene, propyl benzene, cyclohexane, and partially hydrogenated triphenyl; silicone oils such as polydimethyl siloxane, partially octyl-substituted polydimethyl siloxane, partially phenyl-substituted polydimethyl siloxane, and fluorosilicone oil; halogenated hydrocarbons such as chlorobenzene, dicylorobenzene, bromobenzene, chlorodiphenyl, and chlorodiphenyl methane; fluorides such as Daifloil (produced by Daikin Kogyo Co., Ltd.) and Demnum (produced by Daikin Kogyo Co., Ltd.); and esters such as ethyl benzoate, octyl benzoate, dioctyl phthalate, trioctyl trimellitate, dibutyl sebacate, ethyl (meth)acrylates, butyl (meth)acrylates, and dodecyl (meth)acrylates may be cited. The liquid dispersion medium to be used can be suitably selected from the group mentioned above, depending on the kind of minute solid particles and the use to which the produced dispersion is put.

The reaction system may incorporate therein any of the known monomers, polymers, and various stabilizers in an amount incapable of obstructing the grafting reaction of the minute solid particles.

The method of treatment for surface improvement according to this invention is implemented by placing the minute solid particles and the reactive polymer in the liquid dispersion medium mentioned above and subjecting the resultant mixture to a heating and dispersing treatment. The ratio of the amount of the reactive polymer to that of the minute solid particles cannot be generally defined because it is effected by such factors as the kind of the reactive polymer to be used and the use to which the product is to be put. Appropriately, the amount of the reactive polymer is in the approximate range of 5–500 parts by weight, preferably 20–200 parts by weight, based on 100 parts by weight of the minute solid particles. If the amount of the reactive polymer is less than 5 part by weight, it will possibly become difficult to improve sufficiently the surface properties of the minute solid particles. Conversely, if the amount exceeds 500 parts by weight, the amount of the reactive polymer bound to the surface of the minute solid particles will be large and will possibly degrade the properties properly expected of the minute solid particles.

The heating temperature during the course of stirring and mixing cannot be generally defined because it is affected by such factors as the kind of the reactive polymer to be used. Appropriately, this temperature is in the approximate range of 50–250° C., preferably 80–250° C., and more preferably 100–220° C. If the heating temperature is less than 50° C., the reaction of the reactive group of the reactive polymer with the functional group on the surface of the minute solid particles will fail to proceed sufficiently. Conversely, if the temperature exceeds 250° C., the reaction will proceed abruptly and will not be easily controlled.

The shearing stress which is exerted on the minute solid particles during the dispersing treatment is not particularly limited because it is affected by such factors as the kind of the minute solid particles. Appropriately, however, it is not less than $10^2$ Pa, preferably not less than $10^3$ Pa, and more preferably not less than $10^4$ Pa.

For the purpose of ensuring steady exertion of such proper shearing stress on the minute solid particles being heated and dispersed, this invention contemplates preferably effecting the treatment of dispersion by the use of an apparatus for wet dispersing treatment which comprises a vessel for holding the liquid under treatment therein, a heating device for heating the liquid under treatment held in the vessel, and a plurality of granular dispersing media held in the vessel.

Numerous known apparatuses for wet dispersing treatment or wet pulverizing treatment are available for producing a stirring or disintegrating action by the use of a stirring member in combination with granular dispersing media such as beads. The present invention contemplates using an apparatus which is constructed by adding a heating device for heating the liquid under treatment to such a known apparatus for wet dispersion as mentioned above. Now, a typical example of the construction of this apparatus will be shown below.

Figure 5:
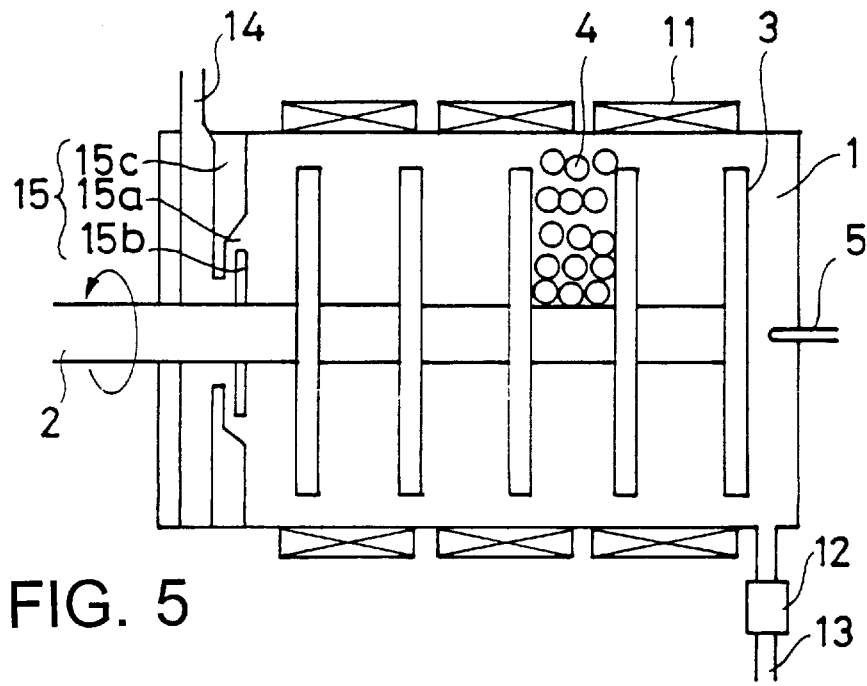
FIG. 5 is a sectional view illustrating schematically the structure of one embodiment of the apparatus for wet dispersion treatment to be used in the method for surface-modifying treatment of minute solid particles according to this invention.
Figure 6:
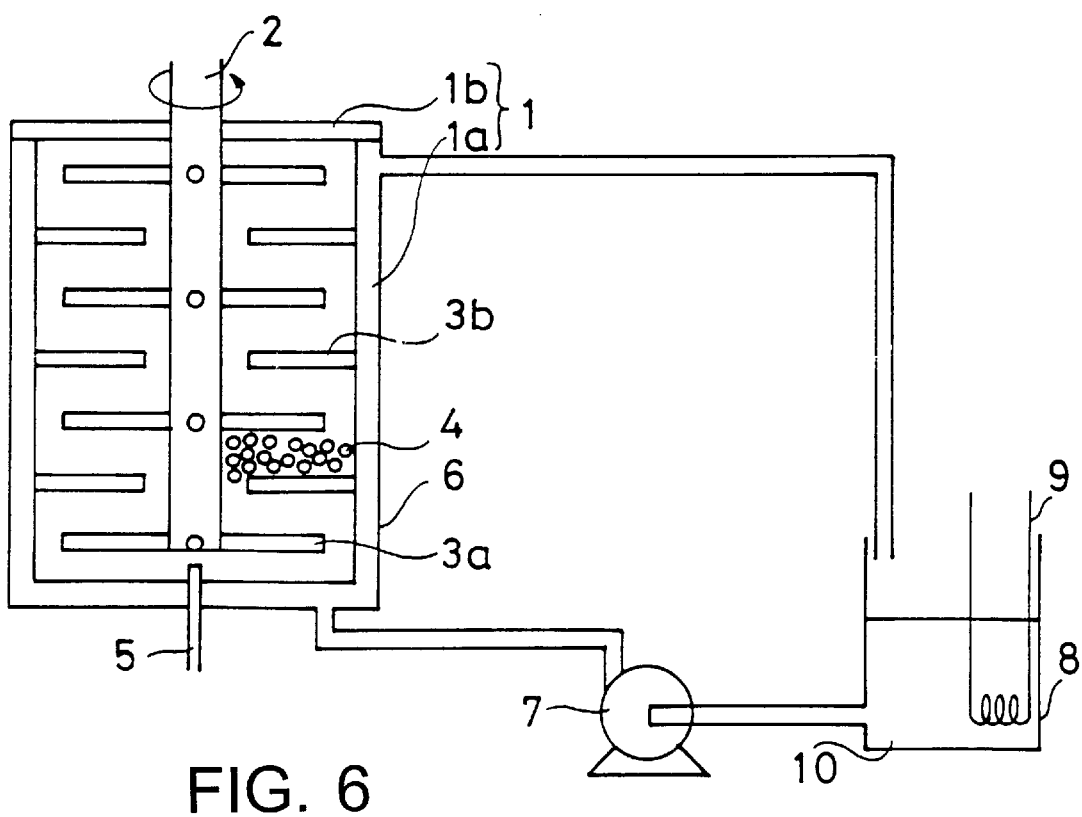
FIG. 6 is a sectional view illustrating schematically the structure of another embodiment of the apparatus for wet dispersion treatment to be used in the method for surface-modifying treatment of minute solid particles according to this invention.

FIG. 5 and FIG. 6 are sectional views which severally illustrate schematically the construction of one embodiment of the apparatus for wet dispersing treatment to be used in the method of treatment for surface improvement of minute solid particles according to this invention.

The apparatus for wet dispersing treatment illustrated in FIG. 5 is a horizontal type apparatus provided with a vessel 1 which is formed of a cylindrical closed container having the axial line positioned in a substantially horizontal direction. A rotary shaft inserting hole is formed in the central part of one of the opposite disklike end plates (on the left side in the bearings of the diagram; hereinafter referred to as "left end plate") in the outer wall of this vessel 1. Through this insertion hole, a rotary shaft 2 is watertightly inserted from outside the vessel into the inner empty space of the vessel along the axial line of the vessel. In the area in which the rotary shaft 2 is disposed in the inner empty space of the vessel, a plurality of disklike stirring members 3 are attached substantially perpendicularly to the rotary shaft 2 as spaced at regular intervals. Outside the vessel, this rotary shaft 2 is connected to a drive device not shown. In the area situated on the upper side of the cylindrical peripheral part of the outer wall of the vessel 1 and closely approximating the left end plate mentioned above, a liquid outlet 14 is provided. In the area situated on the lower side and closely approximating the opposite end plate (hereinafter referred to as "right end plate"), a liquid inlet 13 fitted with a check valve 12 is provided. Thus, this apparatus is adapted for a continuous treatment. The inner empty space of the vessel 1 is packed with numerous spherical beads 4 intended as the dispersing media. In the proximity of the liquid outlet 14, a medium separator 15 provided with a gap 15c incapable of passing the spherical beads 4 and capable of passing the liquid dispersion medium and the minute solid particles. The gap 15c of the medium separator 15 is formed between an annular stationary plate 15a and a rotary disklike part 15b which are disposed substantially perpendicular directions relative to the axial line of the vessel 1. The outer edge of the stationary plate part 15a is connected to the inner wall surface (cylindrical surface part) of the vessel throughout the entire circumference and the rotary disklike part 15b is attached to the rotary shaft 2 in the same manner as the stirring members 3 mentioned above.

A ribbon heater 11 as a heating device is wound round the outer wall surface of this vessel 1 and is so adapted as to heat the liquid held to be dispersed in the inner empty space of the vessel 1. To the right end plate of the vessel 1, a thermocouple 5 for measuring the temperature of the liquid held in the vessel is attached.

In this apparatus, the liquid under treatment, namely a blend consisting of minute solid particles in the state of secondary cohesion, a liquid dispersion medium, and a reactive polymer having a reactive group capable of reacting with the functional group on the surface of the minute solid particles, is subjected to the shear strength which is generated by the rotation of the stirring members 3 and the fluid motion of the spherical beads 4 induced by the rotation and accompanied by the individual rotation and gyration and the mutual contact and collision of the spherical beads 4 and, at the same time, to the heat emitted by the ribbon heater 11, with the result that the minute solid particles are disintegrated and separated as under into primary particles and are gradually dispersed uniformly in the liquid dispersion medium and, at the same time, the reaction of the functional group on the surface of the minute solid particles with the reactive group of the reactive polymer proceeds with high efficiency. The dispersion which is ultimately extracted through the liquid outlet 14 manifests a satisfying state of dispersion immediately after the extraction and retains this state of dispersion stably for a long time thence.

The apparatus for wet dispersing treatment illustrated in FIG. 6 is a vertical and batchwise type apparatus which is provided with a vessel I comprising a cylindrical container proper 1a having the axial line thereof positioned in a substantially vertical direction and containing an opening in the upper end thereof and a lid 1b adapted to cover the opening. A rotary shaft inserting hole is formed in the central part of the lid 1b of the vessel 1. A rotary shaft 2 is inserted through this inserting hole from outside the vessel into the inner empty space of the vessel along the axial line of the vessel. In the area in which the rotary shaft 2 is positioned in the inner empty space of the vessel, a plurality of stirring pins 3a are attached to the rotary shaft at steps spaced with regular intervals in the direction of the axial line of the vessel as radially spread about the axis of rotation in planes substantially perpendicular to the axial line of the vessel. On the inner wall surface of the vessel 1, a plurality of stationary pins 3b are attached at steps separated in the direction of the axial line of the vessel at positions incapable of interfering with the stirring pins 3a mentioned above (namely, in the manner in which two combs are arranged such that the teeth of one comb are meshed with those of the other comb) as radially converged from the inner wall surface to the rotary shaft in planes substantially perpendicular to the axial line of the vessel. The stationary pins 3b, therefore, function as one kind of so-called baffle plates. Outside the vessel, the rotary shaft 2 is connected to a drive device not shown. The inner empty space of the vessel 1 is packed with numerous spherical beads 4 as the dispersing media in the same manner as in the apparatus illustrated in FIG. 5.

A heating jacket 6 is formed round the outer wall of the cylindrical container proper 1a of the vessel 1. This heating jacket 6 is connected to a thermal medium tank 8 provided with a heater 9 through the medium of a circulating pipe having a thermal medium circulating pump 7 inserted therein. It is adapted to heat the liquid held in the inner empty space of the vessel 1 by means of the thermal medium circulated therethrough.

In this apparatus, the liquid placed in the inner empty space of the vessel 1 to be treated, namely a blend consisting of minute solid particles in the state of secondary cohesion, a liquid dispersion medium, and a reactive polymer having a reactive group capable of reacting with the functional group on the surface of the minute solid particles, is given a stirring treatment for a prescribed period and is consequently subjected to the shear strength which is generated by the rotation of the stirring pins 3a and the fluid motion of the spherical beads 4 induced owing to the presence of the stirring pins 3a in motion and the stationary pins 3b and accompanied by the individual rotation and gyration and the mutual contact and collision of the spherical beads 4 and, at the same time, to the heat emitted by the heating jacket 6, with the result that the minute solid particles are disintegrated and separated asunder into primary particles and are gradually dispersed uniformly in the liquid dispersion medium and, at the same time, the reaction of the functional group on the surface of the minute solid particles with the reactive group of the reactive polymer proceeds with high efficiency. The dispersion which is ultimately extracted through the liquid outlet 14 manifests a satisfying state of dispersion immediately after the extraction and retains this state of dispersion stably for a long time thence.

The construction of the apparatus for wet dispersing treatment has been described with reference to the embodiments illustrated in the diagrams. In this apparatus, the heating device for heating the liquid being treated in the vessel may be in any arbitrary mode so long as it is capable of effectively heating the liquid held in the vessel. Besides the system for circulating the thermal medium and the ribbon heater mentioned above, various heating devices such as, for example, a ceramic heater, an infrared heating device, a high frequency induction heater, and a coil heater are available. As respects the position for installation, the heating device does not need to be disposed round the periphery of the vessel as in the embodiments described above but may be disposed in the inner empty space of the vessel so as not to obstruct the rotation of the stirring members. Specifically, it is permissible to attach the heating device to the inner surface of the vessel or to the stirring pin or the rotary shaft, or to the stationary pin or the baffle plate. Among other modes of installation mentioned above, the attachment of the heating device to the periphery of the vessel proves particularly appropriate from the viewpoint of the construction of the apparatus and the control of temperature.

In this apparatus, the basic construction of the apparatus for wet dispersing treatment other than the heating device, the mode of operation or the choice between the continuous and the batchwise operation, the material and shape of the vessel, the material, shape, and position of the stirring members, and the material, shape, and particle diameter of the dispersing media are not particularly limited but may be suitably selected, depending on the reactivity and other chemical properties of the dispersion to be obtained or the minute solid particles to be treated and the specific gravity, grain size, and other physical properties thereof.

As concrete examples of the vessel, horizontal or vertical cylindrical, conical, and semicylindrical vessels, vessels having sections of the letter W or the shape of three sides of a square as found in the vessel disclosed in JP-B-02-27018 or the Diamond fine mill (produced by Mitsubishi Heavy Industries, Ltd.), and a large container having disposed therein a vessel holding therein dispersing media (provided with stirring members or having stirring members forming part of the wall surface of the vessel) as disclosed in JP-B-06-73620 so as to permit flow of a liquid (dispersion) therebetween, which are severally formed of a varying ceramic substance such as alumina, zirconia, steatite, silicon nitride, silicon carbide, or tungsten carbide, a varying kind of glass, or a varying kind of metal such as steel, chromium steel, Hastelloy, or nickel type alloy may be cited.

The material for the stirring member may be suitably selected, similarly to that for the vessel, from among a varying ceramic substance such as alumina, zirconia, steatite, silicon nitride, silicon carbide, or tungsten carbide, a varying kind of glass, or a varying kind of metal such as steel, chromium steel, Hastelloy, or nickel type alloy may be cited. The material may be different from that of the vessel. The shape of the stirring member may be a disk turbine, a fan turbine, a propeller, a spiral vane, a spiral strip, a gate, an anchor, a cylinder, or a paddle, other than the disc and the pin mentioned above. The shape of this sort may be improved by forming holes for passage of a liquid therein. One stirring member may suffice at times and a plurality of stirring members may be needed at other times. It is permissible to provide the stirring member, depending on the shape thereof, with a baffle plate or a stationary pin of a suitable shape. Further, the rotary shaft on which the stirring member is formed may be disposed coaxially with the vessel or displaced from the axis of the vessel. Two or more rotary shafts may be disposed, when necessary.

The dispersing media may be suitably modified, depending on the kind of the minute solid particles to be treated or the shape of the vessel or the stirring device. It may be in the shape of spheres, cylinders, spheroids, etc. which are formed of a varying ceramic substance such as alumina, zirconia, steatite, silicon nitride, silicon carbide, or tungsten carbide, a varying kind of glass, or a varying kind of metal such as steel, chromium steel, Hastelloy, or nickel type alloy. Among other dispersing media cited above, spherical beads formed of alumina, zirconia, steel, or chromium steel and having a diameter in the approximate range of 0.05–20 mm, preferably 0.1–5 mm, prove particularly advantageous. The packing ratio of the dispersing media in the vessel is not particularly limited because it is affected by such factors as the shape of the vessel or the stirring member. It is, however, in the range of 20–90%, preferably 30–80%, of the available inner volume of the vessel. If the packing ratio is unduly small, the minute solid particles in the state of secondary cohesion will not be fully disintegrated and the reaction of the minute solid particles with the reactive polymer will not proceed sufficiently. Conversely, if the ratio is extremely large, the dispersing media will be worn by friction possibly to aggravate contamination.

EXAMPLES

Now, this invention will be described more specifically below with reference to working examples. The following examples are intended solely to facilitate the comprehension of this invention and are not meant to limit this invention in any respect.

The "parts" mentioned herein below refers to "parts by weight" and "%" to "% by weight" unless otherwise specified.

Synthesis of polymer for treatment of carbon black

Synthesis Example 1

In a separable flask provided with stirring vanes and a reflux condenser, 100 parts of phenol novolak epoxy resin (epoxy equivalent weight 180, produced by Toto Kasei K.K. and marketed under product code of "YDPN-638P") and 32 parts of acrylic acid, 0.13 part of chromic chloride hexahydrate, and 0.11 part of methyl hydroquinone added thereto were left reacting at 110° C. for two hours. The resultant reaction product was confirmed to have an acid number of 0. This product was labeled as epoxy acrylate resin (1).

Synthesis Example 2

In a separable flask provided with stirring vanes and a reflux condenser, 100 parts of phenol novolak epoxy resin (epoxy equivalent weight 180, produced by Toto Kasei K.K. and marketed under product code of "YDPN-638P") and 41 parts of acrylic acid, 0.14 part of chromic chloride hexahydrate, and 0.12 part of methyl hydroquinone added thereto were left reacting at 110° C. for two hours. The resultant reaction product was confirmed to have an acid number of 5.5. This product was labeled as epoxy acrylate resin (2).

Synthesis Example 3

In a separable flask provided with stirring vanes and a reflux condenser, 30 parts of cresol novolak epoxy resin (epoxy equivalent weight 200, produced by Toto Kasei K.K. and marketed under product code of "YDPN-638P") and 8.64 parts of acrylic acid, 309.12 parts of ethylene carbitol acetate, 0.04 part of chromic chloride hexahydrate, and 0.03 part of methyl hydroquinone added thereto were left reacting at 110° C. for three hours. The resultant reaction product was confirmed to have an acid number of 0. This product was labeled as epoxy acrylate resin (3). The reaction product was left in the form of a mixture with ethylene carbitol acetate.

Synthesis Example 4

A carboxyl group-containing epoxy acrylate resin (4) having an acid number of 97 was obtained by causing 30 parts of the epoxy acrylate resin (2) obtained in Synthesis Example 2 to react with 42.2 parts of tetrahydrophthalic anhydride and 0.14 part of anhydrous lithium chloride at 100° C. for three hours.

Synthesis Example 5

In 700 parts of deionized water having 0.3 part of polyvinyl alcohol dissolved therein, a mixture prepared in advance by dissolving 24 parts of benzoyl peroxide in a polymerizable monomer mixture consisting of 223.2 parts of styrene, 5.7 parts of 2-hydroxyethyl methacrylate, and 71.1 parts of glycidyl methacrylate was placed and uniformly suspended. Then, the suspension was blown with nitrogen gas and heated to 80° C., left standing at this temperature for five hours to effect polymerization of the monomer mixture, and then cooled to obtain a polymer suspension. This polymer suspension was filtered, rinsed, and dried to obtain a polymer (5) containing epoxy group as a reactive group.

Synthesis Example 6

In a flask provided with a stirrer, an inert gas inlet tube, a reflux condenser, and a thermometer, 400 parts of deionized water having 0.2 part of polyvinyl alcohol dissolved therein was placed. In the deionized water held in the flask, a mixture prepared in advance by dissolving 24 parts of benzoyl peroxide in a polymerizable monomer mixture consisting of 196 parts of styrene and 4 parts of glycidyl methacrylate was placed and uniformly suspended. Then, the suspension was blown with nitrogen gas and heated to 80° C., left to stand at this temperature for five hours to effect polymerization of the monomer mixture, and then cooled to obtain a polymer suspension. This polymer suspension was filtered, rinsed, and dried to obtain a polymer (6) containing epoxy group as a reactive group.

Synthesis Example 7

In 200 parts by weight of ethyl cellosolve acetate, 78.17 parts by weight of polymethyl methacrylate macromonomer (number average molecular weight of 6200; produced by Toa Gosei Chemical Industry Co., Ltd. and marketed under product code of "AA-6") was dissolved, 10.92 parts by weight of styrene and 10.91 parts by weight of glycidyl methacrylate were incorporated, and further 10 parts by weight of azobisbutyronitrile was dissolved as an initiator.

In a separable flask provided with stirring vanes, an inert gas inlet tube, a reflux condenser, a thermometer, and a dropping funnel, 25% of the solution obtained above was placed and polymerized as swept with a $N_2$ stream at 85° C. for 30 minutes. Then, the remainder 75% of the solution was added dropwise to the polymerization system over a period of three hours and left polymerizing at the same temperature. After the dropwise addition was completed, the system was kept at 85° C. for 30 minutes and a solution of 1 part by weight of azobisbutyronitrile in 50 parts by weight of ethyl cellosolve acetate was added thereto. The resultant mixture was kept at 85° C. for one hour, then heated to 95° C. and kept at this temperature for one hour, and cooled. A polymer solution (7) consequently obtained was found to have an involatile content of 28.57% by weight. This polymer solution was distilled to expel the solvent and obtain a polymer (7). The number average molecular weight, Mn, of this polymer (7) was found to be 7500.

Synthesis Example 8

In a separable flask provided with stirring vanes, an inert gas inlet tube, a reflux condenser, a thermometer, and a dropping funnel, 300 parts of 2-butoxyethanol was placed as a solvent and a mixed solution consisting of 200 parts of methyl methacrylate (MMA), 200 parts of hydroxyethyl methacrylate (HEMA), 8.5 parts ($9.2271 \times 10^{-2}$ mol) of thioglycolic acid, and 0.1 part of azobisisobutyronitrile (AIBN) was continuously added dropwise to the solvent under continued introduction of $N_2$ gas at 85° C. over a period of four hours to effect polymerization of the monomer mixture. Then, the system, after adding 0.1 part of AIBN, was heated at the same temperature for two hours.

Subsequently, the system was heated at 95° C. for one hour to terminate the polymerization. This reaction solution and 17.0 parts of glycidyl methacrylate (1.3 times the equivalent weight/COOH), 2.5 parts of tetrabutyl ammonium bromide as a catalyst, and 0.08 part of hydroquinone monomethyl ether as a polymerization inhibitor added thereto were left reacting at a reaction temperature of 95° C. for eight hours, and then cooled, to obtain a polymer solution of a terminal methacrylate type MMA-HEMA copolymer type macromonomer having a number average molecular weight, Mn, of 7000, the polymer solution having an involatile content of 57.14%.

In a mixture consisting of 10.92 parts by weight of styrene, 10.91 parts by weight of glycidyl methacrylate, 136.8 parts by weight of the polymer solution mentioned above (containing 78.17 parts by weight of the macromonomer), and 141.4 parts by weight of 2-butoxy ethanol, 10 parts by weight of dimethyl-1,1'-azobis-isobutyrate was dissolved as a polymerization initiator.

In a separable flask provided with the same dropping funnel as used in Synthesis Example 7, the mixture was polymerized to obtain a polymer solution (8). This polymer solution had an involatile content of 28.61%. The produced polymer (8) was found to have a number average molecular weight, Mn, of 7800.

Synthesis Example 9

A polymer solution (9) was obtained by faithfully repeating the procedure of Synthesis Example 7 while using 10.91 parts by weight of styrene monomer in the place of 10.91 parts by weight of glycidyl methacrylate. The produced polymer solution (9) had a number average molecular weight, Mn, of 7500 and an involatile content of 28.57% by weight.

Synthesis Example 10

In a separable flask provided with stirring vanes, an inert gas inlet tube, a reflux condenser, a thermometer, and a dropping funnel, 250 parts of toluene and 50 parts of methylethyl ketone were placed as solvents and a mixed solution consisting of 350 parts of methyl methacrylate (MMA), 50 parts of hydroxyethyl methacrylate (HEMA), 8.5 parts ($9.2271 \times 10^{-2}$ mol) of thioglycolic acid, and 0.1 part of azobisbutyronitrile (AIBN) was continuously added dropwise to the solvent under continued introduction of $N_2$ gas at 85° C. over a period of four hours to effect polymerization of the monomer mixture. Then, the system, after adding 0.1 part of AIBN, was heated at the same temperature for two hours.

Subsequently, the system was heated at 95° C. for one hour to terminate the polymerization. This reaction solution and 17.0 parts of glycidyl methacrylate (1.3 times the equivalent weight/COOH), 2.5 parts of tetrabutyl ammonium bromide as a catalyst, and 0.08 part of hydroquinone monomethyl ether as a polymerization inhibitor added thereto were left reacting at a reaction temperature of 95° C. for eight hours and then cooled, to obtain a polymer solution. This polymer solution was reprecipitated with n-hexane and dried under a reduced pressure for two days to obtain a uniterminal methacrylate type poly(methyl methacrylate-hydroxy ethyl methacrylate) macromonomer having a number average molecular weight, Mn, of 7000.

A monomer composition was obtained by dissolving 75 parts of the poly(methyl methacrylate-hydroxy ethyl methacrylate) macromonomer containing a uniterminal methacryloyl group, 15.2 parts of styrene monomer, 9.8 parts of isopropenyl oxazoline monomer, and 3 parts of azobisbutyronitrile as a polymerization initiator in 100 parts of ethyl cellosolve acetate.

Separately, in the same flask as used above, 50 parts of ethyl cellosolve acetate was placed and then heated. After the temperature of the ethyl cellosolve acetate reached 80° C., the monomer composition prepared above was added to the hot acetate at the same temperature over a period of two hours, subsequently polymerized at 80° C. for two hours, then heated to 95° C. and left aging for two hours, to obtain a polymer solution (10) having an involatile content of 40.0%.

Synthesis Example 11

A polymer solution (11) containing therein double bond was obtained by adding 8.9 parts of methacryloyl isocyanate (molecular weight 111.1) dropwise over a period of 30 minutes at room temperature (25° C.±5° C.) to 250 parts of the polymer solution (10) of an involatile content of 40% obtained in Synthesis Example 10 and stirring the resultant mixture for three hours.

Synthesis Example 12

In a separable flask provided with stirring vanes, an inert gas inlet tube, a reflux condenser, a thermometer, and a dropping funnel, 700 parts of ethylene glycol monomethyl ether acetate (ECA) was placed as a solvent and a mixed solution consisting of 180 parts of methyl methacrylate (MMA), 20 parts of hydroxyethyl methacrylate (HEMA), 8.5 parts ($9.2271 \times 10^{-2}$ mol) of thioglycolic acid, and 0.1 part of azobisbutyronitrile (AIBN) was continuously added dropwise to the solvent under continued introduction of $N_2$ gas at 85° C. over a period of four hours to effect polymerization of the monomer mixture. Then, the system, after adding 0.1 part of AIBN, was heated at the same temperature for two hours.

Subsequently, the system was heated at 95° C. for one hour to terminate the polymerization. This reaction solution and 17.0 parts of glycidyl methacrylate (1.3 times the equivalent weight/COOH), 2.5 parts of tetrabutyl ammonium bromide as a catalyst, and 0.08 part of hydroquinone monomethyl ether as a polymerization inhibitor added thereto were left reacting at a reaction temperature of 95° C. for eight hours and then cooled. The resultant reaction solution was reprecipitated in n-hexane and then dried under a reduced pressure at 50° C. for two days, to obtain a terminal methacrylate type MMA-HEMA copolymer type macromonomer polymer (12) having an average molecular weight of 7000.

A polymerizable monomer composition was obtained by dissolving 3 parts of AIBN as an initiator in 60 parts of the macromonomer (12) obtained above, 15 parts of hydroxyethyl methacrylate (HEMA), 15.2 parts of styrene (St), 9.8 parts of isopropenyl oxazoline (IPO), and 100 parts of ECA.

In a separable flask provided with a stirrer, a condenser, a dropping funnel, and a $N_2$ inlet, 50 parts of ECA was placed, heated to 80° C., and then left standing at this temperature.

The polymerizable monomer composition mentioned above was placed in the dropping funnel and dropped to the hot ECA at 80° C. over a period of three hours. Further at the same temperature, the composition was polymerized for two hours and left aging at 95° C. for three hours, to obtain a graft copolymer (12) having an involatile content of 40%.

Synthesis Example 13

In a separable flask provided with stirring vanes, an inert gas inlet tube, a reflux condenser, a thermometer, and a dropping funnel, 200 parts of propylene glycol monomethyl ether acetate (PGM-Ac) was placed as a solvent and a mixed solution consisting of 120 parts of benzyl methacrylate (BzMA), 80 parts of hydroxypropyl methacrylate (HPMA), 3 parts of thioglycolic acid, and 0.03 part of AIBN as an initiator was continuously added dropwise to the solvent under continued introduction of $N_2$ gas at 80° C. over a period of four hours to effect polymerization of the monomer mixture. Further, the polymerization was continued for four hours, with 0.02 part of AIBN added thereto at intervals of 30 minutes. The system was heated at 95° C. for two hours to terminate the polymerization.

The reaction solution thus obtained and 4.70 parts of isopropenyl oxazoline and 0.08 part of hydroquinone monomethyl ether as a polymerization inhibitor added thereto were left reacting at a reaction temperature of 100° C. for two hours and then cooled, to obtain a terminal isopropenyl type BzMA-HEMA copolymer type macromonomer (13) having an average molecular weight of 5000.

A polymerizable monomer composition was obtained by dissolving 3 parts of AIBN as an initiator in 75 parts of the macromonomer (13) obtained above, 15 parts of styrene, 10 parts of isopropenyl oxazoline, and 10.0 parts of PGM-AC.

In a separable flask provided with a stirrer, a condenser, a dropping funnel, and a $N_2$ inlet, 50 parts of PGM-Ac was placed, heated to 80° C., and then left standing at this temperature. The polymerizable monomer composition mentioned above was placed in the dropping funnel and dropped to the hot PGM-Ac at 80° C. over a period of three hours, polymerized at 80° C., further polymerized at the same temperature for two hours, then left aging at 110° C. for two hours, to obtain a graft copolymer (13) having an involatile content of 40%.

Synthesis Example 14

A polymerizable monomer composition was obtained by placing in a flask 40 parts of a uniterminal methacryloylated polymethyl methacrylate as a macromonomer having a molecular weight of about 6000 (produced by Toa Gosei Chemical Industry Co., Ltd. and marketed under product code of "AS-6"), 25 parts of styrene, 10 parts of isopropenyl oxazoline, and 25 parts of tetrahydropyranyl methacrylate and dissolving therein 100 parts of PGM-Ac as a solvent and 5 parts of AIBN as an initiator.

In a separable flask provided with a stirrer, a condenser, a dropping funnel, and a $N_2$ inlet, 50 parts of PGM-Ac was placed and heated to 80° C. The polymerizable monomer composition mentioned above was placed in the dropping funnel and dropped to the hot PGM-Ac over a period of three hours, and polymerized at 80° C. Further, it was left standing at this temperature for four hours to terminate the polymerization, to obtain a graft copolymer (14) having an involatile content of 40%.

Synthesis Example 15

A polymerizable monomer composition was obtained by dissolving 3 parts of AIBN as an initiator in 60 parts of the macromonomer (12) obtained in Synthesis Example 12, 15 parts of acrylic acid, 15.2 parts of styrene, 9.8 parts of isopropenyl oxazoline, and 100 parts of ECA.

In the same separable flask as used in Synthesis Example 2, 50 parts of ECA was placed, heated to 80° C., left standing at this temperature. The polymerizable monomer composition mentioned above was added dropwise to the hot ECA in the flask over a period of three hours. When the polymerization was continued for two hours after completion of the dropwise addition, the polymer solution stuck to the stirring rod and gelled thereon.

Synthesis Example 16

A polymerizable monomer composition was obtained by dissolving 75 parts of a uniterminal methacryloyl group-containing poly(methyl methacrylate-hydroxyethyl methacrylate) macromonomer (produced by Toa Gosei Chemical Industry Co., Ltd. and marketed under product code "AA-714"), 15 parts of styrene, 10 parts of isopropenyl oxazoline, and 3 parts of AIBN in 100 parts of PGM-Ac.

In a separable flask provided with a stirrer, a reflux condenser, a thermometer, a dropping funnel, and a $N_2$ inlet, 50 parts of PGM-Ac was placed and heated to 80° C. The polymerizable monomer composition mentioned above was placed in the dropping funnel and dropped to the hot PGM-Ac over a period of three hours, and polymerized at 80° C. Further, it was left standing at this temperature for two hours to continue the polymerization, then heated to 120° C. and aged for two hours, to obtain a graft copolymer (16) having an involatile content of 40%.

Synthesis Example 17

A polymer solution (17) having an involatile content of 40% was obtained by following the procedure of Synthesis Example 16 while using dimethyl aminoethyl methacrylate in the place of isopropenyl oxazoline.

Synthesis Example 18

A polymer solution (18) having an involatile content of 40% was obtained by following the procedure of Synthesis Example 16 while using methacrylic acid in the place of isopropenyl oxazoline.

Synthesis Example 19

In a separable flask provided with stirring vanes, an inert gas inlet tube, a reflux condenser, and a thermometer, 75 parts of methoxy polyethylene glycol methacrylate having a double bond at one terminal thereof (produced by Shinnakamura Kagaku Kogyo K.K. and marketed under trademark designation of "NK Ester M-230G"), 15 parts of styrene, 10 parts of isopropenyl oxazoline, and 3 parts of 2,2'-azobis(2, 4-dimethyl valeronitrile) were placed and polymerized at 75° C. for five hours under a stream of $N_2$ gas, to obtain a polymer solution (19) having an involatile content of 50%, the polymer containing oxazoline group as a reactive group in the molecular unit thereof and having ethyleneglycol chain.

Synthesis Example 20

In the same flask as in Synthesis Example 19, 1040 parts of lauryl alcohol (ethylene oxide)$_{15}$ glycidyl ether (having an epoxy equivalent of 1040, produced by Nagase Kasei Kogyo K.K. and marketed under trademark designation of "Denakol EX-171") and 500 parts of ethanol were placed, 72 parts of acrylic acid, a catalytic amount of pyridine, and 150 ppm of hydroquinone were added thereto, and they were left reacting at 70° C. for two hours. The resultant reaction mixture was distilled under a reduced pressure to expel ethanol and obtain lauryl alcohol (ethylene oxide)$_{15}$ having a double bond at one terminal thereof.

A polymer solution (20) having an involatile content of 50% and containing a lauryl alcohol (ethylene oxide)$_{15}$ chain was obtained by adding 3 parts of 2,2'-azobis(2,4-dimethyl valeronitrile) as an initiator to 75 parts of the lauryl alcohol (ethylene oxide)$_{15}$, 100 parts of ethanol, 15 parts of styrene, and 10 parts of glycidyl methacrylate thereby setting the monomers polymerizing under a stream of N$_2$ gas at 75° C. for six hours.

Synthesis Example 21

A polymerizable monomer composition was obtained by dissolving 169.2 parts of stearyl methacrylate in 72.5 parts of toluene and adding to the resultant solution 9.2 parts of thioglycolic acid and 0.82 part of azobisbutyronitrile (AIBN) as an initiator.

In the same separable flask as in Synthesis Example 8, 87 parts of toluene was placed, the monomer composition mentioned above was added dropwise thereto at a reaction temperature of 80° C. over a period of four hours, and they were continuously heated at the same temperature for two hours. Then, the reaction mixture was polymerized at 95° C. for three hours, with 0.2 part of AIBN added thereto at intervals of 30 minutes, left aging, and cooled. The resultant polymer and 18.5 parts of glycidyl methacrylate, 0.06 part of hydroquinone monomethyl ether, and 1.7 parts of N,N-dimethyl lauryl amine added thereto were left reacting at 110° C. for eight hours. The resultant reaction mixture was cooled, reprecipitated with methanol, and dried under a reduced pressure, to obtain polystearyl methacrylate macromonomer.

A polymerizable monomer composition was obtained by dissolving 75 parts of the polystearyl methacrylate macromonomer, 15 parts of styrene, 10 parts of isopropenyl oxazoline, and 5 parts of AIBN in 100 parts of toluene.

In a separable flask provided with a stirrer, a condenser, a dropping funnel, and a N$_2$ inlet, 50 parts of toluene was placed and heated to 80° C. The polymerizable monomer composition mentioned above was placed in the dropping funnel and dropped to the hot toluene over a period of three hours, and polymerized at 80° C. It was aged, treated to terminate the polymerization, and cooled. The resultant polymer was reprecipitated with methanol and dried under a vacuum, to obtain a graft copolymer (21).

Synthesis Example 22

In a metallic reaction vessel having an inner volume of 1 liter and provided with a gas inlet tube, a distillation device connecting tube extended to a condenser provided with a receptacle, and stirring vanes, 300 g of 11 undeca amino acid and 25.67 g of crotonic acid were placed.

The reaction vessel was purged with N$_2$ gas and, with all the valves thereof fully closed, heated to 210° C. and pressed to 5 bars for 40 minutes. Then, the contents of the reaction vessel were decompressed to 0.5 mbar and, as kept stirred and exposed to the N$_2$ gas introduced thereto at a rate of 30 liters/hour, heated continuously at 210° C. for four hours. The decompressed state at 0.5 mbar was retained for one hour to terminate the reaction, to obtain a polyamide having an unsaturated double bond at one terminal and a carboxyl group at the other terminal.

The polyamide, after adding dodecyl oxazoline of an equimolar amount relative to the carboxyl group thereof, was held under an increased pressure to eliminate the terminal carboxyl group. The synthesized macromonomer was extracted from the reaction vessel into a water tank so as to preclude the otherwise possible oxidation with the ambient air. Then, this macromonomer was isolated at 50° C. under a vacuum over a period of 15 hours and dried under a vacuum, to obtain a polyamide macromonomer having a double bond at one terminal thereof.

A polymerizable monomer composition was obtained by dissolving 75 parts of the polyamide macromonomer obtained as described, 15 parts of butyl methacrylate, 10 parts of isopropenyl oxazoline, and 3 parts of AIBN in 100 parts of ethanol.

In a separable flask provided with a stirrer, a condenser, a dropping funnel, and a N$_2$ inlet, 50 parts of ethanol was placed and heated to 75° C. The polymerizable monomer composition mentioned above was placed in the dropping funnel and dropped to the hot ethanol over a period of three hours, and polymerized at the same temperature for two hours. The resultant polymer was further heated, polymerized under reflux, aged, and then cooled. Subsequently, it was reprecipitated with ethanol and dried under a vacuum, to obtain a graft copolymer (22).

Synthesis Example 23

A polymerizable monomer composition was obtained by dissolving 4 parts of AIBN and 2.55 parts of β-mercapto propionic acid in 100 parts of N-vinyl pyrrolidone. In the same separable flask as in Synthesis Example 8, 100 parts of ethanol was placed and the monomer composition mentioned above was added dropwise to the hot ethanol at a reaction temperature of 75° C. over a period of four hours, and they were continuously heated at the same temperature for two hours. Subsequently, the resultant reaction mixture was polymerized and aged, with 0.2 part of AIBN added four times at intervals of 30 minutes, and then cooled. The polymer consequently obtained was reprecipitated in ether, washed with THF, and dried under a vacuum.

The resultant polymer was dissolved in DMF. To the solution were added 1.3 times its equivalent weight of chloromethyl styryl and an aqueous 50% NaOH solution. The resultant mixture was stirred at 30° C. for 24 hours to effect a reaction. Then, the reaction mixture was reprecipitated with ether, washed with THF, again reprecipitated with ethanol, and dried under a reduced pressure, to obtain polyvinyl pyrrolidone macromonomer having a styryl terminal.

Thereafter, a graft copolymer (23) was obtained by following the procedure of Synthesis Example 22 while using the polyvinyl pyrrolidone macromomer obtained above in the place of the polyamide macromonomer.

Synthesis Example 24

A polyester is synthesized from unsaturated dibasic acids (maleic acid, coumaric acid, itaconic acid, mesahydrochloric acid, etc.) so formulated as to contain about one unsaturated group per molecular chain. Then, the carboxyl group at the terminal of this polyester is hindered by esterification with a monohydric alcohol or hindered with a monovalent oxazoline compound or aziridine compound. A graft copolymer (24) having a polyester structure as a segment (B) and a polystyrene structure containing an epoxy group as a reactive group as a segment (A) is obtained by polymerizing styrene and glycidyl methacrylate in the presence of this polyester.

Synthesis Example 25

In 100 parts of xylene, 75 parts of higher alcohol having a hydroxyl group at a terminal of a long-chain saturated hydrocarbon (melting point 99° C. and hydroxyl group value 65 mgKOH/g; produced by Toyo Petrolite K.K. and marketed under trademark designation of "Enilin 700") is placed and melted at 120° C. therein.

Into the resultant solution, 9.65 parts of methacroyl isocyanate is added dropwise to effect introduction of a double bond to the terminal of the alcohol.

To the solution, a solution prepared in advance of 15 parts of styrene, 10 parts of isopropenyl oxazoline, 250 parts of xylene, and 0.2 part of AIBN is added dropwise at a temperature of 120° C. over a period of two hours to effect polymerization. The resultant polymerization solution is cooled, to obtain a graft copolymer (25) having a polyalkylene structure as a segment (B) and a polystyrene structure containing an oxazoline group as a reactive group as a segment (A).

Synthesis Example 26

In a flask provided with a stirrer, an inert gas inlet tube, a reflux condenser, a dropping funnel, and a thermometer, 112.5 parts of cyclohexanone was placed and heated to 80° C.

In a solution of 35 parts of styrene, 35 parts of hydroxy methacrylate, and 5 parts of isopropenyl oxazoline, 7.5 parts of azobisbutyronitrile (AIBN) was dissolved. The resultant solution was placed in the dropping funnel and added dropwise to the hot cyclohexanone at 80° C. over a period of three hours and further heated at the same temperature for two hours to effect polymerization.

The resultant polymerization solution, after adding 0.3 part of AIBN, was left aging at 120° C. for two hours and then cooled, to obtain a polymer (26) having an involatile content of 40% and containing both a group capable of reacting with carbon black and a hydroxyl group.

Synthesis Example 27

To 17.5 parts of the solution (involatile content 40%) of the polymer (26) obtained in Synthesis Example 26, 6.73 g of methacryloyl isocyanate (molecular weight 111.1) was added dropwise at room temperature for 30 minutes to effect introduction of a double bond to the polymer and 10.02 parts of cyclohexanone was further added, to obtain a polymer solution (27) (involatile content 40%) of a polymer (27) having a group capable of reacting with carbon black, a double bond, and a hydroxyl group.

Synthesis Example 28

In a separable flask provided with stirring vanes, an inert gas inlet tube, a reflux condenser, and a thermometer, 75 parts of methoxy polyethylene glycol methacrylate having a double bond at one terminal thereof (produced by Shinnakamura Kagaku Kogyo K.K. and marketed under trademark designation of "NK Ester M-230G"), 15 parts of styrene, 10 parts of 2-(1-aziridinyl)ethyl methacrylate, and 3 parts of 2,2'-azobis (2,4-dimethyl valeronitrile) as an initiator were placed and polymerized at 75° C. for five hours under a stream of $N_2$ gas, to obtain a polymer solution (28) having an involatile content of 50%, the polymer containing an aziridine group as a reactive group in the molecular unit thereof and having an ethylene glycol chain.

Production of processed carbon black

Example 1

A processed carbon black (ExA-1) was obtained by mixing 30 parts of the epoxy acrylate resin (1) obtained in Synthesis Example 1 and 30 parts of carbon black (produced by Mitsubishi Chemical Industries, Ltd. and marketed under product code of "MA-100R") by the use of a Laboplastmill (produced by Toyo Seiki K.K.) under the conditions of 140° C. and 100 rpm, cooling the resultant mixture, and pulverizing the cooled mixture.

Example 2

A processed carbon black (ExB-1) was obtained by adding 4.8 parts of tetrahydrophthalic anhydride and 0.01 part of anhydrous lithium chloride to 30 parts of the carbon black (ExA-1) obtained in Example 1, allowing them to react at 100° C. for three hours, and cooling and pulverizing the resultant reaction mixture.

Example 3

A mixture (ExA-2) of ethyl processed carbon and a processed carbon black (ExA-2), the processed carbon black content being of 20%, was obtained by placing 38.64 parts of carbon black (produced by Mitsubishi Chemical Industries, Ltd. and marketed under product code of "MA-100R") in the mixture of the epoxy acrylate resin (3) and ethylene carbitol acetate obtained in Synthesis Example 3, adding 800 parts of stainless steel beads, 3 mm in diameter, and stirring them together at 140° C. for 30 minutes.

Control 1

A processed carbon black for comparison (Co-1) was obtained by mixing 30 parts of the epoxy acrylate resin (1) containing substantially no epoxy group obtained in Synthesis Example 2 and 30 parts of carbon black (produced by Mitsubishi Chemical Industries, Ltd. and marketed under product code of "MA-100R") by the use of a Laboplastmill (produced by Toyo Seiki K.K.) under the conditions of 140° C. and 100 rpm and then cooling and pulverizing the resultant mixture.

Control 2

A processed carbon black for comparison (Co-2) was obtained by adding 4.8 parts of tetrahydrophthalic anhydride and 0.01 part of anhydrous lithium chloride to 30 parts of the carbon black graft polymer (Co-1) obtained in Control 1, allowing them to react at 100° C. for three hours, and cooling and pulverizing the resultant reaction mixture.

Control 3

A processed carbon black for comparison (Co-3) was obtained by mixing 30 parts of the same phenol novolak epoxy resin (epoxy equivalent weight 180; produced by Toto Kasei K.K. and marketed under product code of "YDPN-638P") as used in Synthesis Example 1 and 30 parts of carbon black (produced by Mitsubishi Chemical Industries, Ltd. and marketed under product code of "MA-100R") by the use of a Laboplastmill (produced by Toyo Seiki K.K.) under the conditions of 140° C. and 100 rpm and then cooling and pulverizing the resultant mixture.

Control 4

A processed carbon black for comparison (Co-4) was obtained by mixing 30 parts of the polymer (6) obtained in Synthesis Example 6 and 30 parts of carbon black (produced by Mitsubishi Chemical Industries, Ltd. and marketed under product code of "MA-100R") by the use of a Laboplastmill (produced by Toyo Seiki K.K.) under the conditions of 140° C. and 100 rpm and then cooling and pulverizing the resultant mixture.

Example 4

In 50 parts of ethyl carbitol acetate, 50 parts of the polymer (5) obtained in Synthesis Example 5 was dissolved.

Then, 100 parts of the resultant mixture and 5.4 parts of acrylic acid, 0.06 part of triethyl benzyl ammonium chloride, and 0.04 part of benzoquinone added thereto were left reacting at 110° C. for two hours.

In a separable flask provided with stirring vanes and a reflux condenser, 57.1 parts of the polymer obtained above, 30 parts of carbon black (produced by Mitsubishi Chemical Industries, Ltd. and marketed under product code of "MA-100R"), and 212.9 parts of ethylene carbitol acetate were placed, 800 parts of stainless steel beads, 3 mm in diameter, were added, and they were stirred at 160° C. for 30 minutes, to obtain a mixture (ExA-3) of a processed carbon black (ExA-3) and ethylene carbitol acetate, the content of the processed carbon black being of 20%.

Control 5

A mixture was prepared by dissolving 15 parts of the polymer (5) obtained in Synthesis Example 5 in 15 parts of ethyl carbitol acetate. In a separable flask provided with stirring vanes and a reflux condenser, 30 parts of the mixture mentioned above, 45 parts of carbon black (produced by Mitsubishi Chemical Industries, Ltd. and marketed under product code of "MA-100R"), and 225 parts of ethylene carbitol acetate were placed, 800 parts of stainless steel beads, 3 mm in diameter, were added, and they were stirred at 160° C. for 30 minutes, to obtain a mixture (Co-5) of a processed carbon black for comparison (Co-5) and ethylene carbitol acetate, the content of the processed carbon black being of 20%.

Control 6

In 50 parts of ethyl carbitol acetate, 50 parts of the polymer (5) obtained in Synthesis Example 5 was dissolved. Then, 100 parts of the resultant mixture and 6.2 parts of acrylic acid, 0.06 part of triethyl benzyl ammonium chloride, and 0.04 part of benzoquinone added thereto were left reacting at 110° C. for two hours.

In a separable flask provided with stirring vanes and a reflux condenser, 56.7 parts of the polymer obtained above, 30 parts of carbon black (produced by Mitsubishi Chemical Industries, Ltd. and marketed under product code of "MA-100R"), and 213.3 parts of ethylene carbitol acetate were placed, 800 parts of stainless steel beads, 3 mm in diameter, were added, and they were stirred at 160° C. for 30 minutes, to obtain a mixture (Co-6) of a processed carbon black (Co-6) and ethylene carbitol acetate, the content of the processed carbon black being of 20%.

Control 7

In a separable flask provided with stirring vanes and a reflux condenser, 60 of carbon black (produced by Mitsubishi Chemical Industries, Ltd. and marketed under product code of "MA-100R") and 240 parts of ethylene carbitol acetate were placed, 800 parts of stainless steel beads, 3 mm in diameter, were added, and they were stirred at 160° C. for 30 minutes, to obtain a mixture (Co-7) of the carbon black and ethylene carbitol acetate, the content of carbon black being of 20%.

Example 5

In a separable flask provided with a thermometer, stirring vanes, and a condenser, 23.35 parts of the polymer solution (7) obtained in Synthesis Example 7, 20 parts of carbon black (produced by Mitsubishi Chemical Industries, Ltd. and marketed under product code of "MA-100R"), and 56.65 parts of ethyl cellosolve acetate were placed and dispersed, 600 parts of SUS beads were placed, and they were stirred at 300 rpm and heated at 160° C. for two hours to effect a grafting reaction. In the resultant reaction solution, 100 parts of ethyl cellosolve acetate was placed and uniformly dispersed. Then, the reaction mixture and the SUS beads were separated to obtain a dispersion (ExC-1) containing a processed carbon black (ExC-1).

Example 6

In the same apparatus as in Example 5, 23.35 parts of the polymer solution (8) obtained in Synthesis example 8, 20 parts of carbon black (produced by Mitsubishi Chemical Industries, Ltd. and marketed under product code of "MA-100R"), and 56.65 parts of butyl cellosolve were placed and then treated by following the procedure of Example 5 to obtain a dispersion (ExC-2) containing a processed carbon black (ExC-2).

Referential Example 1

In a separable flask provided with a thermometer, stirring vanes, and a condenser, 6.67 parts of the polymer solution (7) obtained in Synthesis Example 7, 20 parts of carbon black (produced by Mitsubishi Chemical Industries, Ltd. and marketed under product code of "MA-100R"), and 73.33 parts of butyl cellosolve were placed and then treated in the same manner as in Example 5 to obtain a dispersion (ReC-1) having the carbon black content of 20%. When this dispersion (ReC-1) was compared with the dispersion (ExC-1) of Example 5, it was found that the dispersion (ReC-1) generated precipitation in a form inducing phase separation, indicating that the selection of a liquid dispersion medium was not highly satisfactory.

Example 7

In a separable flask provided with a thermometer, stirring vanes, and a condenser, 23.4 parts of the polymer solution (16) obtained in Synthesis Example 16, 31.2 parts of carbon black (pH 3.1), and 101.4 parts of propylene glycol monomethyl ether acetate were placed and dispersed, 800 parts of zirconia beads were placed, and they were stirred at 700 rpm and heated at 100° C. for one hour to effect a grafting reaction. Then, the reaction mixture and the zirconia beads were separated to obtain a dispersion (ExC-3) containing a processed carbon black (ExC-3).

Example 8

A dispersion (ExC-4) containing a processed carbon black (ExC-4) was obtained by following the procedure of Example 7 while using 78.0 parts of the polymer solution (16), 31.2 parts of the carbon black, and 46.8 parts of the propylene glycol monomethyl ether acetate instead.

Control 8

A carbon black mixed solution for comparison (Co-8) was obtained by repeating the procedure of Example 5 while using the polymer solution for comparison (9) obtained in Synthesis Example 9.

Control 9

In the same apparatus as in Example 5, 6.67 parts of the polymer (6) for comparison obtained in Synthesis Example 6, 20 parts of carbon black (produced by Mitsubishi Chemical Industries, Ltd. and marketed under product code of "MA-100R"), and 73.33 parts of ethyl cellosolve acetate were placed and dispersed, 600 parts of SUS beads were placed. Then, they were left reacting under the same conditions as in Example 1. The resultant reaction solution and 100 parts of ethyl cellosolve acetate added thereto were uniformly dispersed. Then, the reaction mixture and the SUS beads were separated to obtain a dispersion (Co-9) containing a processed carbon black for comparison (Co-9).

Control 10

A dispersion (Co-10) containing a processed carbon black for comparison (Co-10) was obtained by following the procedure of Example 7 while using the polymer solution for comparison (17) obtained in Synthesis Example 17 in the place of the polymer solution (16) and using the treatment at 40° C. for one hour in the place of the treatment at 100° C. for one hour.

Control 11

A dispersion (Co-11) containing a processed carbon black (Co-11) for comparison was obtained by following the procedure of Example 8 while using the polymer solution for comparison (17) obtained in Synthesis Example 17 in the place of the polymer solution (16) and using the treatment at 40° C. for one hour in the place of the treatment at 100° C. for one hour.

Control 12

A dispersion (Co-12) containing a processed carbon black for comparison (Co-12) was obtained by following the procedure of Example 7 while using the polymer solution for comparison (18) obtained in Synthesis Example 18 in the place of the polymer solution (16) and using the treatment at 40° C. for one hour in the place of the treatment at 100° C. for one hour.

Control 13

A dispersion (Co-13) containing a processed carbon black for comparison (Co-13) was obtained by following the procedure of Example 8 while using the polymer solution for comparison (18) obtained in Synthesis Example 18 in the place of the polymer solution (16) and using the treatment at 40° C. for one hour in the place of the treatment at 100° C. for one hour.

Example 9

In a separable flask provided with a thermometer, stirring vanes, and a condenser, 30 parts of carbon black (produced by Mitsubishi Chemical Industries, Ltd. and marketed under product code of "MA-100R"), 22.5 parts of the polymer solution (10) having an involatile content of 40% obtained in Synthesis Example 10, and 97.5 parts of ethyl cellosolve acetate were placed and dispersed.

Subsequently, 800 parts of zirconia beads were placed in the flask. The content of the flask was stirred at 300 rpm and heated at 100° C. for two hours to effect a grafting reaction. The resultant reaction solution and 50 parts of ethyl cellosolve acetate added thereto were uniformly dispersed. Then, the reaction mixture and the zirconia beads were separated to obtain a dispersion (ExC-5) containing a processed carbon black (ExC-5).

Example 10

A dispersion (ExD-1) containing a processed carbon black (ExD-1) was obtained by faithfully repeating the procedure of Example 9 while using 20.6 parts of the polymer solution (11) having an involatile content of 43.6% obtained in Synthesis Example 11 and 108.4 parts of ethyl cellosolve acetate in the place of 22.5 parts of the polymer solution (10) having an involatile content of 40% and 97.5 parts of ethyl cellosolve acetate.

Example 11

In a separable flask provided with a thermometer, stirring vanes, and a condenser, 30 parts of carbon black (produced by Mitsubishi Chemical Industries, Ltd. and marketed under product code of "MA-100R"), 22.5 parts of the polymer solution (12) having an involatile content of 40% obtained in Synthesis Example 12, and 97.5 parts of ethyl cellosolve acetate were placed and dispersed.

Subsequently, 800 parts of zirconia beads were placed in the flask. The content of the flask was stirred at 300 rpm and heated at 100° C. for three hours to effect a grafting reaction and cooled. Then, the reaction mixture and the zirconia beads were separated to obtain a dispersion (ExC-6) containing a processed carbon black (ExC-6).

Example 12

A dispersion (ExE-1) containing a processed carbon black (ExE-1) of which both the chain (A) and the chain (B) have carboxyl groups was obtained by adding 1.49 parts of succinic anhydride (molecular weight 100.07) and 0.009 part of lithium chloride as a catalyst to 150 parts of the dispersion (ExC-6) obtained in Example 11 and allowing them to react at 100° C. for 12 hours.

Example 13

A dispersion (ExE-2) containing a processed carbon black (ExE-2) of which both the chain (A) and the chain (B) have carboxyl groups was obtained by adding 2.86 parts of trimellitic anhydride (molecular weight 192.13) and 0.001 part of 1,8-diaza-bicyclo[5,4,0]-7-undecene (DBU) to 150 parts of the dispersion (ExC-6) obtained in Example 11 and allowing them to react at 80° C. for 30 minutes.

Example 14

In the same separable flask as in Example 11, 30 parts of carbon black (produced by Degussa K.K. and marketed under product code of "SB-250"), 22.5 parts of the graft copolymer (13) obtained in Synthesis Example 13, 97.5 parts of PGM-Ac, and 800 parts of zirconia beads were placed.

Then, the content of the flask was stirred at 700 rpm and heated at 100° C. for one hour to effect a reaction and then cooled. Subsequently, the reaction mixture and the zirconia beads were separated, to obtain a dispersion (ExC-7) containing a processed carbon black (ExC-7).

Example 15

A dispersion (ExE-3) containing a processed carbon black (ExE-3) of which the chain (B) has carboxyl groups was obtained by adding 1.8 parts of maleic anhydride (molecular weight 98.06) and 0.09 part of DBU as a catalyst to 150 parts of the dispersion (ExC-7) obtained in Example 14 and allowing them to react at 60° C. for two hours.

Example 16

In the same separable flask as in Example 11, 30 parts of carbon black (produced by Mitsubishi Chemical Industries, Ltd. and marketed under product code of "MA-100R"), 22.5 parts of the graft copolymer (14) obtained in Synthesis Example 14, 97.5 parts of PGM-Ac, and 800 parts of zirconia beads were placed.

Then, the content of the flask was stirred at 600 rpm and heated at 100° C. for one hour to effect a reaction and then cooled. Subsequently, the reaction mixture and the zirconia beads were separated. The reaction mixture was transferred into a separable flask provided with a distilling tube and heated therein at 140° C. to decompose and remove the tetrahydropyranyl ester group, to obtain a dispersion (ExC-4) which contains a COOH group-containing processed carbon black (ExC-4).

Example 17

In a separable flask provided with a temperature sensor, stirring vanes, and a condenser, 30 parts of the polymer solution (19) having an ethylene glycol chain obtained in Synthesis Example 19, 10 parts of carbon black (produced by Degussa K.K. and marketed under trademark designation of "Special Black 250"), and 1500 parts of zirconia beads were placed. The content of the flask was stirred at 600 rpm and heated at 75° C. for two hours, distilled at 120° C. to expel ethanol and effect a reaction for one hour. The resultant reaction solution was cooled and, after adding 75 parts of deionized water, dispersed. The reaction mixture and the beads were separated, to obtain a carbon black dispersion (ExC-8).

Example 18

In the same flask as in Example 17, 30 parts of the polymer solution (20) containing a lauryl alcohol (ethylene oxide)$_{15}$ chain, 10 parts of carbon black (produced by Degussa K.K. and marketed under trademark designation of "Special Black 250"), and 1500 parts of zirconia beads were placed. The content of the flask was stirred at 600 rpm and heated at 75° C. for two hours, and distilled at 160° C. to expel ethanol and effect a reaction for one hour. The resultant reaction solution was cooled and, after adding 75 parts of deionized water, dispersed. The reaction mixture and the beads were separated, to obtain a carbon black dispersion (ExC-9).

Control 14

In the same flask as in Example 17, 15 parts of lauryl alcohol (ethylene oxide)$_{15}$ glycidyl ether (produced by Nagase Kasei Kogyo K.K. and marketed under trademark designation of "Denakol EX-171"), 10 parts of carbon black (produced by Degussa K.K. and marketed under trademark designation of "Special Black 250"), and 1500 parts of zirconia beads were placed.

Then, the content of the flask was treated by following the procedure of Example 18, to obtain a carbon black dispersion for comparison (Co-14).

Control 15

A processed carbon black (Co-15) was obtained by mixing 100 parts by weight of carbon black (produced by Mitsubishi Chemical Industries, Ltd. and marketed under product code of "MA-100R"), 25 parts of lauryl alcohol (ethylene oxide)$_{15}$ glycidyl ether (produced by Nagase Kasei Kogyo K.K. and marketed under trademark designation of "Denakol EX-171"), and 75 parts of polyethylene glycol (polymerization degree 4–5; produced by Sanyo Kasei Kogyo K.K. and marketed under product code of "PEG200") by the use of a Laboplastmill (produced by Toyo Seiki K.K.) under the conditions of 150° C. and 100 rpm for 15 minutes and cooling the resultant mixture. A carbon black dispersion for comparison (Co-15) was obtained by mixing 20 parts by weight of the processed carbon black (Co-15) and 80 parts of deionized water and dispersing the resultant mixture with a stirrer.

Control 16

A carbon black dispersion for comparison (Co-16) was obtained by dispersing 10 parts of carbon black (produced, by Degussa K.K. and marketed under trademark designation of "Special Black 250"), 15 parts of polyethylene glycol, 0.05 part of a surfactant (produced by Kao Soap Co., Ltd. and marketed under trademark designation of "Emulbun 985"), and 11.24 parts of deionized water with the aid of a sand mill for 18 hours, adding 70 parts of deionized water to the resultant dispersion so as to set the pigment concentration at 10%, and further dispersed for 30 minutes.

Example 19

A processed carbon black (ExC-10) was obtained by kneading 10 parts of the graft copolymer (21) obtained in Synthesis Example 21 and 10 parts of carbon black (produced by Mitsubishi Chemical Industries, Ltd. and marketed under product code of "MA-100R") by means of a three-roll mill thereby allowing them to react.

Example 20

A processed carbon black (ExC-11) was obtained by kneading 10 parts of the graft copolymer (22) obtained in Synthesis Example 22 and 10 parts of carbon black (produced by Mitsubishi Chemical Industries, Ltd. and marketed under product code of "MA-100R") by means of a three-roll mill thereby allowing them to react. This processed carbon black had a polyamide structure as an externally positioned segment (B). When it is combined with a varying species of polyamide and the resultant blend is melted, kneaded, and extruded, a polyamide type light-impervious fiber having the processed carbon black uniformly dispersed therein can be obtained.

Example 21

In a separable flask provided with a thermometer, stirring vanes, and a condenser, 18.72 parts of the polymer solution (23) obtained in Synthesis Example 23, 31.2 parts of carbon black (produced by Degussa K.K. and marketed under trademark designation of "Special Black 250"), 106.8 parts of ethanol, and 800 parts of zirconia beads were placed. The content of the flask was stirred at 700 rpm and heated at 78° C. for five hours. The resultant reaction mixture and the zirconia beads were separated, to obtain a carbon black dispersion (ExC-12).

Control 17

A carbon black dispersion for comparison (Co-17) was obtained by following the procedure of Example 21 while using 9.36 parts of polyvinyl pyrrolidone in the place of the polymer solution (23) and changing the amount of the carbon black to 31.2 parts and that of the ethanol to 115.44 parts.

Example 22

A processed carbon black (ExC-13) is obtained by kneading 10 parts of the graft copolymer (24) obtained in Synthesis Example 24 and 10 parts of carbon black (produced by Mitsubishi Chemical Industries, Ltd. and marketed under product code of "MA-100R") by means of a three-roll mill thereby allowing them to react. This processed carbon black has a polyamide structure as an externally positioned segment (B). When it is combined with a varying species of polyamide, for example, and the resultant blend is melted, kneaded, and extruded, a polyamide type light-impervious fiber having the processed carbon black uniformly dispersed therein can be obtained.

Example 23

A processed carbon black (ExC-14) is obtained by kneading 10 parts of the graft copolymer (25) obtained in Synthesis Example 25 and 10 parts of carbon black (produced by Mitsubishi Chemical Industries, Ltd. and marketed under product code of "MA-100R") by means of a three-roll mill thereby allowing them to react.

Referential Example 2

A cyclohexanone mixture containing 26% of a processed carbon (ReA-1) was obtained by placing 23.4 parts of the polymer (26) obtained in Synthesis Example 26, 31.2 parts of carbon black (produced by Degussa K.K. and marketed under trademark designation of "Special Black 250"), 101.4 parts of cyclohexanone, and 800 parts of zirconia beads, 2 mm in diameter, in a separable flask provided with stirring vanes and a reflux condenser and stirring the content of the flask at 100° C. for one hour.

Example 24

A cyclohexanone mixture containing 26% of a processed carbon (ExA-4) was obtained by faithfully repeating the procedure of Referential Example 2 while using the polymer (27) solution in the place of the polymer (26) solution.

Example 25

A dispersion (ExB-2) of GCB having carboxyl groups was obtained by adding 4.16 parts of trimellitic anhydride to 100 parts of the processed carbon solution (ReA-1) obtained in Referential Example 2, heating the resultant mixture to 80° C., then adding 0.06 part of 1,8-diazobicyclo[5,4,0]7-undecene (DBU), and stirring the resultant mixture for 30 minutes.

Example 26

A dispersion (ExB-3) of a carbon black graft polymer (GCB) having double bonds and carboxyl groups was obtained by repeating the procedure of Example 25 while adding 3.2 parts of trimellitic anhydride to 100 parts of the processed carbon solution (ExA-4) obtained in Example 24.

Example 27

A carbon black dispersion (ExC-15) was obtained by placing 30 parts of the polymer solution (28) having an ethylene glycol chain obtained in Synthesis Example 28, 10 parts of carbon black (produced by Degussa K.K. and marketed under trademark designation of "Special Black 250"), and 1500 parts of zirconia beads, stirring the content of the flask at 700 rpm and heating it at 40° C. for one hour to effect a reaction, then heating the reaction solution to 95° C. to expel ethanol while repeating displacement of water, subsequently cooling the resultant mixture, and separating the reaction mixture and the beads.

Preparation of photo-curable resin composition

Example 28

A photo-curable resin composition (1) was obtained by adding 10 parts of dipentaerythritol tetraacrylate as a sensitive resin, 8 parts a photopolymerization initiator (produced by Ciba-Geigy and marketed under trademark designation of "Irgacure 907"), and 400 parts of ethyl carbitol acetate as a diluent to 90 parts of the processed carbon black (ExA-1) obtained in Example 1 and uniformly dispersing them.

Example 29

A photo-curable resin composition (2) was obtained by repeating the procedure of Example 28 while changing the amount of the processed carbon black (ExA-2) to 80 parts and that of the dipentaerythritol tetraacrylate to 10 parts.

Example 30

A photo-curable resin composition (3) was obtained by repeating the procedure of Example 28 while using the processed carbon black (ExB-1) obtained in Example 2 in the place of the processed carbon black (ExA-1).

Example 31

A photo-curable resin composition (4) was obtained by repeating the procedure of Example 28 while using 450 parts of the mixture (ExA-2) of ethyl carbitol acetate and the processed carbon black (ExA-2), the ExA-2 content of 20%, obtained in Example 3 (90 parts of ExA-2) in the place of the processed carbon black (ExA-1).

Example 32

A photo-curable resin composition (5) was obtained by repeating the procedure of Example 28 while using the carboxyl group-containing epoxy acrylate resin (4) obtained in Synthesis Example 4 in the place of dipentaerythritol tetraacrylate.

Example 33

A photo-curable resin composition (6) was obtained by repeating the procedure of Example 30 while using the carboxyl group-containing epoxy acrylate resin (4) obtained in Synthesis Example 4 in the place of dipentaerythritol tetraacrylate.

Control 18

A photo-curable resin composition for comparison (C1) was obtained by repeating the procedure of Example 28 while using the carbon black for comparison (Co-1) obtained in Control 1 in the place of the processed carbon black (ExA-1).

Control 19

A photo-curable resin composition for comparison (C2) was obtained by repeating the procedure of Example 32 while using the carbon black for comparison (Co-2) obtained in Control 2 in the place of the processed carbon black (ExA-1)

Control 20

A photo-curable resin composition for comparison (C3) was obtained by repeating the procedure of Example 28 while using the carbon black for comparison (Co-3) obtained in Control 3 in the place of the processed carbon black (ExA-1).

Control 21

A photo-curable resin composition for comparison (C4) was obtained by repeating the procedure of Example 28 while using 50 parts of the processed carbon black for comparison (Co-3) obtained in Control 4 in the place of 90 parts of the processed carbon black (ExA-1) and 50 parts of the epoxy acrylate resin (1) obtained in Synthesis Example 1 in the place of 10 parts of pentaerythritol tetraacrylate.

Example 34

A photo-curable resin composition (7) was obtained by repeating the procedure of Example 31 while using 450 parts of the mixture (ExA-3) of ethyl carbitol acetate and the processed carbon black (ExA-3), the ExA-3 content being of 20%, obtained in Example 4 (90 parts of ExA-3) in the place of the mixture (ExA-2).

Example 35

A photo-curable resin composition (8) was obtained by repeating the procedure of Example 34 while changing the amount of the mixture (ExA-3) to 400 parts, that of pentaerythritol tetraacrylate to 20 parts, and that of ethyl carbitol acetate to 80 parts.

Control 22

A photo-curable resin composition for comparison (C5) was obtained by repeating the procedure of Example 34 while using the mixture (Co-5) of ethyl carbitol acetate and the processed carbon black for comparison (Co-5), the Co-5 content being of 20%, obtained in Control 5 in the place of the mixture (ExA-3).

Control 23

A photo-curable resin composition for comparison (C6) was obtained by repeating the procedure of Example 34 while using the mixture (Co-6) of ethyl carbitol acetate and the processed carbon black for comparison (Co-6), the Co-5 content being of 20%, obtained in Control 6 in the place of the mixture (ExA-3).

Control 24

A photo-curable resin composition for comparison (C7) was obtained by repeating the procedure of Example 34 while using 50 parts of the mixture (Co-5) obtained in Control 5 and 400 parts of the mixture (Co-6) obtained in Control 6 in the place of 450 parts of the mixture (ExA-3).

Control 25

A photo-curable resin composition for comparison (C8) was obtained by adding 55 parts of the carboxyl group-containing epoxy acrylate resin obtained in Synthesis Example 4 as a sensitive resin, 8 parts a photopolymerization initiator (produced by Ciba-Geigy and marketed under trademark designation of "Irgacure 907"), and 220 parts of ethyl carbitol acetate as a diluent to 225 parts of the dispersion (Co-7) containing the processed carbon black (Co-7) obtained in Control 7.

Example 36

A photo-curable resin composition (9) was obtained by adding 4 parts of dipentaerythritol hexaacrylate as a sensitive resin, 0.15 part of a photopolymerization initiator (produced by Ciba-Geigy and marketed under trademark designation of "Irgacure 907"), and 20 parts of ethyl cellosolve acetate as a diluent to 16 parts of a dispersion (ExC-1) containing the processed carbon black (ExC-1) obtained in Example 5 and uniformly dispersing them.

Example 37

A photo-curable resin composition (10) was obtained by following the procedure of Example 36 while using a dispersion (ExC-2) containing the processed carbon black (ExC-2) obtained in Example 6 in the place of the dispersion (ExC-1).

Control 26

A photo-curable resin composition for comparison (C11) was obtained by following the procedure of Example 36 while using the dispersion (Co-8) containing the processed carbon black for comparison (Co-8) obtained in Control 8 in the place of the dispersion (ExC-1).

Control 27

A photo-curable resin composition for comparison (C12) was obtained by following the procedure of Example 36 while using the dispersion (Co-9) containing the processed carbon black for comparison (Co-9) obtained in Control 9 in the place of the dispersion (ExC-1).

Example 38

A photo-curable resin composition (11) was obtained by adding 21.25 parts of a sensitive resin (produced by Johnson Polymer K.K. and marketed under trademark designation of "Johncryl 68"), 62.5 parts of dipentaerythritol hexaacrylate, and 9.38 parts of a photopolymerization initiator (produced by Ciba-Geigy and marketed under trademark designation-of "Irgacure 907") to 500 parts of the dispersion (ExC-5) containing the processed carbon black (ExC-5) obtained in Example 9 and uniformly dispersing them.

Example 39

A photo-curable resin composition (12) was obtained by following the procedure of Example 38 while using the dispersion (ExD-1) containing the processed carbon black (ExD-1) obtained in Example 10 in the place of the dispersion (ExC-5).

Example 40

A photo-curable resin composition (13) was obtained by adding 24.55 parts of an alkali-soluble styrene-acryl resin (produced by Johnson Polymer K.K. and marketed under produce code of "J-682") as a sensitive resin, 30 parts dipentaerythritol triacrylate, and 5 parts of a photopolymerization initiator (produced by Ciba-Geigy and marketed under trademark designation of "Irgacure 907") to 175.0 parts of a dispersion (ExC-6) containing the processed carbon black (ExC-6) obtained in Example 11 and uniformly dispersing them.

Example 41

A photo-curable resin composition (14) was obtained by following the procedure of Example 40 while using 176.7 parts of a dispersion (ExE-1) containing the processed carbon black (ExE-1) obtained in Example 12 in the place of 175.0 parts of the dispersion (ExC-6) and changing the amount of J-682 to 22.8 parts.

Example 42

A photo-curable resin composition (15) was obtained by following the procedure of Example 40 while using 178.3 parts of the dispersion (ExE-2) containing the processed carbon black (ExE-2) obtained in Example 13 in the place of 175.0 parts of the dispersion (ExC-6) and changing the amount of J-682 to 21.2 parts.

Example 43

A photo-curable resin composition (16) was obtained by following the procedure of Example 40 while using a dispersion (ExE-7) containing the processed carbon black (ExE-7) obtained in Example 14 in the place of the dispersion (ExC-6).

Example 44

A photo-curable resin composition (17) was obtained by following the procedure of Example 40 while using 177.1 parts of the dispersion (ExE-3) containing the processed carbon black (ExE-3) obtained in Example 15 in the place of 175.0 parts of the dispersion (ExC-6) and changing the amount of J-682 to 22.4 parts.

Example 45

A photo-curable resin composition (18) was obtained by following the procedure of Example 40 while using 173.7 parts of the dispersion (ExE-4) containing the processed carbon black (ExE-4) obtained in Example 16 in the place of 175.0 parts of the dispersion (ExC-6) and changing the amount of J-682 to 25.8 parts.

Ink for ink jet

Examples 46 and 47 and Controls 27–29

The carbon black dispersions obtained in Examples 17 and 18 and Controls 14–16, used in their unmodified form as inks for ink jets, were subjected to the following evaluation.

Liquid developing agent

Example 48

In a separable flask provided with a thermometer, stirring vanes, and a condenser, the processed carbon black (ExC-10) obtained in Example 19, 36 parts of polyethylene resin (Mitsui Highwax 4202E), 160 parts of ISOPAR G (produced by Exxon), and 600 parts of zirconia beads were placed and stirred and dispersed for 20 hours, to obtain a liquid developing agent (1).

Control 30

In the same separable flask as in Example 48, carbon black (produced by Mitsubishi Chemical Industries, Ltd. and marketed under product code of "MA-100R"), 40 parts of polyethylene resin (Mitsui Highwax 4202E), 160 parts of ISOPAR G (produced by Exxon), and 600 parts of zirconia beads were placed and stirred and dispersed for 20 hours, to obtain a liquid developing agent for comparison (C1).

Treatment for surface improvement

Example 49

In a flask provided with a stirrer, an inert gas inlet tube, a reflux condenser, and a thermometer, 200 parts of deionized water having 0.1 part of polyvinyl alcohol (produced by Kuraray Co., Ltd. and marketed under product code of "PVA-205") was placed. A mixture prepared by dissolving 8 parts of benzoyl peroxide in a polymerizable monomer consisting of 97 parts of styrene and 3 parts of glycidyl methacrylate was added to the deionized water. They were stirred at a high speed to form a uniform suspension. Then, the suspension was blown with nitrogen gas and heated to 80° C. and continuously stirred at this temperature for five hours to effect a polymerization reaction. The resultant mixture was cooled to obtain a polymer suspension. This polymer suspension was filtered, washed, and then dried, to obtain a polymer (29) having epoxy group as a reactive group.

Then, in an apparatus constructed as shown in FIG. 6 (the inner volume of the vessel 1.2 liters) and packed with 3 kg of zirconia beads, 1 mm in diameter, 30 parts of the polymer (29) prepared above, 370 parts of xylene, and 100 parts of carbon black (produced by Mitsubishi Chemical Industries, Ltd. and marketed under product code of "MA-100R") were placed. Then, the interior of the vessel was heated to 140° C. by circulating the preheated thermal medium and the disk was operated at a peripheral speed of 10 m/s for two hours. The resultant reaction mixture and the zirconia beads were separated, to obtain a pigment dispersion (ExF-1).

Control 31

A pigment dispersion for comparison (Co-18) was obtained by mixing 10 parts of the polymer (29) prepared in Example 49 and 20 parts of carbon black (produced by Mitsubishi Chemical Industries, Ltd. and marketed under product code of "MA-100R") by the use of a Laboplastmill (produced by Toyo Seiki K.K.) under the conditions of 140° C. and 100 rpm to effect a reaction and then cooling the resultant hot reaction mixture and dispersing the reaction mixture in 70 parts of toluene.

Control 32

In an apparatus resembling in construction that of Example 49 and lacking a heating device (inner volume of vessel 1.2 liters) and packed with 3 kg of zirconia beads, 1 mm in diameter, 20 parts of an aluminum coupling agent (produced by Ajinomoto Co., Inc. and marketed under trademark designation of "PLENACT AL-M"), 380 parts of xylene, and 100 parts of carbon black (produced by Mitsubishi Chemical Industries, Ltd. and marketed under product code of "MA-100R") were placed. Then, the disk was operated at a peripheral speed of 10 m/s for two hours. The resultant reaction mixture and the zirconia beads were separated, to obtain a pigment dispersion (Co-19) for comparison.

Example 50

In the same apparatus as used in Example 49 and packed with 3 kg of zirconia beads, 1 mm in diameter, 40 parts of an o-cresol novolak type epoxy resin (epoxy equivalent 198; produced by Sumitomo Chemical Co., Ltd. and marketed under product code of "ESCN-195X"), 380 parts of diethylene glycol monoethyl acetate, and 80 parts of carbon black (produced by Mitsubishi Chemical Industries, Ltd. and marketed under product code of "MA-100R") were placed. Then, the interior of the vessel was heated to 200° C. by circulating a preheated thermal medium and the disk was operated at a peripheral speed of 10 m/s for three hours. The content of the vessel was cooled. The resultant reaction mixture and the zirconia beads were separated, to obtain a pigment dispersion (ExF-2).

Control 33

A pigment dispersion for comparison (Co-20) was obtained by mixing the same composition as in Example 50, namely 10 parts of o-cresol novolak type epoxy resin and 20 parts of carbon black (produced by Mitsubishi Chemical Industries, Ltd. and marketed under product code of "MA-100R"), in the same manner as in Control 31, namely by the use of a Laboplastmill (produced by Toyo Seiki K.K.) under the conditions of 200° C. and 100 rpm to effect a reaction and then cooling the resultant hot reaction mixture and adding 70 parts of diethylene glycol monoethyl ether acetate thereto.

Evaluation of properties

Evaluation 1

The photo-curable resin compositions (1)–(8) obtained in Examples 28–35 and the photo-curable resin compositions for comparison (C1)–(C8) obtained in Controls 18–25 were rated for developability, photo-curing property, imperviousness of cured film to light, and heat resistance of cured film as follows to determine the state of bondage of polymer moiety in the processed carbon black incorporated in each resin compositions and the effect of the presence or absence of the functional group (double bond and carboxyl group) had by the polymer moiety. The results are shown in Table 1.

Developability

A given resin composition was applied so much to a glass substrate with a spin coater as to produce, on drying, a film, 1 μm in thickness. The applied film was dried at 100° C. for ten seconds. The dried applied film was developed with either methylene chloride or an aqueous 1% $Na_2CO_3$ solution for 60 seconds and then visually examined to determine the resin surviving the development.

Photo-curing property

A given resin composition was applied so much to a glass substrate with a spin coater as to produce, on drying, a film, 1 μm in thickness. The applied film was dried at 100° C. for ten seconds. The film thus obtained was exposed through a photomask, 10 μm in line/space, to the beam of an extra-high voltage mercury vapor lamp for a dose of 100 mJ and then immersed in either methylene chloride or an aqueous 1% $Na_2CO_3$ solution and visually examined to determine the manner of pattern formation.

Imperviousness of cured film to light

A given resin composition was applied so much to a glass substrate with a spin coater as to produce, on drying, a film, 1 μm in thickness. The applied film was dried at 100° C. for ten seconds. The film thus obtained was exposed through no photomask to the beam of an extra-high voltage mercury vapor lamp for a dose of 100 mJ to obtain a cured film. The cured film was tested for absorbance.

Heat resistance of cured film

The sample used in the test for absorbance mentioned above was kept at 250° C. for one hour. After the heating, the sample was visually examined to determine the change, if any, in appearance.

A given resin composition was applied so much to a glass substrate with a spin coater as to produce, on drying, a film, 1 μm in thickness. The applied film was prebaked at 100° C. for ten minutes. The film thus obtained was exposed through a photomask, 10 μm in line/space, to the beam of an extra-high voltage mercury vapor lamp for a dose of 500 mJ and then immersed in acetone and visually examined to determine the manner of pattern formation.

TABLE 1

|  | Photo-curable resin composition | Processed carbon black | Developability | | Phot-curing property | | | |
| --- | --- | --- | --- | --- | --- | --- | --- | --- |
|  |  |  | Methylene chloride | Sodium carbonate aq. solution | Methylene chloride | Sodium carbonate aq. solution | Imperviousness of cured film to light*1 | Heat resistance of cured film |
| Example 28 | 1 | ExA-1 | good |  | good |  | 3.5 | good |
| Example 29 | 2 | ExA-1 | good |  | good |  | 3.0 | good |
| Example 30 | 3 | ExB-1 |  | good |  | good | 3.0 | good |
| Example 31 | 4 | ExA-2 | good |  | good |  | 3.5 | good |
| Example 32 | 5 | ExA-1 |  | good |  | good | 3.5 | good |
| Example 33 | 6 | ExB-1 |  | good |  | good | 3.0 | good |
| Control 18 | C1 | Co-1 | Residue was observed |  | Lucking portions were observed |  | 2.5 | Crack |
| Control 19 | C2 | Co-2 |  | Residue was observed |  | Lucking portions were observed | 2.0 | Crack |
| Control 20 | C3 | Co-3 | *2 |  | —*2 |  | —*2 | —*2 |
| Control 21 | C4 | Co-4 | good |  | Lucking portions were observed |  | 2.0 | Crack |
| Example 34 | 7 | ExA-3 | good |  | good |  | 3.5 | good |
| Example 35 | 8 | ExA-3 | good |  | good |  | 3.0 | good |
| Control 22 | C5 | Co-5 | —*2 |  | —*2 |  | —*2 | —*2 |
| Control 23 | C6 | Co-6 | Residue was observed |  | Lucking portions were observed |  | 2.5 | Crack |
| Control 24 | C7 | Co-5,6 | Residue was observed |  | Lucking portions were observed |  | 2.0 | peeling |
| Control 25 | C8 | Co-7 |  | Residue was observed |  | not cure | —*3 | —*3 |

*1 Maximum absorbance of 1 μm thickness film at the whole visible light range (400–700 nm)
*2 Homogeneous dispersion was not obtained.
*3 Cured film was not obtained.

Evaluation 2

The processed carbon black dispersions (ExC-1) and (ExC-2) obtained in Examples 5 and 6 and the processed carbon black dispersions for comparison (Co-8) and (Co-9) obtained in Controls 8 and 9 were tested for stability of dispersion as follows and the photo-curable resin compositions (9) and (10) obtained in Examples 36 and 37 and the photo-curable resin compositions for comparison (C11) and (C12) obtained in Controls 26 and 27 by using respectively the processed carbon black dispersions mentioned above were tested for developability and photo-curing property to determine the effect of variation in the chain structure of the polymer moiety in the processed carbon black. The results are shown in Table 2 and Table 3.

Stability of dispersion

A given resin composition was placed in a Pyrex test tube, 18 mm in diameter, left standing therein at room temperature (23° C.±1° C.) for six months, and visually examined to determine stability of dispersion.

Developability

A given resin composition was applied so much to a glass substrate with a spin coater as to produce, on drying, a film, 1 μm in thickness. The applied film was prebaked at 100° C. for ten minutes. The dried applied film was developed with acetone for 60 seconds and then visually examined to determine the resin surviving the development.

Photo-curing property

TABLE 2

| Processed carbon black dispersion | Stability of dispersion |
| --- | --- |
| ExC-1 | No sediment |
| ExC-2 | No sediment |
| Co-8 | Slight sediment |
| Co-9 | Slight sediment |

TABLE 3

| Photo-curable resin composition | Developability | Photo-curing property |
| --- | --- | --- |
| 9 | No undeveloped part | No uncured part |
| 10 | No undeveloped part | No uncured part |
| C11 | Large undeveloped part | Large uncured part |
| C12 | Small undeveloped part | Small uncured part |

Evaluation 3

The processed carbon black dispersions (ExC-3) and (ExC-4) obtained in Examples 7 and 8 and the processed carbon black dispersions for comparison (Co-10)–(Co-13) obtained in Controls 10–13 were tested for stability of solution, insulation, and heat resistance as follows to determine the effect of variation in the reactive group of the polymer moiety in the processed carbon black. The results are shown in Table 4 and Table 5.

Stability of solution

A given processed carbon black dispersion was placed in a screw tube, 100 ml in inner volume, left standing therein at room temperature (23° C.±1° C.) for one month, and examined to determine stability of solution in terms of change in liquid viscosity.

This determination was implemented by measuring the liquid viscosity with a B type viscosimeter (produced by Tokyo Keiki K.K.) using a rotor No. 1 at 60 rpm. The numerical values given in Table 4 are in the denomination of cps.

Insulation and heat resistance

A given processed carbon black dispersion was applied so much to a glass substrate with a spin coater as to produce, on drying, a film, 1 $\mu$m in thickness. The applied film was prebaked at 100° C. for one minute and tested for surface resistivity. The applied film was baked at 200° C. for one hour and again tested for surface resistivity. The surface resistivity was determined by the use of a surface resistivity testing device (produced by Mitsubishi Chemical Industries, Ltd. and marketed under trademark designation of "Hiresta IP/MCP-HT 260"). The numerical values given in Table 4 are in the denomination of $\Omega/\square$.

TABLE 4

| Processed carbon black dispersion | First day | Fifth day | 15th day | 30th day |
|---|---|---|---|---|
| ExC-3 | 11.1 | 11.0 | 11.1 | 11.5 |
| Co-10 | 9.1 | 9.4 | 9.6 | 9.2 |
| Co-11 | 10.1 | 12.6 | 16.8 | 21.4 |

TABLE 5

| Processed carbon black dispersion | After 1 minute's baking at 100° C. | After 1 hour's baking at 200° C. |
|---|---|---|
| ExC-4 | $9.34 \times 10^{11}$ | $1.35 \times 10^9$ |
| Co-12 | $8.56 \times 10^8$ | $<10^4$ |
| Co-13 | $5.68 \times 10^8$ | $<10^4$ |

Evaluation 4

For the purpose of determining the effect of the presence or absence of double bond(s) in the polymer moiety in a carbon black graft polymer, the photo-curable resin compositions (11) and (12) obtained in Examples 38 and 39 were each applied so much to a substrate with a spin coater as to produce, on drying, a film, 1 $\mu$m in thickness. The film consequently obtained was prebaked on a hot plate at 100° C. for one minute. The film was cured by exposure to the ultraviolet light from a high voltage mercury vapor lamp at a dose of 500 mJ/cm². It was then tested for surface resistivity. Then, it was afterbaked on an oven at 200° C. for one hour and the cured film was tested for absorbance and surface resistivity. The results are shown in Table 6.

The cured films were dipped into ethyl cellosolve acetate and then visually examined to determine the surface condition. The sample of the photo-curable resin composition (12) showed absolutely no change of surface appearance, indicating that the composition excelled in resistance to solvent.

The surface resistivity was determined by the use of a surface resistivity testing device (produced by Mitsubishi Chemical Industries, Ltd. and marketed under trademark designation of "Hiresta IP/MCP-HT 260"). The numerical values given in Table 4 are in the denomination of $\Omega/\square$. The imperviousness to light is the absorbance of a film, 1.2 $\mu$m in thickness, measured at a visible zone of 550 nm.

TABLE 6

|  | Resin composition (11) | Resin composition (12) |
|---|---|---|
| Surface resistivity after exposure | $10^{12}$ | $10^{12}$ |
| Surface resistivity after afterbaking | $10^8$ | $10^{11}$ |
| Imperviousness to light after afterbaking | 3.0 | 3.0 |

Evaluation 5

For the purpose of determining the effect of the presence or absence of carboxyl group(s) in the polymer moiety in a carbon black graft polymer, the photo-curable resin compositions (13)–(18) obtained in Examples 40–45 were each applied so much to a glass substrate with a spin coater as to produce, on drying, a film, 1 $\mu$m in thickness. The film was prebaked on a hot plate at 100° C. for one minute. The dried film consequently obtained was developed with an aqueous 0.5% NaOH solution for 30 seconds and one minute and then visually examined to determine the resin surviving the development. The results are shown in Table 7.

TABLE 7

| Photo-curable resin composition | Dipping time | |
|---|---|---|
| | 30 seconds | 60 seconds |
| (13) | Fair survival | Very little survival |
| (14) | Very little survival | Surface resembling clear glass plate |
| (15) | Very little survival | Surface resembling clear glass plate |
| (16) | Fair survival | Very little survival |
| (17) | Very little survival | Surface resembling clear glass plate |
| (18) | Very little survival | Surface resembling clear glass plate |

Evaluation 6

The liquid recording media obtained in Examples 46 and 47 and Controls 27–29 were tested for long shelf life as follows. The dispersion (ExC-15) obtained in Example 27 was similarly tested. The results are shown in Table 8.

Long shelf life

A given carbon black dispersion was placed in a Pyrex test tube, 18 mm in diameter, and left standing therein at room temperature for six months to determine stability of dispersion.

TABLE 8

| Carbon black dispersion | Long shelf life |
|---|---|
| (ExC-8) | Very stable |
| (ExC-9) | Very stable |
| (ExC-15) | Very stable |
| (Co-14) | Increase of viscosity |
| (Co-15) | Increase of viscosity |
| (Co-16) | Pudding-like consistency |

Evaluation 7

For the purpose of determining the stability of dispersion of processed carbon black in a liquid developing agent, the liquid developing agent (1) obtained in Example 48 and the liquid developing agent for comparison (C1) obtained in Control 30 were each filtered through a metal net, 800 mesh.

The sample of the liquid developing agent (1) passed through the metal net, leaving no residue thereon, while the sample of the liquid developing agent for comparison (C1) left a residue on the metal net and clogged the metal net. This fact indicates that the processed carbon black in the liquid developing agent for comparison (C1) induced agglomeration.

Evaluation 8

For the purpose of examining the stability of dispersion of a polyimide type carbon black dispersion, the carbon black dispersion (ExC-12) obtained in Example 21 and the carbon black dispersion for comparison (Co-17) obtained in Control 17 were each pressure filtered through a Polyflon filter (produced by Advantec K.K. and marketed under product code of "PFO 20"). The sample of the carbon black dispersion (ExC-12) could be passed in a total proportion of 99%, while that of the carbon black dispersion for comparison was passed in a total proportion of 10% before it clogged the filter. This fact indicates that the carbon black dispersion for comparison (C1) induced agglomeration of carbon black.

Evaluation 9

For the purpose of examining the effect of difference in the method of mixing treatment of a polymer with a pigment, the pigment dispersions obtained in Examples 49 and 50 and Controls 31–33 were subjected to a filtering test as follows and were tested for stability of dispersion.

Filtering test

A given pigment dispersion was filtered with a Filter Paper No. 2 to determine the permeability of the dispersion through the filter paper and also determine the presence or absence of a substance stopped on the filter paper.

Stability of dispersion

A given pigment dispersion was placed in a Pyrex test tube, 18 mm in diameter, and left standing therein at room temperature (23° C.±1° C.) for ten days to determine the stability of dispersion.

The dispersions (ExF-1) and (ExF-2) of Examples 45 and 46 were found to have permeability of 99% through the filter paper and to form no discernible residue of either undispersed carbon black or gelled carbon black on the filter paper. After 10 days' standing, they showed no sign of settling. In contrast, the dispersion (Co-18) of Control 35 was found to have permeability of 75% through the filter paper and to form a conspicuous residue of undispersed carbon black on the filter. After 10 days' standing, most carbon black of the dispersion was settled out. The dispersion (Co-19) of Control 36 was found to have permeability of 90% through the filter paper and to form a slight residue of undispersed carbon black on the filter paper. After 10 days' standing, part of carbon black of the dispersion was settled out. The dispersion (Co-20) of Control 37 was found to have virtually no permeability through the filter paper and most carbon black was stopped in an undispersed and gelled state on the filter paper. This dispersion began to form settling of carbon black immediately after the start of the standing.

Evaluation 10

The carbon black graft polymer dispersions (ExA-4), (ExB-2), (ExB-3), and (ReA-1) obtained respectively in Examples 24–26 and Referential Example 2 were tested for photo-curing property and developability with an aqueous alkali solution as follows.

Photo-curing property

A homogeneous mixture consisting of 100 parts of a given dispersion, 25 parts of dipentaerythritol hexaacrylate (DPHA), and 3.5 parts of a photopolymerization initiator (Irgacure 907) was applied so much to a glass substrate with a spin coater as to produce, on drying, a film, 1 μm in thickness. The film was dipped into acetone for one minute and then visually examined to determine the surface condition. The results are shown in Table 9.

Developability with alkali

A given dispersion was applied so much to a glass substrate with a spin coated as to produce, on drying, a film, 1 μm in thickness, and the film was showered with an aqueous 1 wt % KOH solution for 10 seconds to determine the developability with an alkali. The results are shown in Table 9.

TABLE 9

| Carbon black graft polymer dispersion | Photo-curing property | Developability with alkali |
| --- | --- | --- |
| ReA-1 | Δ | X |
| ExA-4 | ○ | X |
| ExB-2 | Δ | ○ |
| ExB-3 | ○ | ○ |

We claim:

1. A carbon black graft polymer, which is characterized by having a block- or graft-copolymer graft chain, and which is obtained by a process comprising mixing under heating carbon black with a block- or graft-copolymer comprising a segment (A) having a reactive group capable of reacting with a functional group on the surface of said carbon black and a segment (B) different in skeletal structure from said segment (A).

2. A carbon black graft polymer according to claim 1, wherein said block- or graft-copolymer has an ethylenically unsaturated double bond in said segment (B) thereof, and which is further characterized by said graft chain thereof having the ethylenically unsaturated double bond.

3. A carbon black graft polymer according to claim 2, wherein said unsaturated double bond in said segment (B) is included in a side chain bound to a main chain of said segment (B) through the medium of a urethane bond.

4. A carbon black graft polymer according to claim 1, wherein said block- or graft-copolymer has a hydroxyl group resided in said segment (B) in the group consisting of said segments (A) and (B), and wherein a resultant reaction mixture from said mixing under heating of said carbon black with said block- or graft-copolymer is further treated with an acid anhydride, and wherein said graft chain has a carboxyl group.

5. A carbon black graft polymer according to claim 1, wherein said reactive group is at least one member selected from the class consisting of epoxy group, thioepoxy group, aziridine group, and oxazoline group.

6. A carbon black graft polymer according to claim 1, wherein said segment (A) is obtained by a process comprising polymerizing a vinyl type monomer composition comprising a vinyl type monomer having said reactive group, and a main chain thereof comprises carbon-carbon bonds.

7. A carbon black graft polymer according to claim 1, wherein said segment (A) is obtained by a process comprising polymerizing a vinyl type monomer composition comprising a vinyl type monomer having said reactive group, and the polymer chain thereof has said reactive group and aromatic rings.

8. A carbon black graft polymer according to claim 1, wherein said segment (A) is obtained by a process comprising polymerizing a vinyl type monomer composition comprising a vinyl type monomer having an aromatic ring, said graft polymer containing not less than 50 mol % of said composition, and a vinyl type monomer having said reactive group.

9. A carbon black graft polymer according to claim 1, wherein said segment (B) has at least one member selected from the group consisting of polysiloxane type structure, poly(meth)acryl type structure, polyether structure, poly(meth)acrylonitrile structure, polyester structure, polyalkylene structure, polyamide structure, polyimide structure, and polyurethane structure.

10. A carbon black graft polymer according to claim 1, wherein the average particle diameter of said carbon black is in the range of 0.0005–0.4 µm.

11. A carbon black graft polymer according to claim 1, wherein 1–1000 parts by weight of said polymer is grafted to 100 parts by weight of said carbon black.

12. A carbon black graft polymer according to claim 1, wherein said carbon black has a carboxyl group.

13. A carbon black graft polymer according to claim 1, wherein said carbon black is an acidic carbon black having a pH value of less than 7.

14. A method for the production of the carbon black graft polymer set forth in claim 1, wherein said graft polymer is improved in dispersibility in a medium aimed at dispersion, which method comprises mixing under heating with said carbon black, in the presence of a liquid dispersion medium formed of one of said aimed medium and a medium having a characteristic resembling that of said aimed medium, said block- or graft-copolymer having said segment (A) containing the reactive group capable of reacting with the functional group on the surface of said carbon black and said segment (B), wherein said segment (B) contains substantially none of said reactive group and exhibits higher affinity for said liquid dispersion medium than said segment (A).

15. A method for the production of the carbon black graft polymer set forth in claim 1, wherein said graft polymer is improved in dispersibility in a medium aimed at dispersion, which method comprises mixing under heating said block- or graft-copolymer having a segment (A) containing the reactive group capable of reacting with the functional group on the surface of said carbon black and segment (B), wherein said segment (B) contains substantially none of said reactive group and exhibits lower affinity for said carbon black than said segment (A) with said carbon black.

16. A method for the production of the carbon black graft polymer set forth in claim 2, wherein said graft polymer is improved in dispersibility in a medium aimed at dispersion, which method comprises mixing under heating with the carbon black, in the presence of a liquid dispersion medium formed of one of said aimed medium and a medium having a characteristic resembling that of said aimed medium, said block- or graft-copolymer having the segment (A) containing the reactive group capable of reacting with the functional group on the surface of said carbon black and said segment (B) containing the unsaturated double bond, wherein said segment (B) exhibits higher affinity for said liquid dispersion medium than said segment (A).

17. A method for the production of the carbon black graft polymer set forth in claim 2, wherein said graft polymer is improved in dispersibility in a medium aimed at dispersion, wherein the method comprises (1) mixing under heating with said carbon black, in the presence of a liquid dispersion medium formed of said aimed medium or a medium having a characteristic resembling said aimed medium, a block- or graft-type precursory polymer having said segment (A) containing the reactive group capable of reacting with the functional group on the surface of said carbon black and a segment (B) exhibiting higher affinity for said liquid dispersion medium than said segment (A), and then (2) causing a compound (d) to react with the carbon black having grafted thereto said precursory polymer obtained in (1) above, said compound (d) having a reactive group capable of reacting with a functional group in said segment (B) of said block- or graft-type precursory polymer and further having the unsaturated double bond, thereby introducing the unsaturated double bond into said segment (B) of said precursory polymer.

18. A method according to claim 17, wherein said functional group in said segment (B) is an alcoholic or phenolic hydroxyl group and said reactive group of said compound (d) is an isocyanate group.

19. A method for the production of the carbon black graft polymer set forth in claim 2, wherein said graft polymer is improved in dispersibility in a medium aimed at dispersion, which method comprises mixing under heating the block- or graft-copolymer having said segment (A) containing the reactive group capable of reacting with the functional group on the surface of said carbon black and said segment (B) containing the unsaturated double bond, wherein said segment (B) exhibits lower affinity for said carbon black than said segment (A) with said carbon black.

20. A method for the production of the carbon black graft polymer set forth in claim 2, wherein said graft polymer is improved in dispersibility in a medium aimed at dispersion, which method comprises (1) mixing under heating with the carbon black a block- or graft-type precursory polymer having the segment (A) containing the reactive group capable of reacting with the functional group on the surface of said carbon black and a segment (B) exhibiting lower affinity for said carbon black than said segment (A), and then (2) causing a compound (d) to react with the carbon black having grafted thereto said precursory polymer obtained in (1) above, said compound (d) having a reactive group capable of reacting with a functional group in said segment (B) of said block- or graft-type precursory polymer and having the unsaturated double bond, thereby introducing the unsaturated double bond into said segment (B) of said precursory polymer.

21. A method for the production of a carbon black graft polymer set forth in claim 4, wherein said graft polymer is improved in dispersibility in a medium aimed at dispersion, which method comprises mixing under heating with said carbon black, in the presence of a liquid dispersion medium formed of one of said aimed medium and a medium having a characteristic resembling that of said aimed medium, said block- or graft-copolymer which has said segment (A) containing the reactive group capable of reacting with the functional group on the surface of said carbon black and said segment (B) and contains a hydroxyl group in said segment (B) in the group of said segments (A) and (B), wherein said segment (B) exhibits higher affinity for said liquid dispersion medium than said segment (A), and then treating the resultant reaction mixture with said anhydride.

22. A method according to any of claims 14–21, wherein said mixing under heating treatment is carried out in an apparatus for wet dispersion treatment comprising a vessel for holding therein a fluid under treatment, a stirrer adapted to be rotated in said vessel, a heating device accommodated in said vessel and adapted to heat said fluid under treatment, and a plurality of granular dispersion media accommodated in said vessel.

23. A photocurable resin composition, characterized by containing the carbon black polymer set forth in claim 1.

24. A photocurable resin composition according to claim 23, wherein said photocurable resin composition incorporates therein an alkali-soluble resin.

25. A black matrix for a color filter, comprising a photocurable resin composition set forth in claim 23.

26. An ink jet grade liquid recording medium, characterized by containing the carbon black polymer set forth in claim 1.

27. A liquid developing agent for use in the development of an electrostatic latent image, characterized by containing the carbon black polymer set forth in claim 1.

28. Fibers impervious to light, characterized by containing the carbon black polymer set forth in claim 1.

29. A method for the production of a resin composition containing carbon black, which method comprises melting and mixing a resin component destined to serve as a dispersion medium and carbon black in combination with a block- or graft-copolymer, said copolymer having a segment (A) containing a reactive group capable of reacting with a functional group on the surface of said carbon black and a segment (B) containing substantially none of said reactive group and exhibiting higher affinity for said resin component than said segment (A).

30. A method for the treatment of minute solid particles for surfacial modification, which method comprises incorporating minute solid particles and a reactive graft- or block-copolymer containing a reactive group capable of reacting with a functional group on the surface of said minute solid particles in a liquid dispersion medium, and subjecting the resultant mixture as kept in a heated state to a treatment for dispersion.

31. A method according to claim 30, wherein said treatment for dispersion is carried out in an apparatus for wet dispersion treatment comprising a vessel for holding therein a fluid under treatment, a stirrer adapted to be rotated in said vessel, a heating device accommodated in said vessel and adapted to heat said fluid under treatment, and a plurality of granular dispersing media accommodated in said vessel.

32. A method set forth in claim 30, wherein said treatment comprises adding 5–500 parts by weight of said reactive polymer to 100 parts by weight of said minute solid particles.

33. A method according to claim 30, wherein the heating during the course of mixing is carried out at a temperature in the range of 50–250° C.

34. A method according to claim 30, wherein said minute solid particles are minute particles of inorganic pigment.

35. A method according to claim 30, wherein said minute solid particles are carbon black.

36. A method according to claim 30, wherein the reactive group in said reactive polymer is at least one member selected from the class consisting of epoxy group, thioepoxy group, aziridine group, and oxazoline group.

37. A method according to claim 30, wherein the reactive polymer is a block- or graft-copolymer having a segment (A) containing said reactive group in the molecular unit thereof and a segment (B) exhibiting higher affinity for said liquid dispersion medium than said segment (A).

38. A pigment-complexed polymer, obtained by the process comprising using a pigment in the place of the carbon black in the carbon black graft polymer set forth in claim 1 and subjecting the pigment to the treatment set forth in claim 1.

* * * * *